US008883958B2

(12) United States Patent
Facchetti et al.

(10) Patent No.: US 8,883,958 B2
(45) Date of Patent: Nov. 11, 2014

(54) CONJUGATED POLYMERS AND THEIR USE IN OPTOELECTRONIC DEVICES

(71) Applicant: Polyera Corporation, Skokie, IL (US)

(72) Inventors: Antonio Facchetti, Chicago, IL (US); Hakan Usta, Evanston, IL (US); Hualong Pan, Skokie, IL (US); Martin Drees, Glenview, IL (US); Mitchell Denti, Chicago, IL (US)

(73) Assignee: Raynergy Tek Inc., Taipei (TW)

( * ) Notice: Subject to any disclaimer, the term of this patent is extended or adjusted under 35 U.S.C. 154(b) by 0 days.

(21) Appl. No.: 13/843,277

(22) Filed: Mar. 15, 2013

(65) Prior Publication Data

US 2013/0247990 A1 Sep. 26, 2013

Related U.S. Application Data

(60) Provisional application No. 61/614,302, filed on Mar. 22, 2012, provisional application No. 61/724,140, filed on Nov. 8, 2012.

(51) Int. Cl.
*C08G 75/00* (2006.01)
*H01L 51/00* (2006.01)
*H01L 51/42* (2006.01)

(52) U.S. Cl.
CPC ........ *H01L 51/0036* (2013.01); *H01L 51/0035* (2013.01); *H01L 51/0043* (2013.01); *H01L 51/4253* (2013.01); *Y02E 10/549* (2013.01)
USPC ............. 528/377; 528/380; 528/370; 528/54; 528/94; 528/117; 528/289; 528/423; 528/424; 257/40; 257/E51.005; 257/E51.018; 136/263; 526/256

(58) Field of Classification Search
USPC ............. 528/377, 370, 380, 54, 94, 117, 289, 528/423, 424
See application file for complete search history.

(56) References Cited

U.S. PATENT DOCUMENTS

| 7,524,922 B2 | 4/2009 | Heeney et al. ................ 528/380 |
| 7,820,782 B2 | 10/2010 | Ong et al. ..................... 528/373 |
| 2005/0258398 A1 | 11/2005 | Kobayashi et al. ...... 252/299.61 |
| 2010/0307594 A1 | 12/2010 | Zhu et al. ..................... 136/263 |
| 2013/0098448 A1 | 4/2013 | Zhu et al. ..................... 136/263 |
| 2013/0200354 A1 | 8/2013 | Zhu et al. ..................... 136/263 |
| 2013/0200355 A1 | 8/2013 | Zhu et al. ..................... 528/377 |

FOREIGN PATENT DOCUMENTS

| CN | 102050940 | 5/2011 | |
| CN | 102286142 | * 12/2011 | ............. H01L 51/54 |
| CN | 103159941 | 6/2013 | |
| WO | 2013/116643 | 8/2013 | |

OTHER PUBLICATIONS

Braunecker et al. (Chem. Mater. 2012, 24, 1346-1356).*

* cited by examiner

*Primary Examiner* — Shane Fang
(74) *Attorney, Agent, or Firm* — Karen K. Chan

(57) ABSTRACT

Disclosed are certain polymeric compounds and their use as organic semiconductors in organic and hybrid optical, optoelectronic, and/or electronic devices such as photovoltaic cells, light emitting diodes, light emitting transistors, and field effect transistors. The disclosed compounds can provide improved device performance, for example, as measured by power conversion efficiency, fill factor, open circuit voltage, field-effect mobility, on/off current ratios, and/or air stability when used in photovoltaic cells or transistors. The disclosed compounds can have good solubility in common solvents enabling device fabrication via solution processes.

20 Claims, 4 Drawing Sheets a)

b)

CONJUGATED POLYMERS AND THEIR USE IN OPTOELECTRONIC DEVICES

CROSS-REFERENCE TO RELATED APPLICATIONS

This application claims priority to and the benefit of U.S. Provisional Patent Application Ser. No. 61/614,302, filed on Mar. 22, 2012, and U.S. Provisional Patent Application Ser. No. 61/724,140, filed on Nov. 8, 2012, the disclosure of each of which is incorporated by reference herein in its entirety.

BACKGROUND

A new generation of optoelectronic devices such as organic photovoltaics (OPVs) and organic light-emitting transistors (OLETs) are fabricated using organic semiconductors as their active components. To be commercially relevant, these organic semiconductor-based devices should be processable in a cost-effective manner.

Bulk heterojunction (BHJ) solar cells commonly are considered the most promising OPV structures because they can be fabricated using roll-to-roll and large-scale production. BHJ solar cells include a photoactive layer disposed between an anode and a cathode, where the photoactive layer is composed of a blend film including a "donor" material and an "acceptor" material. State-of-the-art BHJ solar cells use fullerene-based compounds as the acceptor material. Typical fullerenes include C60 or C70 "bucky ball" compounds functionalized with solubilizing szzide chains such as [6,6]-phenyl-$C_{61}$-butyric acid methyl ester (C60-PCBM) or [6,6]-phenyl-$C_{71}$-butyric acid methyl ester (C70-PCBM). The most common donor material used in BHJ solar cells is poly(3-hexylthiophene) (P3HT). However, it is well known that P3HT has poor air stability.

Accordingly, the art desires new materials for OPV devices.

SUMMARY

In light of the foregoing, the present teachings provide certain polymeric compounds that can be used as organic semiconductor materials. Also provided are associated devices and related methods for the preparation and use of these compounds. The present compounds can exhibit properties such as optimized optical absorption, good charge transport characteristics and chemical stability in ambient conditions, low-temperature processability, large solubility in common solvents, and processing versatility (e.g., via various solution processes). As a result, optoelectronic devices such as solar cells that incorporate one or more of the present compounds as a photoactive layer can exhibit high performance in ambient conditions, for example, demonstrating one or more of low band-gap, high fill factor, high open circuit voltage, and high power conversion efficiency, and preferably all of these criteria. Similarly, other organic semiconductor-based devices such as OLETs can be fabricated efficiently using the organic semiconductor materials described herein.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
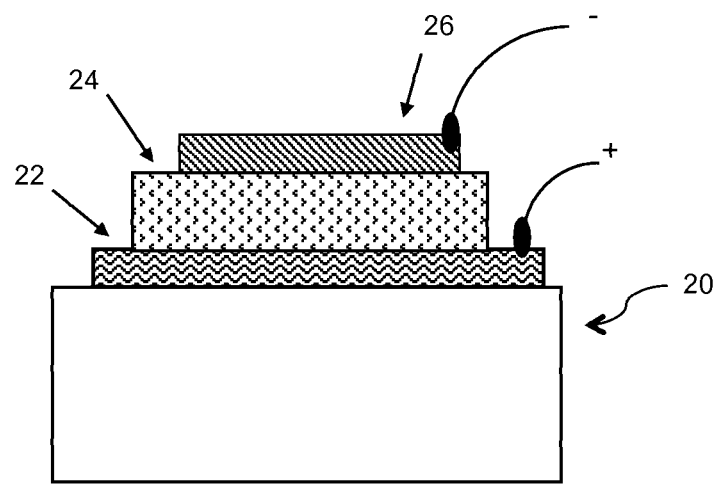
FIG. 1 illustrates a representative bulk-heterojunction (BHJ) organic photovoltaic device (also known as a solar cell) structure, which can incorporate one or more compounds of the present teachings as its photoactive layer (as donor and/or acceptor materials).

The present teachings provide polymeric compounds based upon at least one repeating unit having a formula selected from:

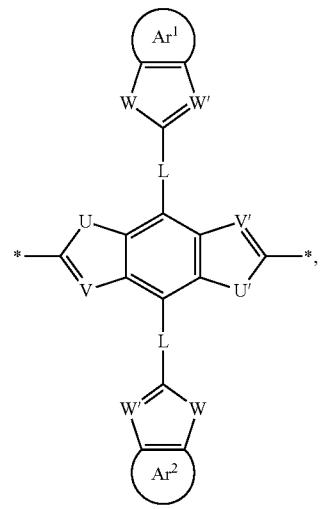

-continued

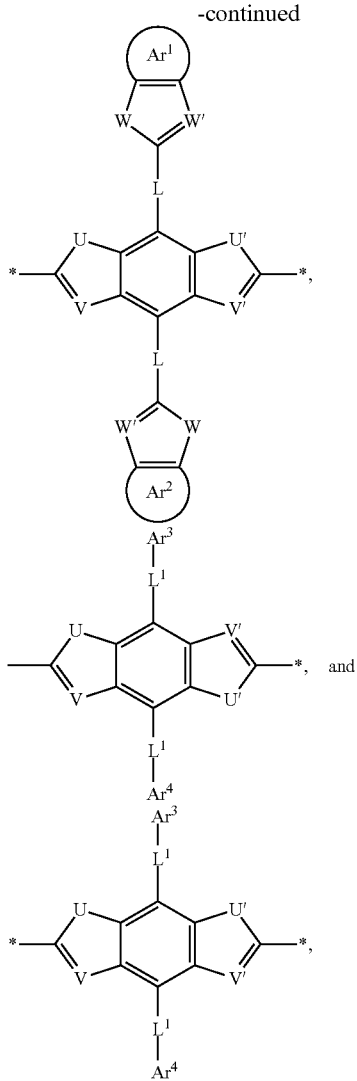

wherein Ar¹, Ar², Ar³, Ar⁴, L, L¹, U, U', V, V', W and W' are as defined herein.

Compounds of the present teachings can exhibit semiconductor behavior such as optimized light absorption/charge separation in a photovoltaic device; charge transport/recombination/light emission in a light-emitting device; and/or high carrier mobility and/or good current modulation characteristics in a field-effect device. In addition, the present compounds can possess certain processing advantages such as solution-processability and/or good stability (e.g., air stability) in ambient conditions. The compounds of the present teachings can be used to prepare either p-type (donor or hole-transporting), n-type (acceptor or electron-transporting), or ambipolar semiconductor materials, which in turn can be used to fabricate various organic or hybrid optoelectronic articles, structures and devices, including organic photovoltaic devices and organic light-emitting transistors.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about $10^{-5}$ cm²/Vs. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about $10^{-5}$ cm²/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, fill factor (FF) is the ratio (given as a percentage) of the actual maximum obtainable power, ($P_m$ or $V_{mp}*J_{mp}$), to the theoretical (not actually obtainable) power, ($J_{sc}*V_{oc}$). Accordingly, FF can be determined using the equation:

$$F=(V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point ($P_m$) by the input light irradiance (E, in W/m$^2$) under standard test conditions (STC) and the surface area of the solar cell ($A_c$ in m$^2$). STC typically refers to a temperature of 25° C. and an irradiance of 1000 W/m$^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "semicrystalline polymer" refers to a polymer that has an inherent tendency to crystallize at least partially either when cooled from a melted state or deposited from solution, when subjected to kinetically favorable conditions such as slow cooling, or low solvent evaporation rate and so forth. The crystallization or lack thereof can be readily identified by using several analytical methods, for example, differential scanning calorimetry (DSC) and/or X-ray diffraction (XRD).

As used herein, "annealing" refers to a post-deposition heat treatment to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing can result in an increase of crystallinity in the polymer film, where possible, thereby increasing field effect mobility. The increase in crystallinity can be monitored by several methods, for example, by comparing the differential scanning calorimetry (DSC) or X-ray diffraction (XRD) measurements of the as-deposited and the annealed films.

As used herein, a "polymeric compound" (or "polymer") refers to a molecule including a plurality of one or more repeating units connected by covalent chemical bonds. A polymeric compound can be represented by the general formula:

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units

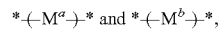

where $M^a$ and $M^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

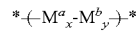

can be used to represent a copolymer of $M^a$ and $M^b$ having x mole fraction of $M^a$ and y mole fraction of $M^b$ in the copolymer, where the manner in which comonomers $M^a$ and $M^b$ is repeated can be alternating, random, regiorandom, regioregular, or in blocks. In addition to its composition, a polymeric compound can be further characterized by its degree of polymerization (n) and molar mass (e.g., number average molecular weight ($M_n$) and/or weight average molecular weight ($M_w$) depending on the measuring technique(s)).

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula —$C_sH_{2s+1-t}X^0_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and iso-propylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly t-conjugated and optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl(bicyclic), 2-naphthyl(bicyclic), anthracenyl(tricyclic), phenanthrenyl(tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —C$_6$F$_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a —Y—C$_{6-14}$ aryl group, where Y is as defined herein. An example of an arylalkyl group is a benzyl group (—CH$_2$—C$_6$H$_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

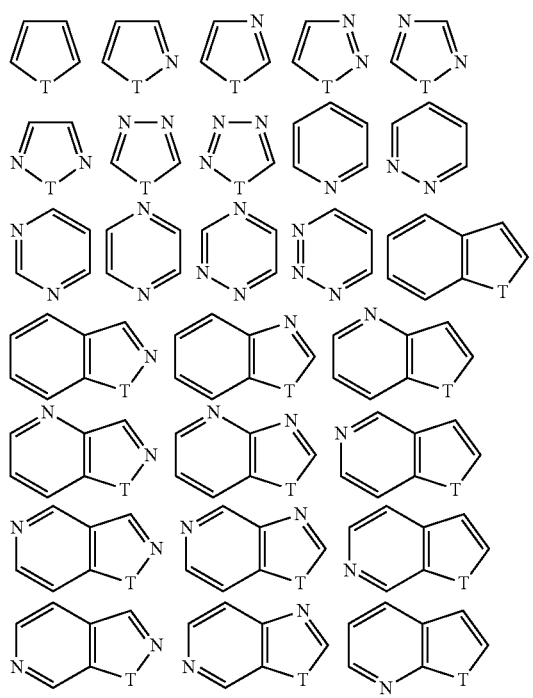

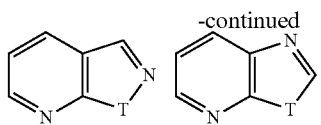

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent C$_{1-20}$ alkyl group (e.g., a methylene group), a divalent C$_{2-20}$ alkenyl group (e.g., a vinylyl group), a divalent C$_{2-20}$ alkynyl group (e.g., an ethynylyl group). a divalent C$_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —NO$_2$, —CN, —NC, —S(R$^o$)$_2^+$, —N(R$^o$)$_3^+$, —SO$_3$H, —SO$_2$R$^o$, —SO$_3$R$^o$, —SO$_2$NHR$^o$, —SO$_2$N(R$^o$)$_2$, —COOH, —COR$^o$, —COOR⁰, —CONHR⁰, —CON(R⁰)₂, $C_{1-40}$ haloalkyl groups, $C_{6-14}$ aryl groups, and 5-14 membered electron-poor heteroaryl groups; where R⁰ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —NO₂, —CN, —NC, —S(R⁰)₂⁺, —N(R)₃⁺, —SO₃H, —SO₂R⁰, —SO₃R⁰, —SO₂NHR⁰, —SO₂N(R⁰)₂, —COOH, —COR⁰, —COOR⁰, —CONHR⁰, and —CON(R⁰)₂.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —OR⁰, —NH₂, —NHR⁰, —N(R⁰)₂, and 5-14 membered electron-rich heteroaryl groups, where R⁰ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and geometric isomers (diastereomers). The present teachings include such optical and geometric isomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide (N₃), thiocyanate (SCN), nitro (NO₂), cyanate (CN), water (H₂O), ammonia (NH₃), and sulfonate groups (e.g., OSO₂—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

Throughout the specification, structures may or may not be presented with chemical names. Where any question arises as to nomenclature, the structure prevails.

The present teachings relate to polymeric compounds that can be used as organic semiconductor materials. The present compounds can have good solubility in various common solvents and good stability in air. When incorporated into optical or optoelectronic devices including, but not limited to, photovoltaic or solar cells, light emitting diodes, and light emitting transistors, the present compounds can confer various desirable performance properties. For example, when the present compounds are used in a photoactive layer of a solar cell (e.g., bulk heterojunction devices), the solar cell can exhibit very high power conversion efficiency (e.g., about 3.0% or greater).

The present teachings provide polymeric compounds (or polymers) having a repeating unit ($M^{1a}$) of the formula selected from:

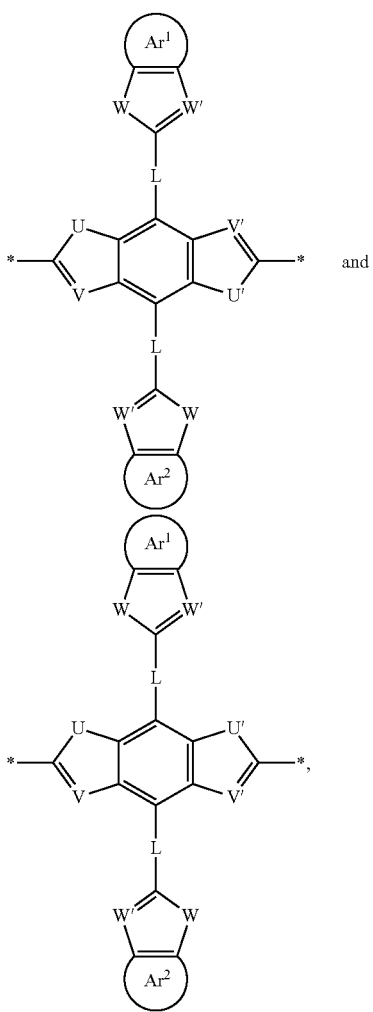

and/or a repeating unit (M$^{1b}$) having a formula selected from:

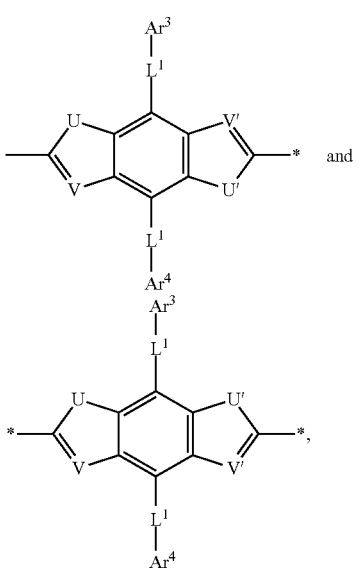

wherein:

Ar$^1$ and Ar$^2$ independently are an optionally substituted C$_{6-14}$ aryl group or an optionally substituted 5-14 membered heteroaryl group;

Ar$^3$ and Ar$^4$ independently are an optionally substituted phenyl group or an optionally substituted 5- or 6-membered heteroaryl group;

L, at each occurrence, independently is selected from —O—, —S—, —Se—, —OC(O)—, —C(O)O—, a divalent C$_{1-20}$ alkyl group, a divalent C$_{1-20}$ haloalkyl group, and a covalent bond;

L$^1$, at each occurrence, independently is selected from —O—, —S—, —Se—, —OC(O)—, —C(O)O—, a divalent C$_{1-20}$ alkyl group, and a divalent C$_{1-20}$ haloalkyl group;

U and U' independently are selected from —O—, —S—, and —Se—;

V and V' independently are —CR= or —N=;

W, at each occurrence, independently is selected from —O—, —S—, and —Se—;

W', at each occurrence, independently is —CR= or —N=; and

R, at each occurrence, independently is selected from H, a halogen, —CN, and L'R', wherein L', at each occurrence, is selected from —O—, —S—, —Se—, —C(O)—, —OC(O)—, —C(O)O—, and a covalent bond; and R', at each occurrence, independently is selected from a C$_{1-40}$ alkyl group, a C$_{2-40}$ alkenyl group, a C$_{2-40}$ alkynyl group, and a C$_{1-40}$ haloalkyl group. The present polymers can have a degree of polymerization in the range of 3 to 10,000.

In certain embodiments, each of U, U' and W can be —S—. Accordingly, certain embodiments of the present polymers can have a repeating unit (M$^{1a}$) of the formula:

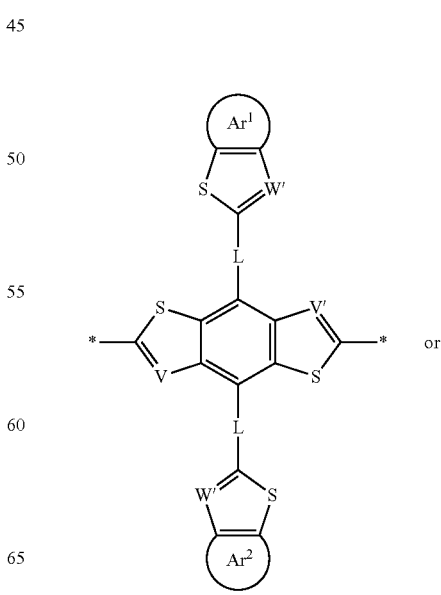

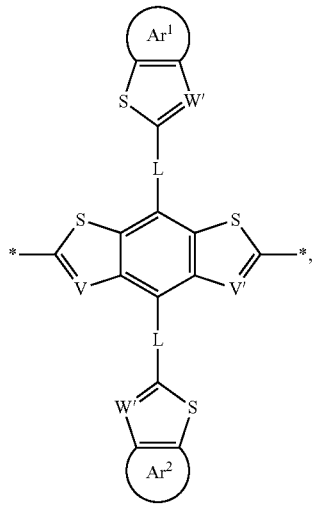
and/or a repeating unit ($M^{1b}$) of the formula:
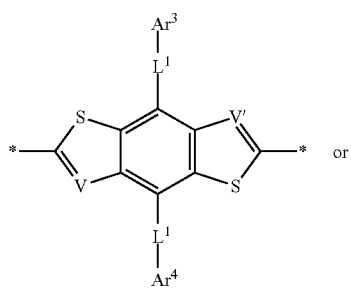 or
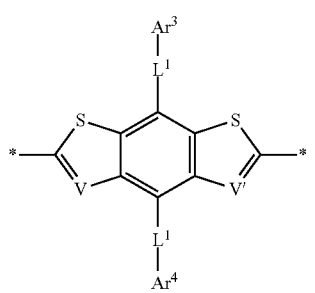
wherein $Ar^1$, $Ar^2$, $Ar^3$, $Ar^4$, L, $L^1$, V, V' and W' are as defined herein. In particular embodiments, V, V' and W' independently can be selected from —CH=, —CCl= and —N=. For example, each of V, V' and W' can be —CH= or —CCl=, thus providing a repeating unit ($M^{1a}$) having a formula selected from:
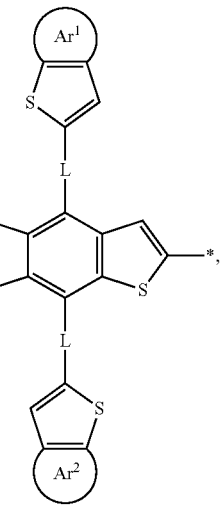
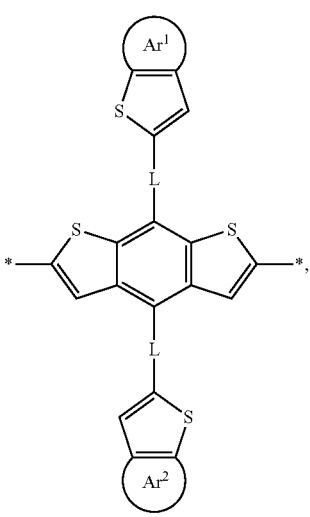
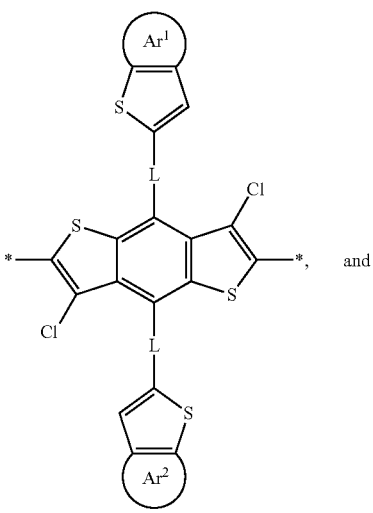
and -continued

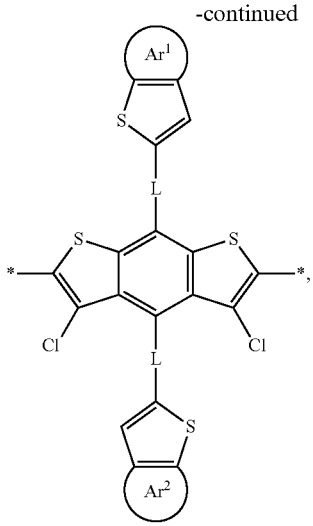

and a repeating unit ($M^{1b}$) having a formula selected from:

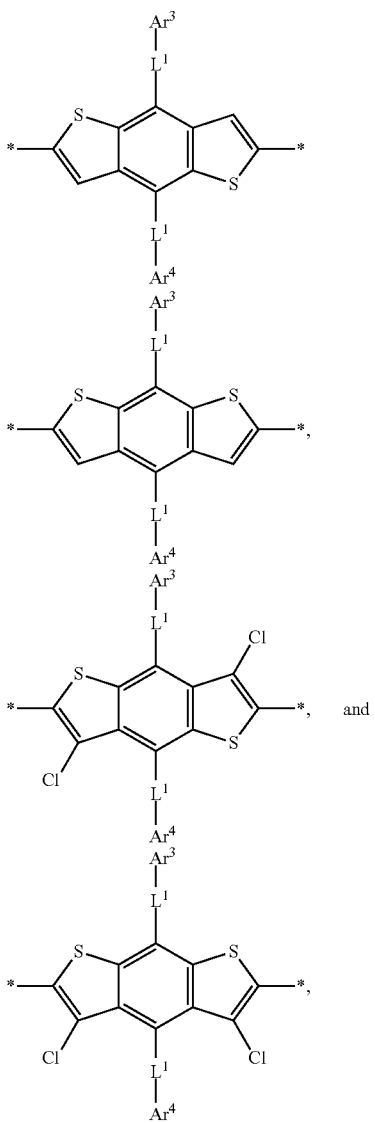

wherein $Ar^1$, $Ar^2$, $Ar^3$, $Ar^4$, L and $L^1$ are as defined herein. To illustrate, L can be selected from —O—, —S—, —OC(O)—, a divalent $C_{1-20}$ alkyl group, and a covalent bond; and $L^1$ can be selected from —O—, —S—, —OC(O)—, and a divalent $C_{1-20}$ alkyl group.

In various embodiments of the repeating unit ($M^{1a}$), the moieties

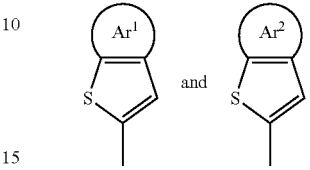

can be selected from:

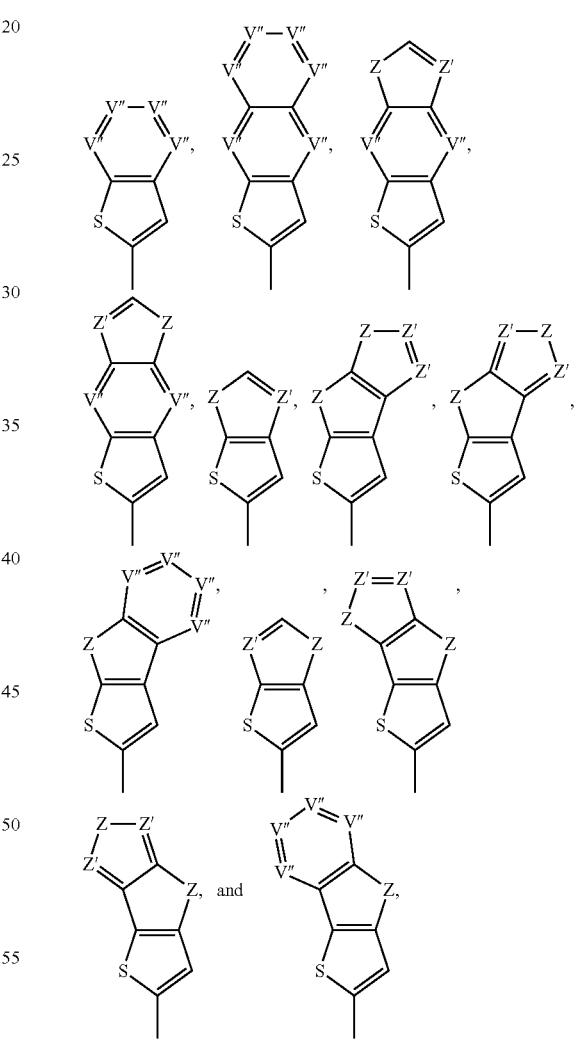

wherein:
V", at each occurrence, independently is —CR= or —N=;
Z, at each occurrence, independently is selected from —O—, —S—, and —Se—;
Z', at each occurrence, independently is —CR= or —N=; and
R, at each occurrence, independently is selected from H, a halogen, —CN, and L'R', wherein L', at each occurrence, is selected from —O—, —S—, —Se—, —C(O)—, —OC(O)—, —C(O)O—, a divalent $C_{1-20}$ alkyl group, a divalent $C_{1-20}$ haloalkyl group, and a covalent bond; and R', at each occurrence, independently is selected from H, a $C_{1-40}$ alkyl group, a $C_{2-40}$ alkenyl group, a $C_{2-40}$ alkynyl group, a $C_{1-40}$ haloalkyl group, an optionally substituted $C_{6-14}$ aryl group and an optionally substituted 5-14 membered heteroaryl group.

To illustrate, the moieties

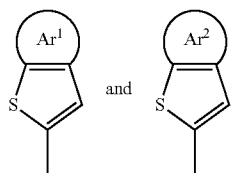

independently can be selected from:

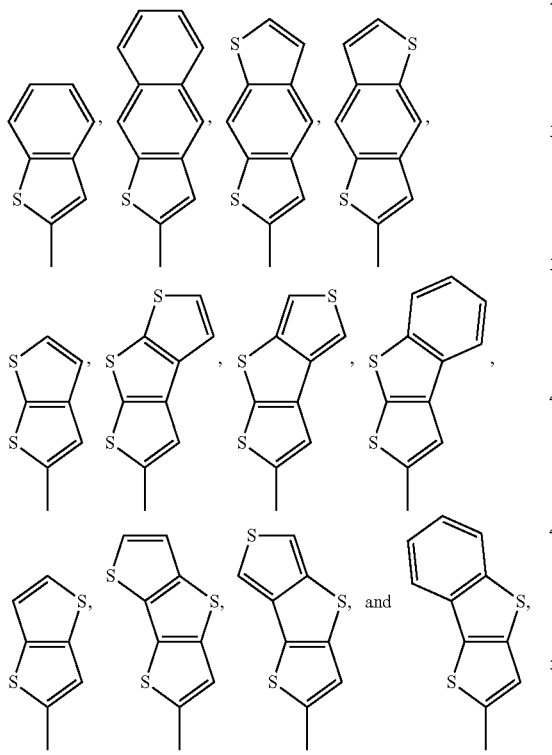

wherein any of the carbon atoms optionally can be substituted with F, Cl, —CN, or L'R', wherein L', at each occurrence, is selected from —O—, —S—, —Se—, —C(O)—, —OC(O)—, —C(O)O—, a divalent $C_{1-20}$ alkyl group, a divalent $C_{1-20}$ haloalkyl group, and a covalent bond; and R', at each occurrence, independently is selected from H, a $C_{1-40}$ alkyl group, a $C_{2-40}$ alkenyl group, a $C_{2-40}$ alkynyl group, a $C_{1-40}$ haloalkyl group, an optionally substituted $C_{6-14}$ aryl group and an optionally substituted 5-14 membered heteroaryl group.

In various embodiments of the repeating unit ($M^{1b}$), $L^1$ can be selected from —O—, —S—, —OC(O)—, and a divalent $C_{1-20}$ alkyl group; while $Ar^3$ and $Ar^4$ can be selected from a phenyl group, a thienyl group, a thiazolyl group, an isothiazolyl group, a thiadiazolyl group, a furyl group, an oxazolyl group, an isoxazolyl group, an oxadiazolyl group, a pyrrolyl group, a triazolyl group, a tetrazolyl group, a pyrazolyl group, an imidazolyl group, a pyridyl group, a pyrimidyl group, a pyridazinyl group, and a pyrazinyl group, each of which optionally can be substituted with 1-4 groups independently selected from a halogen, —CN, and L"R", wherein L", at each occurrence, is selected from —O—, —S—, —Se—, —C(O)—, —OC(O)—, —C(O)O—, and a covalent bond; and R", at each occurrence, independently can be selected from a $C_{1-40}$ alkyl group, a $C_{2-40}$ alkenyl group, a $C_{2-40}$ alkynyl group, and a $C_{1-40}$ haloalkyl group.

In certain embodiments of the repeating unit ($M^{1b}$), $L^1$ can be selected from the group consisting of —O—, —S—, —CH$_2$—, and —OC(O)—. For example, the repeating unit ($M^{1b}$) can have a formula selected from:

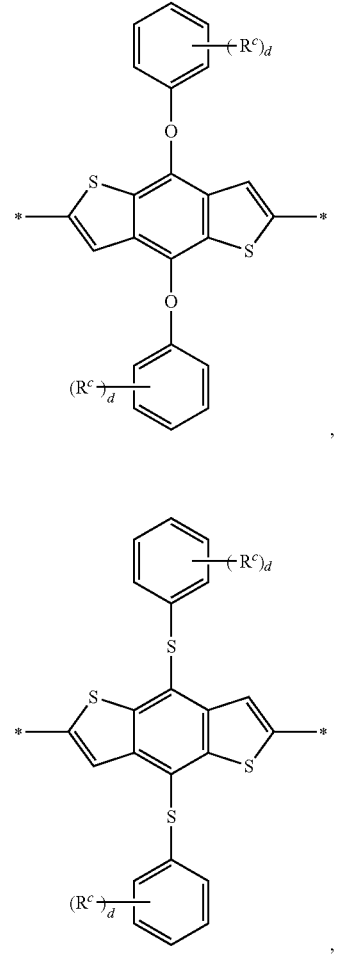

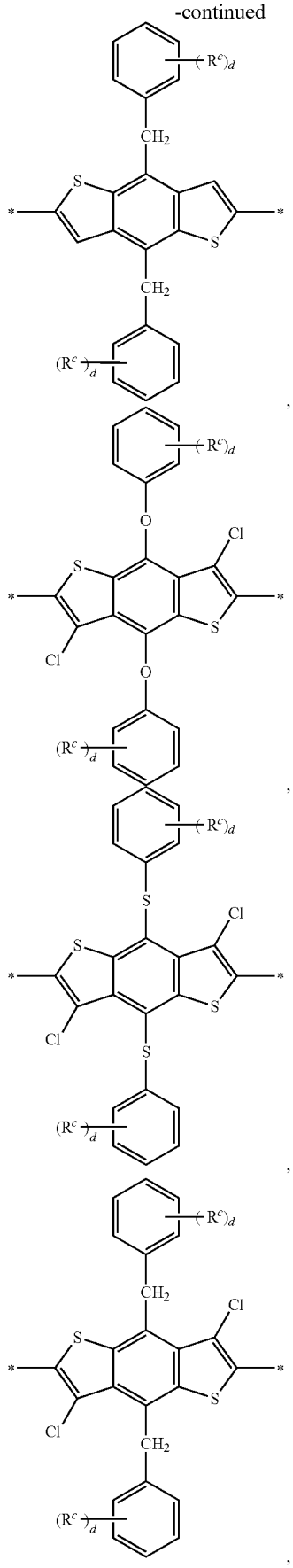
,
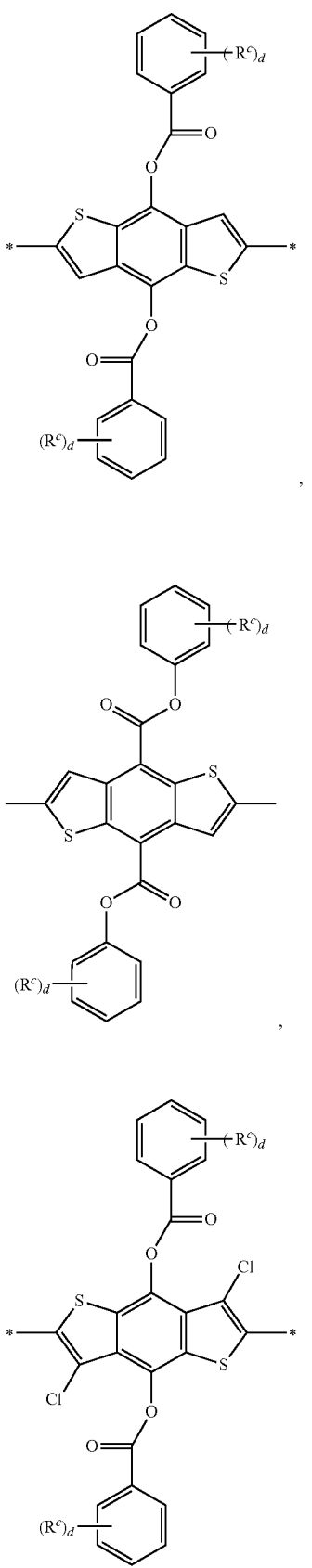
, and

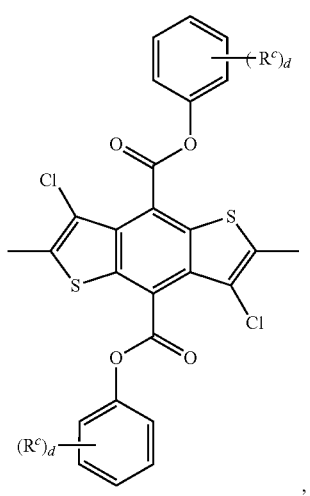

wherein $R^c$, at each occurrence, independently can be selected from F, Cl, —CN, and L"R", wherein L", at each occurrence, can be selected from —O—, —S—, —Se—, —C(O)—, —OC(O)—, —C(O)O—, and a covalent bond; and R", at each occurrence, independently can be selected from a $C_{1-40}$ alkyl group, a $C_{2-40}$ alkenyl group, a $C_{2-40}$ alkynyl group, and a $C_{1-40}$haloalkyl group; and d, at each occurrence, independently can be 1, 2, 3, 4 or 5.

Certain embodiments of the repeating unit ($M^{1b}$) can have a formula selected from:

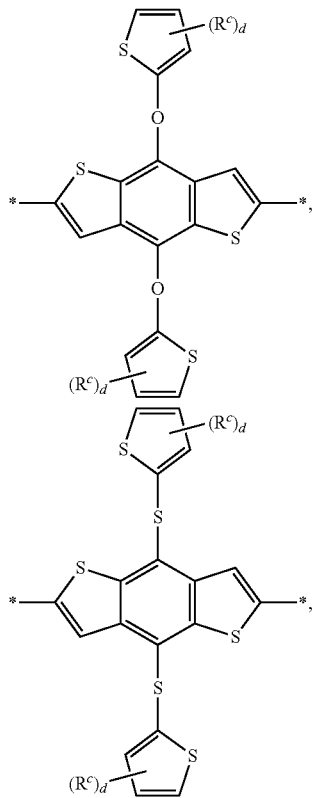

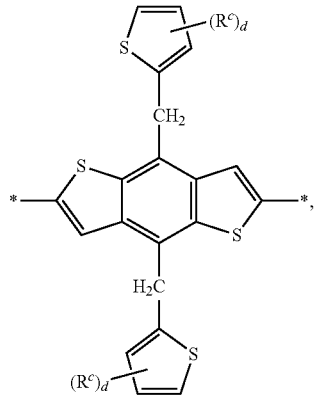

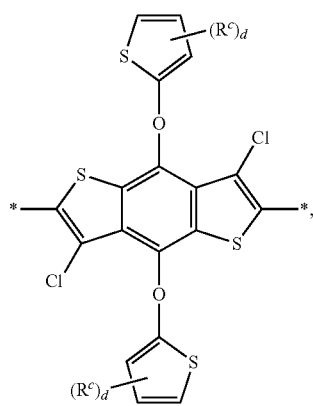

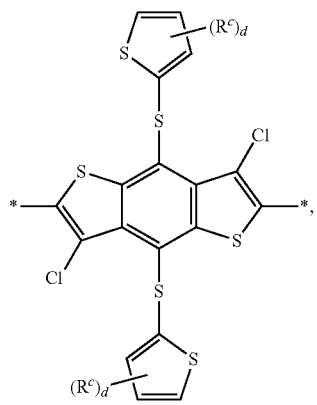

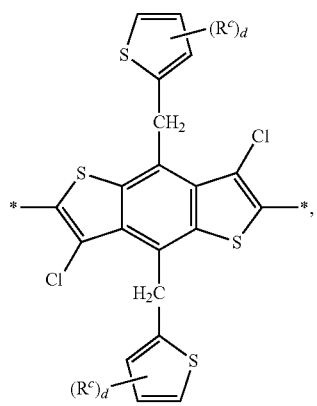

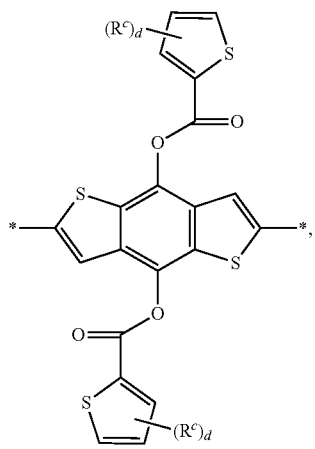

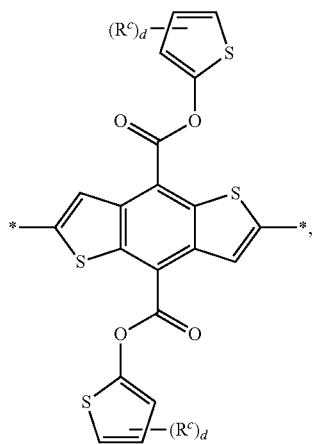

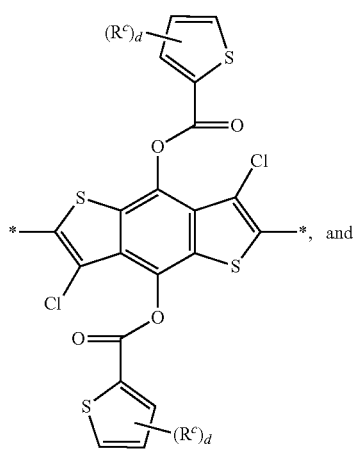

and

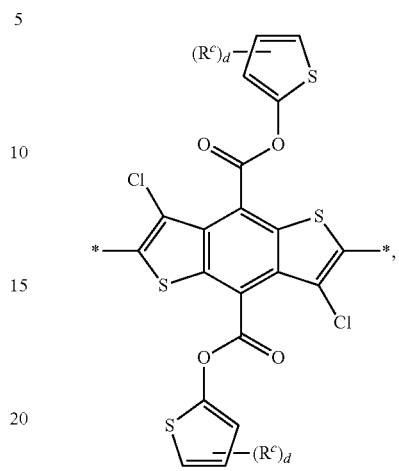

wherein $R^c$, at each occurrence, independently is selected from F, Cl, —CN, and L"R", wherein L", at each occurrence, is selected from —O—, —S—, —Se—, —C(O)—, —OC(O)—, —C(O)O—, and a covalent bond; and R", at each occurrence, independently is selected from a $C_{1-40}$ alkyl group, a $C_{2-40}$ alkenyl group, a $C_{2-40}$ alkynyl group, and a $C_{1-40}$ haloalkyl group; and d, at each occurrence, independently is 1, 2 or 3.

For example, particular embodiments of the repeating unit ($M^{1b}$) can have a formula selected from:

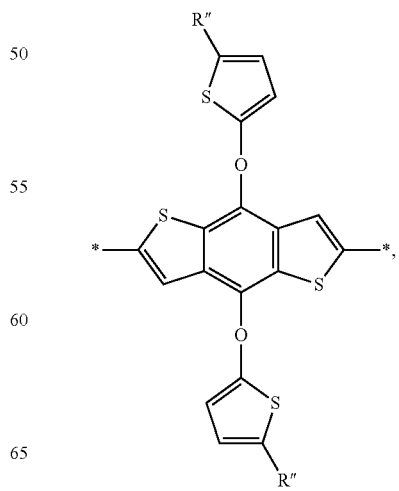

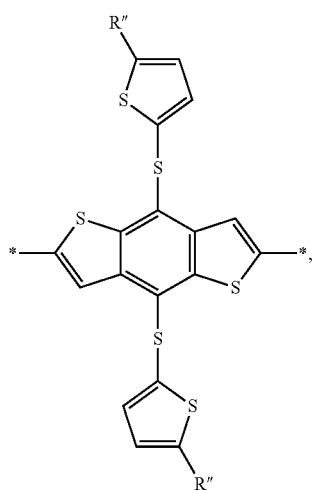
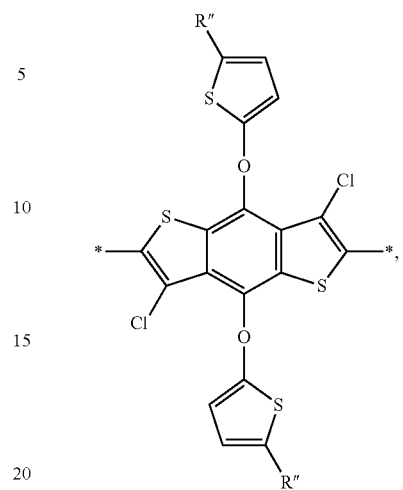
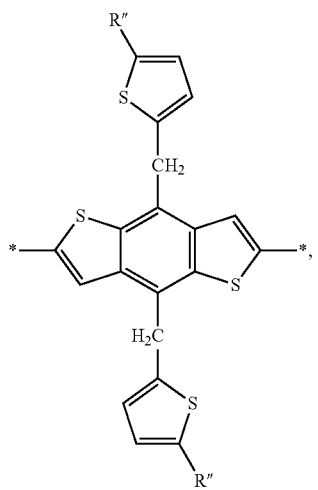
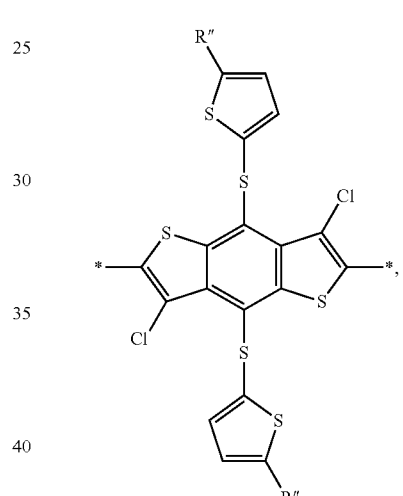
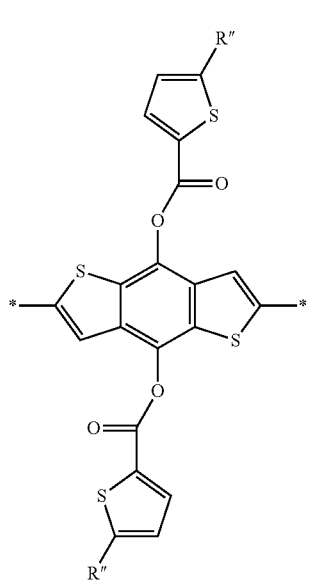
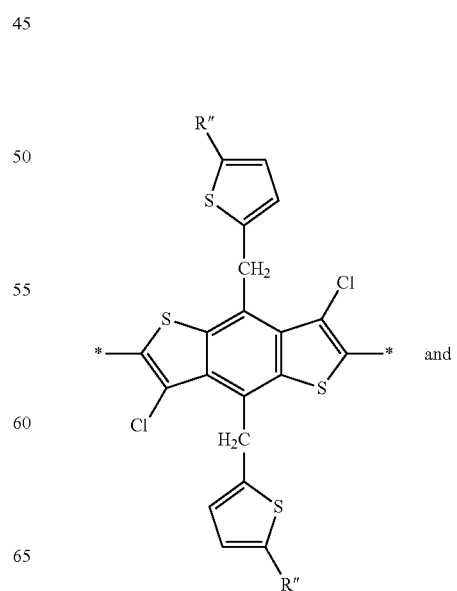
and

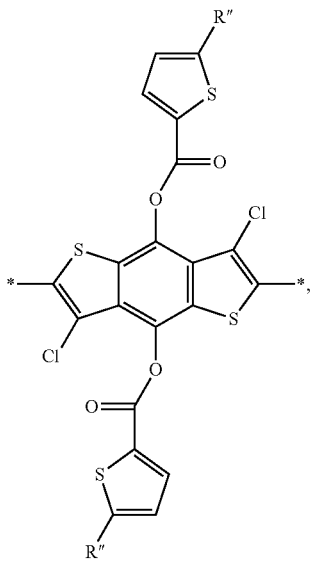

wherein R" is a $C_{1-40}$ alkyl group or a $C_{1-40}$ haloalkyl group.

In addition to the repeating unit ($M^{1a}$) and/or the repeating unit ($M^{1b}$), certain embodiments of the present polymers can have a second repeating unit ($M^2$) that is different from the repeating units ($M^{1a}$) and ($M^{1b}$). Specifically, certain embodiments of the present polymers can contain alternating donor-acceptor units, where the repeating unit(s) ($M^{1a}$) and/or ($M^{1b}$) can function as an electron donor unit, while the second repeating unit ($M^2$) can function as an electron acceptor unit. For example, the second repeating unit ($M^2$) can include an electron-poor polycyclic heteroaryl group. To provide a stronger acceptor moiety, the electron-poor polycyclic heteroaryl group optionally can be substituted with one or more electron-withdrawing groups. Examples of electron-withdrawing groups include F, Cl, CN, an acyl group, and a haloalkyl group.

To illustrate, the repeating unit ($M^2$) can have the formula:

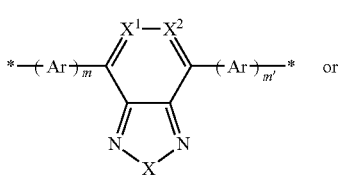

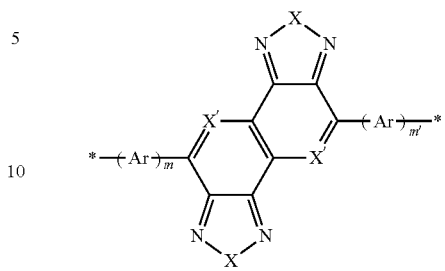

wherein:

Ar, at each occurrence, independently can be an optionally substituted 5-8 membered heteroaryl group;

X, at each occurrence, independently can be selected from —O—, —S—, and —Se—;

X', at each occurrence, independently can be —CR= or —N=;

$X^1$ can be —$CR^a$= or —N=;

$X^2$ can be —$CR^b$= or —N=;

R, at each occurrence, independently can be selected from H, a halogen, —CN, and L'R', wherein L', at each occurrence, is selected from —O—, —S—, —Se—, —C(O)—, —OC(O)—, —C(O)O—, and a covalent bond; and R', at each occurrence, independently can be selected from a $C_{1-40}$ alkyl group, a $C_{2-40}$ alkenyl group, a $C_{2-40}$ alkynyl group, and a $C_{1-40}$ haloalkyl group;

$R^a$ and $R^b$ independently can be selected from H, a halogen, —CN, and L'R', or alternatively, $R^a$ and $R^b$ together with their respective adjacent carbon atom form an optionally substituted $C_{6-14}$ aryl or 5-14 membered heteroaryl group; and m and m' are 0, 1, or 2.

In certain embodiments, the repeating unit ($M^2$) can include a benzo[c][1,2,5]thiadiazole (2,13-benzothiadiazole) or a thiadiazolo[3,4-c]pyridine, i.e.,

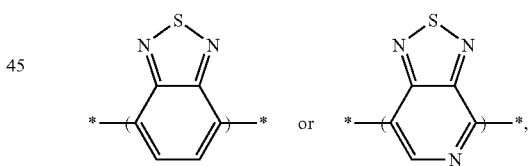

each of which optionally can be substituted as described herein.

Accordingly, in some embodiments, the present polymeric compounds can be represented by the formula:

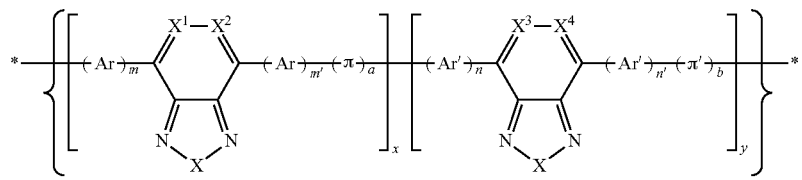

wherein:

π and π' are identical or different and independently have a formula selected from:

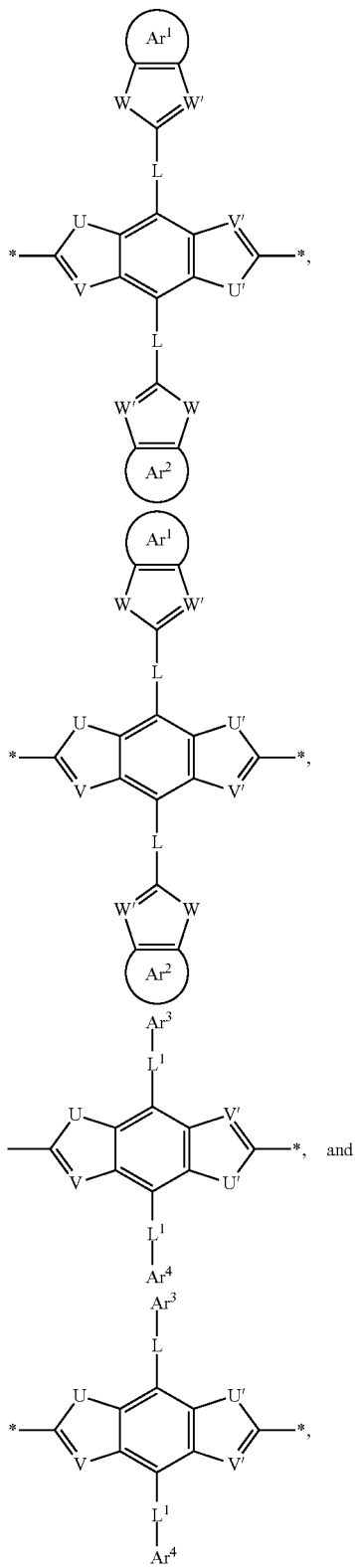

wherein:

Ar¹ and Ar² independently are an optionally substituted $C_{6-14}$ aryl group or an optionally substituted 5-14 membered heteroaryl group;

Ar³ and Ar⁴ independently are an optionally substituted phenyl group or an optionally substituted 5- or 6-membered heteroaryl group;

L, at each occurrence, independently is selected from —O—, —S—, —Se—, —OC(O)—, —C(O)O—, a divalent $C_{1-20}$ alkyl group, a divalent $C_{1-20}$ haloalkyl group, and a covalent bond;

L¹, at each occurrence, independently is selected from —O—, —S—, —Se—, —OC(O)—, —C(O)O—, a divalent $C_{1-20}$ alkyl group, and a divalent $C_{1-20}$ haloalkyl group;

U and U' independently are selected from —O—, —S—, and —Se—;

V and V' independently are —CR= or —N=;

W, at each occurrence, independently is selected from —O—, —S—, and —Se—;

W', at each occurrence, independently is —CR= or —N=;

R, at each occurrence, independently is selected from H, a halogen, —CN, and L'R',
wherein L', at each occurrence, is selected from —O—, —S—, —Se—, —C(O)—, —OC(O)—, —C(O)O—, and a covalent bond; and R', at each occurrence, independently is selected from a $C_{1-40}$ alkyl group, a $C_{2-40}$ alkenyl group, a $C_{2-40}$ alkynyl group, and a $C_{1-40}$ haloalkyl group;

Ar and Ar' are identical or different optionally substituted 5-8 membered heteroaryl groups;

$X^1$ is N or $CR^1$;

$X^2$ is N or $CR^2$;

$X^3$ is N or $CR^3$;

$X^4$ is N or $CR^4$;

$R^1$, $R^2$, $R^3$ and $R^4$ independently are selected from H, F, Cl, —C(O)R⁵, CN, R⁵, OR⁵, and SR⁵, wherein R⁵, at each occurrence, independently is selected from a $C_{1-20}$ alkyl group, and a $C_{1-20}$ haloalkyl group;

X is O, S, or NR⁶, wherein R⁶ is selected from H and a $C_{1-20}$ alkyl group;

a and b are 0 or 1, provided that at least one of a and b is 1;

m, m', n and n' are 0, 1, or 2; and x and y are real numbers representing mole fractions, wherein $0.05 \leq x \leq 0.95$, $0.05 \leq y \leq 0.95$, and the sum of x and y is about 1.

The present polymeric compounds generally can have a molecular weight in the range of about 3,000 to about 300,000. In some embodiments, the present compounds can be represented the formula:

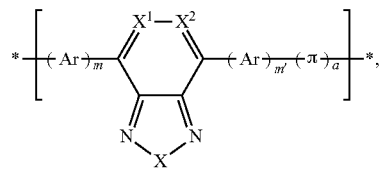

that is, when Ar is identical to Ar', it is identical to π'; $X^1$ is identical to $X^3$; $X^2$ is identical to $X^4$; m is identical to n; m' is identical to n'; and a is identical to b. In other embodiments, the first unit and the second unit

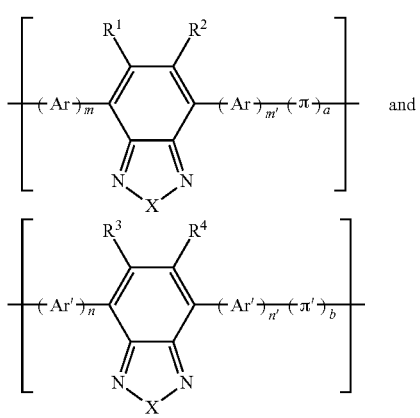
and are different from each other in one or more ways. For example, the type of cyclic moieties, the number of cyclic moieties, and/or the substitution of at least one of the cyclic moieties can be different. Embodiments of the present compounds including different first unit and second unit can have the two units repeated in a random or alternating manner. In most embodiments of the present polymers, the first unit and the second unit independently can include at least one of Ar/Ar' and π/π', i.e., at least one of m, m', and a is 1, and at least one of n, n', and b is 1, provided that at least one of the first unit and the second unit includes π or π'.

Various embodiments of the present compounds can be a copolymer of $M^{1a}/M^{1b}$ and $M^2$, where (i) $M^{1a}/M^{1b}$ (i.e., π and π'), (ii) if present, the Ar/Ar' group in $M^2$, and/or (iii) the electron-poor polycyclic heteroaryl group in $M^2$ is chlorinated. For example, the present compounds can be represented by formula (I):

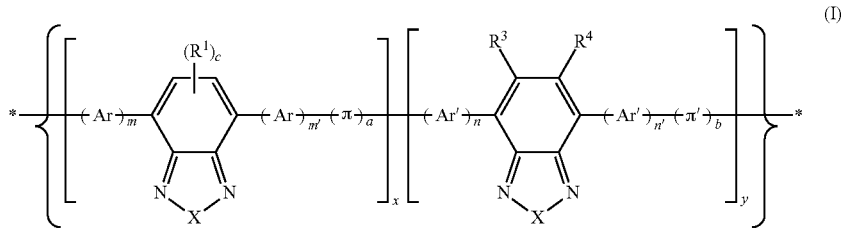

(I)

wherein:
Ar and Ar' are identical or different optionally substituted 5-8 membered heteroaryl groups;
$R^1$ is selected from F, Cl, —C(O)$R^5$, —CF$_2R^5$, and CN;
$R^3$ and $R^4$ independently are selected from H, F, Cl, —C(O)$R^5$, CN, $R^5$, O$R^5$, and S$R^5$,
wherein $R^5$, at each occurrence, independently is selected from a $C_{1-20}$ alkyl group and a $C_{1-20}$ haloalkyl group;
X is O, S, or N$R^6$, wherein $R^6$ is selected from H and a $C_{1-20}$ alkyl group;
a and b independently are 0 or 1, provided that at least one of a and b is 1;
c is 0, 1 or 2;
m and m' are 0, 1, or 2;
n and n' are 0, 1, or 2;
x and y are real numbers representing mole fractions, wherein $0.05 \leq x \leq 0.95$, $0.05 \leq y \leq 0.95$, and the sum of x and y is about 1; and π and π' are as defined herein. In certain embodiments of the compounds represented by formula (I), c can be 1 or 2, and $R^1$ can be Cl. In certain embodiments, at least one of Ar and Ar' can be present (i.e., m and m' and/or n and n' are 1 or 2), where Ar and Ar' are 5-8 membered heteroaryl groups substituted with one or more chloro groups. In certain embodiments, π and π' can be selected from:

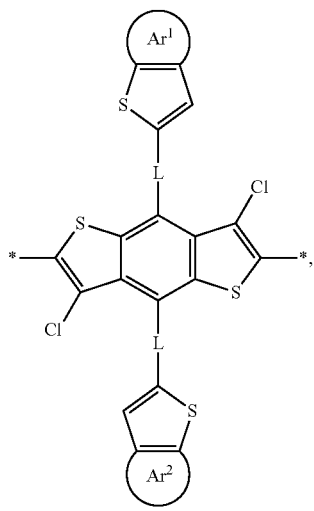

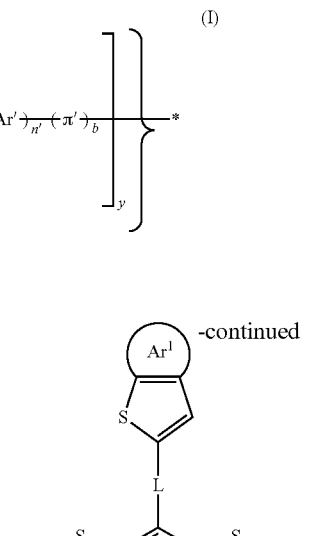

-continued

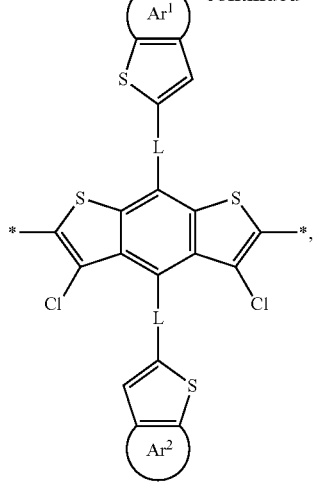

-continued

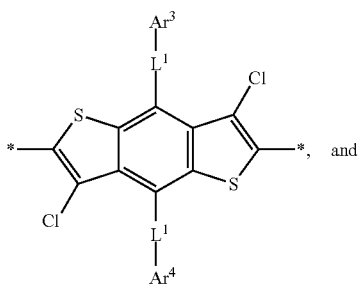, and

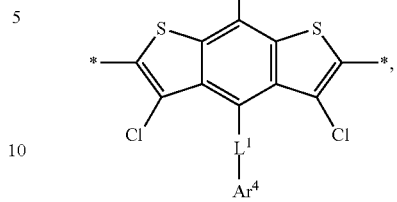

where $Ar^1$, $Ar^2$, $Ar^3$, $Ar^4$, L, and $L^1$ are as defined herein.

In certain embodiments of the compounds represented by formula (I), X can be S or O. Accordingly, these embodiments can be represented by formula (II) or (III):

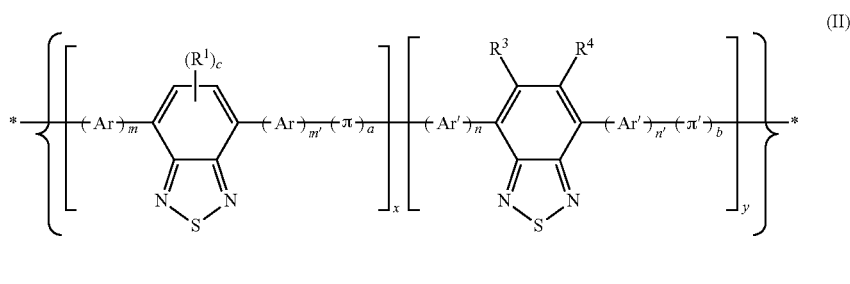

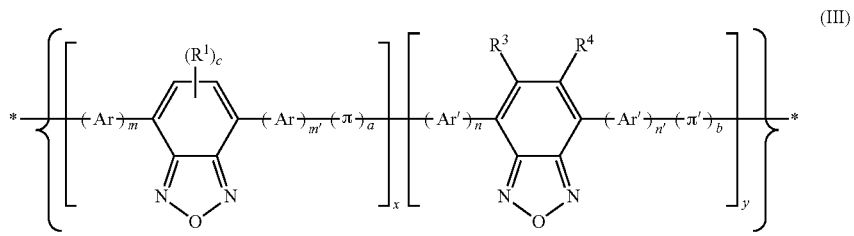

where Ar, Ar', π, π', $R^1$, $R^3$, $R^4$, m, m', n, n', a, b, c, x and y are as defined herein.

In certain embodiments, $R^1$, $R^2$, $R^3$, and $R^4$ can be identical, and each of $R^1$, $R^2$, $R^3$, and $R^4$ can be an electron-withdrawing group selected from F, Cl, CN, a —C(O)—$C_{1-10}$ alkyl group, a —$CF_2$—$C_{1-10}$ alkyl group, and a —$CF_2$—$C_{1-10}$ haloalkyl group. For example, certain embodiments of the present compounds can be represented by formula (IVa), (IVb), or (IVc):

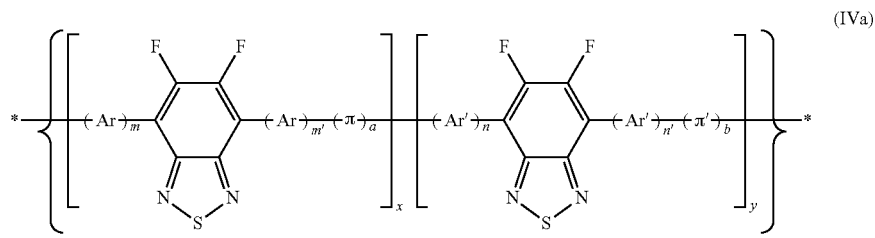

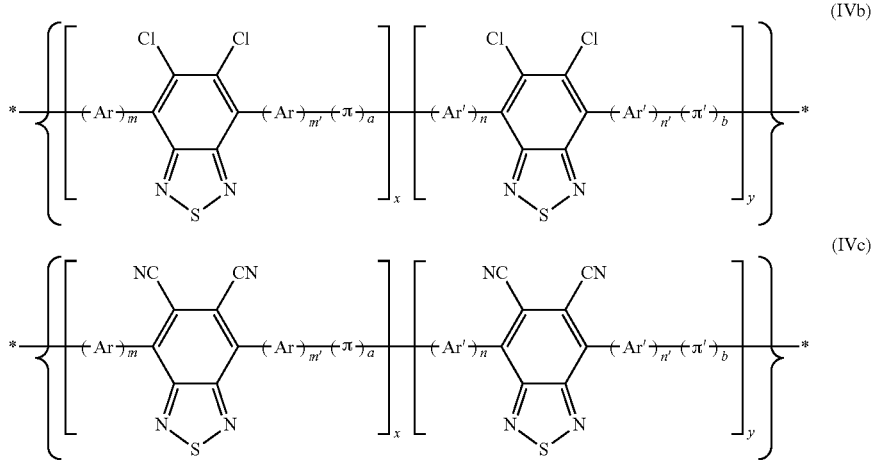

wherein Ar, Ar', π, π', m, m', n, n', a, b, x and y are as defined herein.

In some embodiments, $R^1$ and $R^2$ can be identical, $R^3$ and $R^4$ can be identical, but $R^1/R^2$ is different from $R^3/R^4$. For example, each of $R^1$ and $R^2$ can be an electron-withdrawing group selected from F, Cl, CN, a —C(O)—$C_{1-10}$ alkyl group, a —$CF_2$—$C_{1-10}$ alkyl group, and a —$CF_2$—$C_{1-10}$ haloalkyl group; while $R^3$ and $R^4$ can be H. Alternatively, $R^1/R^2$ and $R^3/R^4$ can be different electron-withdrawing groups. Accordingly, for example, certain embodiments of the present compounds can be represented by formula (IVd), (IVe), or (IVf):

wherein Ar, Ar', π, π', m, m', n, n', a, b, x and y are as defined herein.

In some embodiments, the electron-poor bicyclic heteroaryl group can be monosubstituted. For example, certain embodiments of the present compounds can be represented by formula (Va), (Vb), (Vc), (Vd), (Ve) or (Vf):

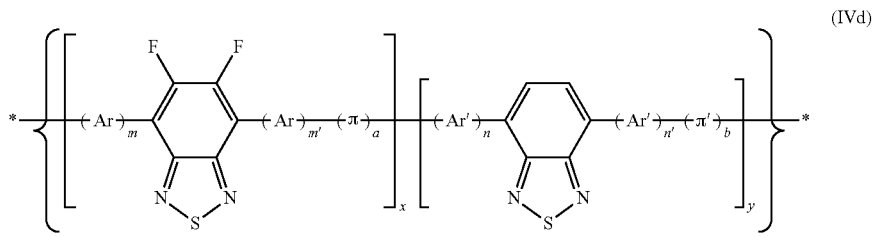

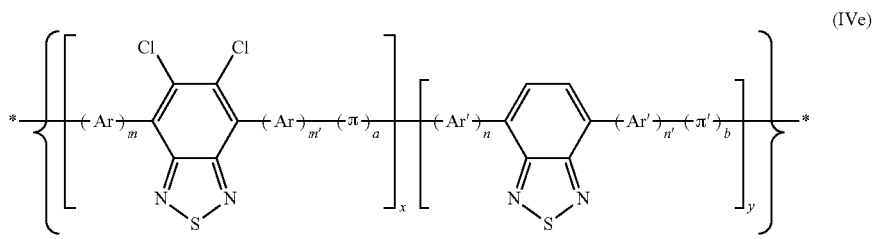

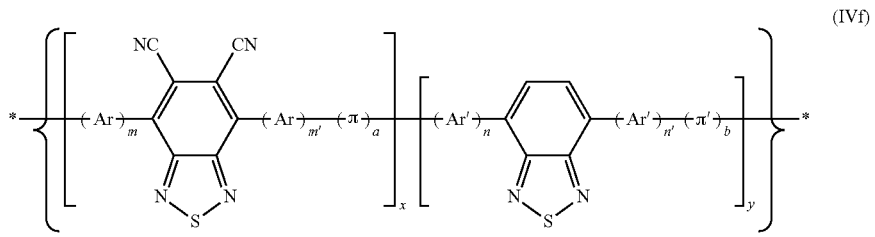

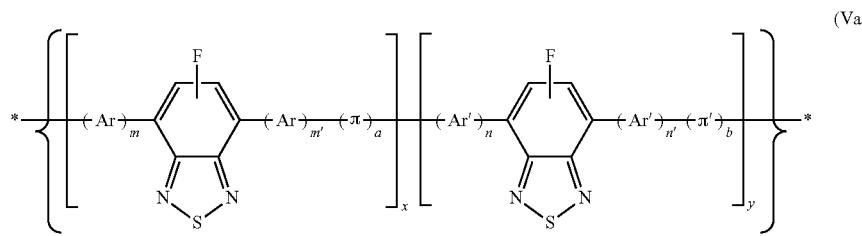
(Va)
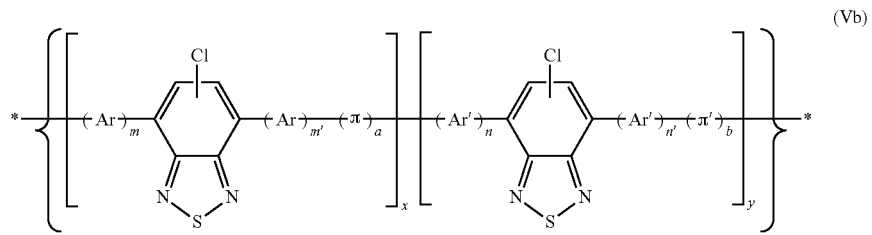
(Vb)
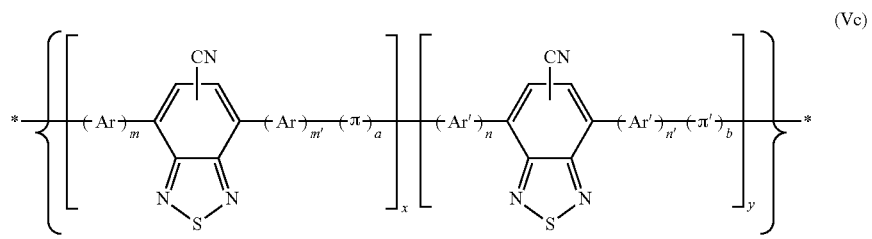
(Vc)
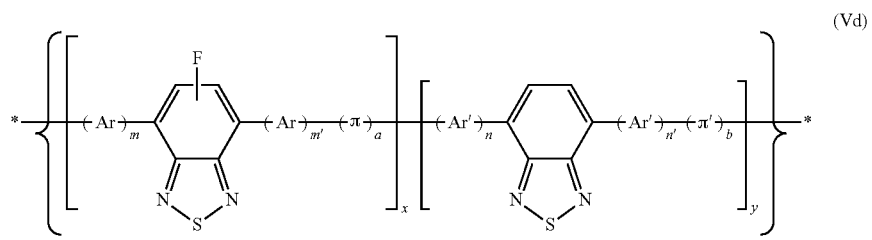
(Vd)
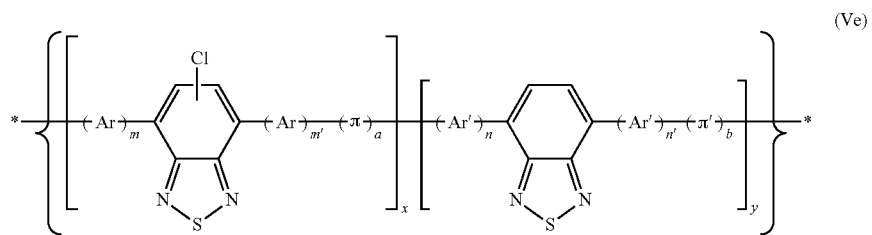
(Ve)
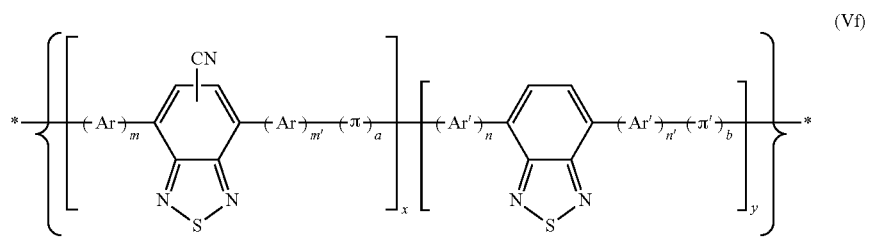
(Vf)

where Ar, Ar', π, π', m, m', n, n', a, b, x and y are as defined herein.

In some embodiments, both the first unit and the second unit can include π and π' (i.e., both a and b are 1). Accordingly, certain embodiments of the present compounds can be represented by formula (VI):

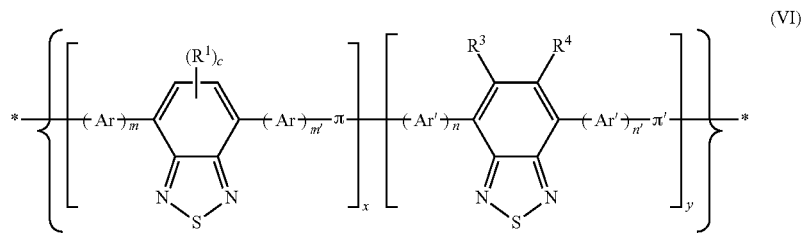

(VI)

where Ar, Ar', π, π', $R^1$, $R^3$, $R^4$, c, m, m', n, n', x and y are as defined herein, provided that the first unit and the second unit are different in one or more ways. For example, in embodiments where π and π' are identical, Ar can be absent in the first unit, in which case, the compound can be represented by formula (VIa):

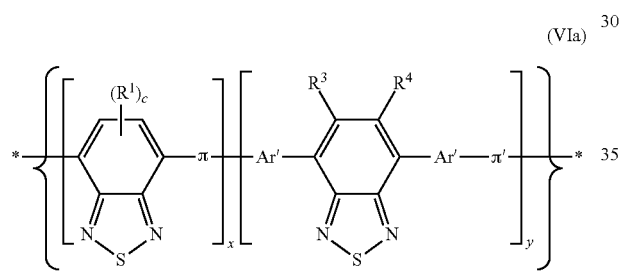

(VIa)

where Ar', π, π'∝0, $R^1$, $R^3$, $R^4$, c, x and y are as defined herein. In certain embodiments, the substitution of the 2,1,3-benzothiadiazole units can be different. For example, certain compounds of the present teachings can be represented by formula (VIb):

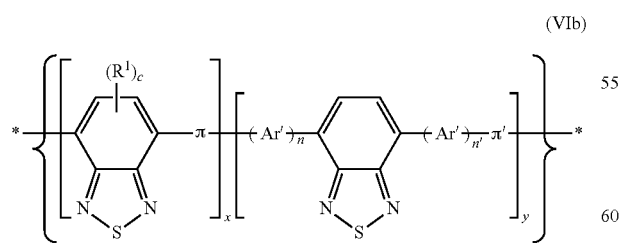

(VIb)

wherein Ar', π, π', $R^1$, c, n, n', x and y are as defined herein.

In some embodiments, the first and second unit can include different π and π' groups. For example, it can be selected from

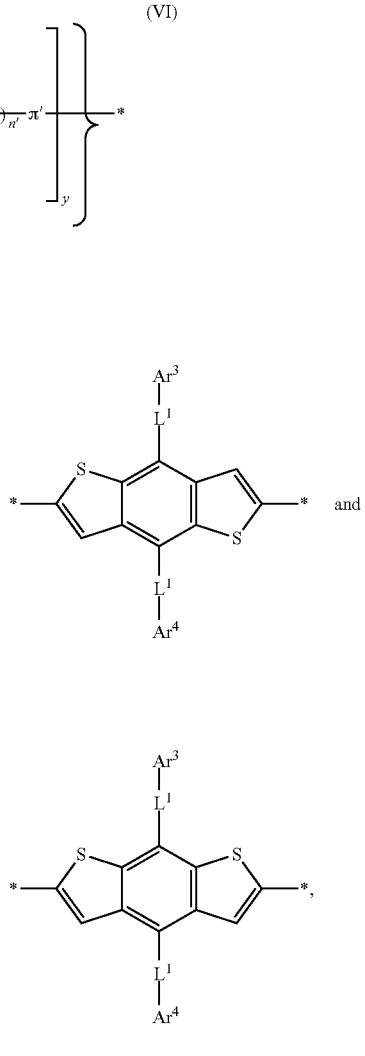

while π' can be selected from

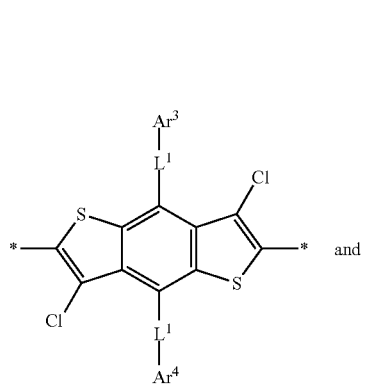

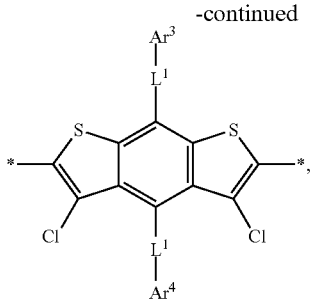

wherein $L^1$ can be selected from —O—, —S—, —OC(O)—, and a divalent $C_{1-20}$ alkyl group; and $Ar^3$ and $Ar^4$ can be selected from a phenyl group, a thienyl group, a thiazolyl group, an isothiazolyl group, a thiadiazolyl group, a furyl group, an oxazolyl group, an isoxazolyl group, an oxadiazolyl group, a pyrrolyl group, a triazolyl group, a tetrazolyl group, a pyrazolyl group, an imidazolyl group, a pyridyl group, a pyrimidyl group, a pyridazinyl group, and a pyrazinyl group, each of which optionally is substituted with 1-4 groups independently selected from a halogen, —CN, and L"R", wherein L", at each occurrence, is selected from —O—, —S—, —Se—, —C(O)—, —OC(O)—, —C(O)O—, and a covalent bond; and R", at each occurrence, independently is selected from a $C_{1-40}$ alkyl group, a $C_{2-40}$ alkenyl group, a $C_{2-40}$ alkynyl group, and a $C_{1-40}$ haloalkyl group.

In various embodiments, Ar and Ar' can be identical or different optionally substituted phenyl or thienyl groups. For example, certain compounds according to the present teachings can be represented by formula (VII):

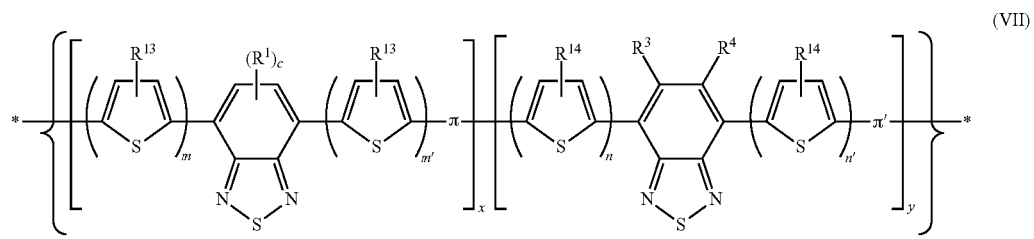

wherein:
$R^{13}$ and $R^{14}$ independently are selected from H, F, Cl, $R^{15}$, $OR^{15}$, and $SR^{15}$, wherein $R^{15}$, at each occurrence, independently is selected from a $C_{1-20}$ alkyl group, a $C_{1-20}$ alkenyl group, and a $C_{1-20}$ haloalkyl group; and
$\pi$, $\pi'$, $R^1$, $R^3$, $R^4$, c, m, m', n, n', x and y are as defined herein.

In the embodiments represented by formula (VII), $R^{13}$ and $R^{14}$ can be different. In particular, one of $R^{13}$ and $R^{14}$ can be H, while the other of $R^{13}$ and $R^{14}$ can be selected from F, Cl, a $C_{1-20}$ alkyl group, a $C_{1-20}$ alkoxy group, and a $C_{1-20}$ alkylthio group. Accordingly, certain compounds according to such embodiments can be represented by formula (VIIa):

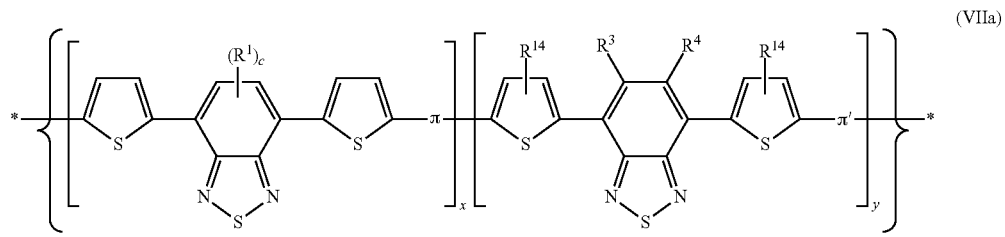

wherein $R^{14}$ can be selected from F, Cl, $R^{15}$, $OR^{15}$, and $SR^{15}$, wherein $R^{15}$ is a $C_{1-20}$ alkyl group; and $\pi$, $\pi'$, $R^1$, $R^3$, $R^4$, c, x and y are as defined herein. In some embodiments, $R^1$ can be selected from F and Cl. In certain embodiments $R^3$ and $R^4$ can be the same as $R^1$. In alternative embodiments, $R^3$ and $R^4$ can be H.

In some embodiments, both Ar and Ar' can be identically substituted thienyl groups, and the first unit and the second unit can differ from each other based on differences between $R^1$ and $R^3$ and $R^4$. Accordingly, certain compounds of the present teachings can be represented by formula (VIIb):

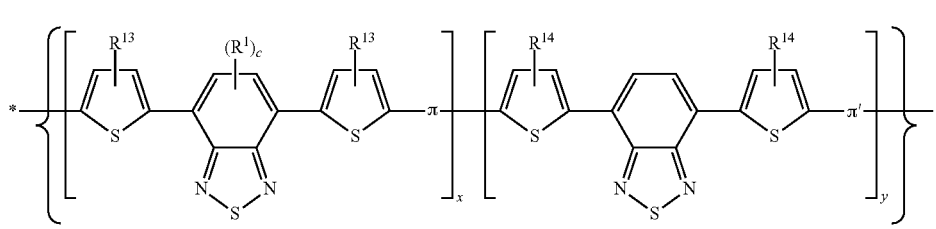

wherein:
$R^{13}$ and $R^{14}$ can be the same and can be selected from F, Cl, $R^{15}$, $OR^{15}$, and $SR^{15}$, wherein $R^{15}$ is a $C_{1-20}$ alkyl group; and $\pi, \pi', R^1$, c, x and y are as defined herein.

In some embodiments, only one of the first unit and the second unit includes optionally substituted thienyl groups. For example, certain compounds can be represented by formula (VIIc):

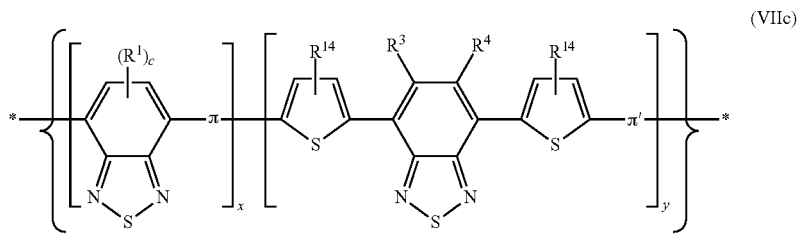

where $R^{14}$ can be selected from F, Cl, $R^{15}$, $OR^{15}$, and $SR^{15}$, wherein $R^{15}$ is a $C_{1-20}$ alkyl group; and $\pi, \pi', R^1, R^3, R^4$, c, x and y are as defined herein. In some embodiments, $R^3$ and $R^4$ can be the same as $R^1$. In other embodiments, $R^3$ and $R^4$ can be H.

Accordingly, certain embodiments of the present polymer can be represented by formula (VIIIa):

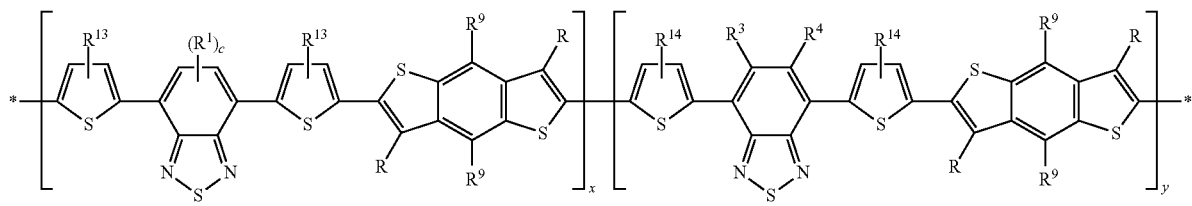

wherein:
each R independently can be H or Cl;
$R^1, R^3$ and $R^4$ independently can be selected from H, F, Cl, and CN;
each $R^9$ can be selected from:

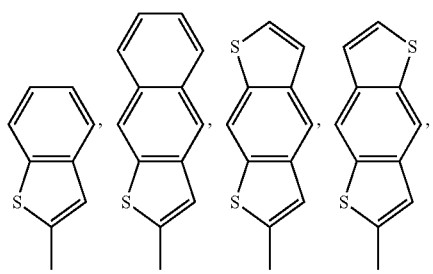

-continued

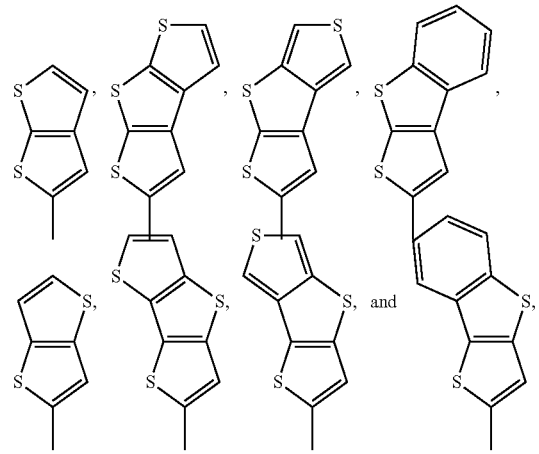

wherein any of the carbon atoms optionally can be substituted with a halogen, —CN, or L'R', wherein L', at each occurrence, can be selected from —O—, —S—, —Se—, —C(O)—, —OC(O)—, —C(O)O—, and a covalent bond; and R', at each occurrence, independently can be selected from a $C_{1-40}$ alkyl group, a $C_{2-40}$ alkenyl group, a $C_{2-40}$ alkynyl group, and a $C_{1-40}$ haloalkyl group;

$R^{13}$ and $R^{14}$ independently can be selected from H, F, Cl, $R^{15}$, $OR^{15}$, and $SR^{15}$; wherein $R^{15}$, at each occurrence, independently can be selected from a $C_{1-20}$ alkyl group, a $C_{1-20}$ alkenyl group, and a $C_{1-20}$ haloalkyl group;

c can be 0, 1 or 2; and x and y are real numbers representing mole fractions, wherein $0.05 \leq x \leq 0.95$, $0.05 \leq y \leq 0.95$, and the sum of x and y is about 1.

Certain embodiments of the present polymer can be represented by formula (VIIIb), (VIIIc), (VIIId), (VIIIe) or (VIIIf):

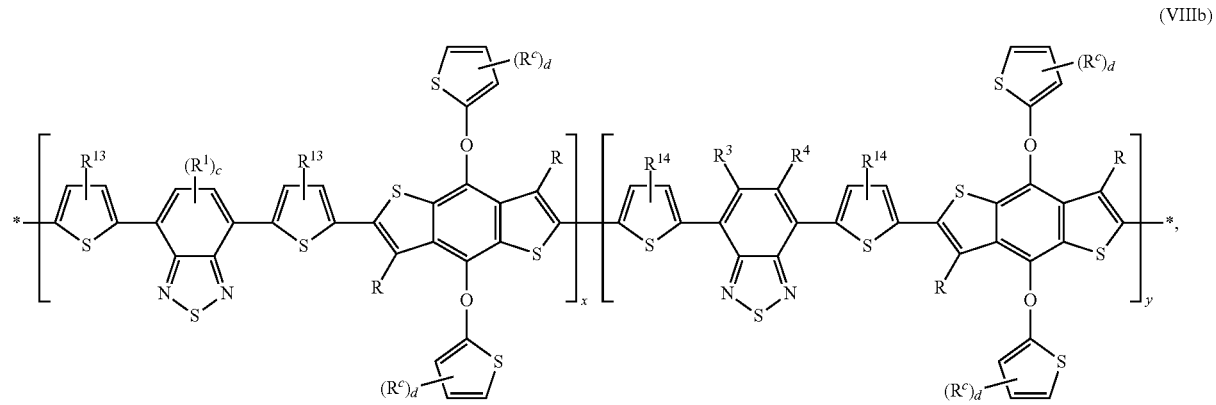

(VIIIb)

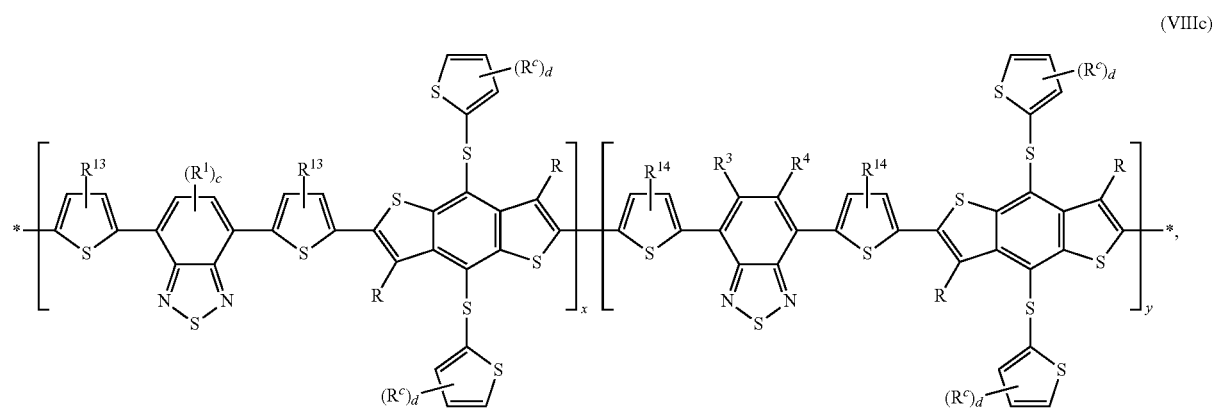

(VIIIc)

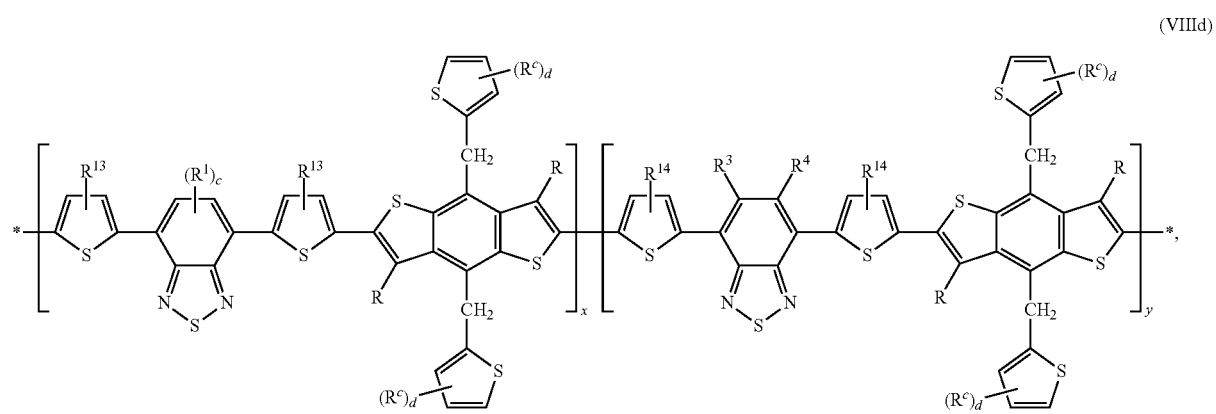

(VIIId)

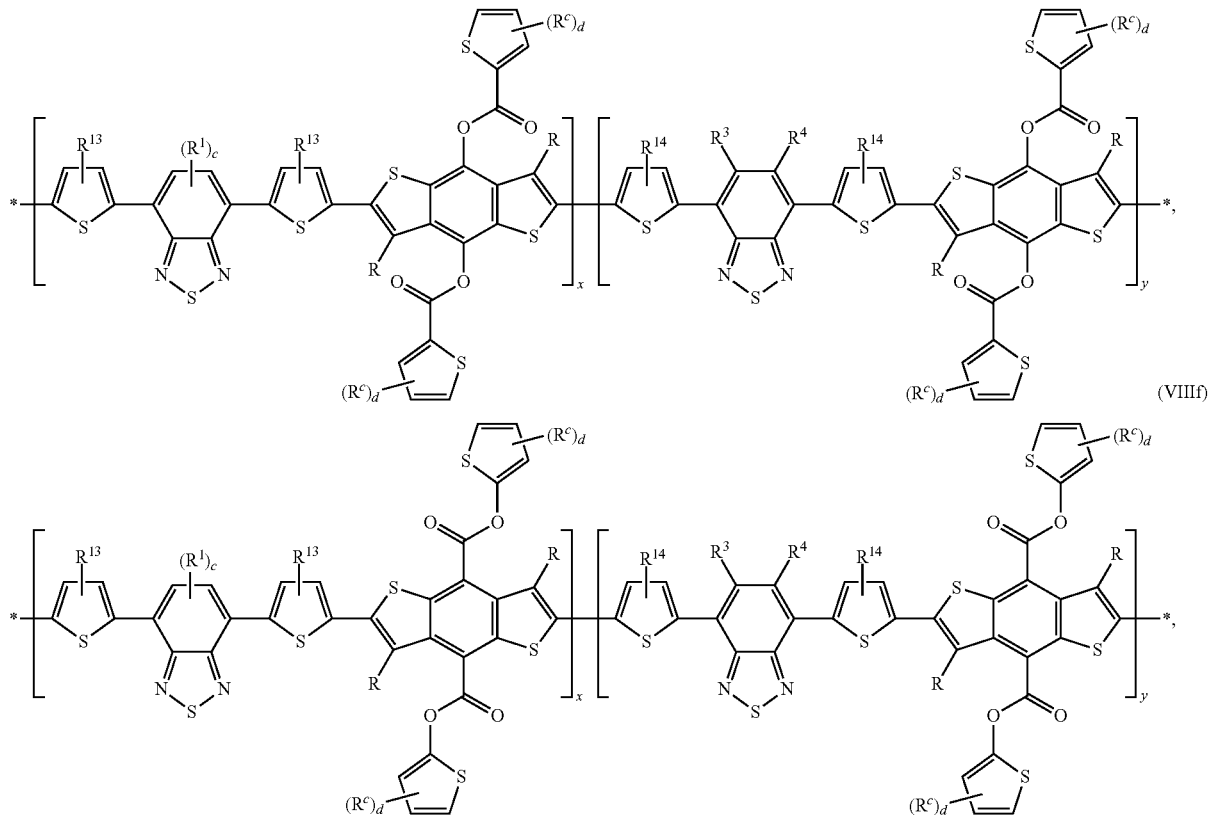

wherein:

each R independently can be H or Cl;

$R^c$, at each occurrence, independently is selected from F, Cl, —CN, and L"R", wherein L", at each occurrence, is selected from —O—, —S—, —Se—, —C(O)—, —OC(O)—, —C(O)O—, and a covalent bond; and R", at each occurrence, independently is selected from a $C_{1-40}$ alkyl group, a $C_{2-40}$ alkenyl group, a $C_{2-40}$ alkynyl group, and a $C_{1-40}$ haloalkyl group;

$R^1$, $R^3$ and $R^4$ independently can be selected from H, F, Cl, and CN;

$R^{13}$ and $R^{14}$ independently can be selected from H, F, Cl, $R^{15}$, $OR^{15}$, and $SR^{15}$; wherein $R^{15}$, at each occurrence, independently can be selected from a $C_{1-20}$ alkyl group, a $C_{1-20}$ alkenyl group, and a $C_{1-20}$ haloalkyl group;

c can be 0, 1 or 2;

d can be 1, 2 or 3; and x and y are real numbers representing mole fractions, wherein $0.05 \le x \le 0.95$, $0.05 \le y \le 0.95$, and the sum of x and y is about 1.

Particular embodiments of the present polymer can be represented by formula (VIIIg), (VIIIh), (VIIIi), (VIIIj) or (VIIIk):

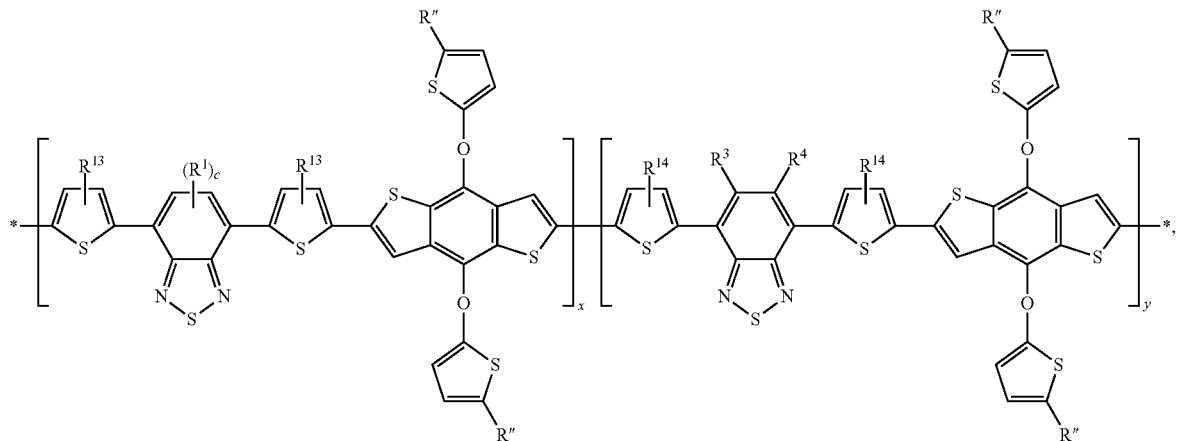

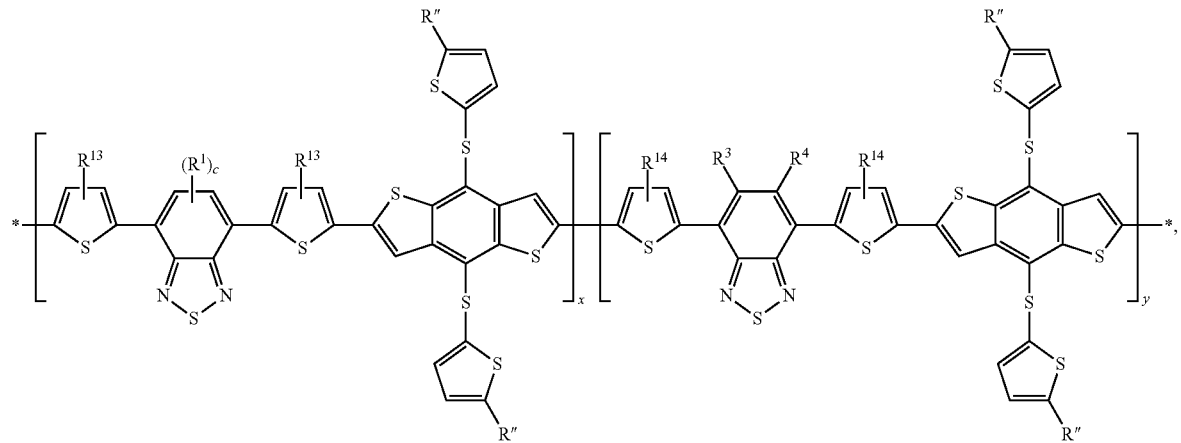
(VIIIh)
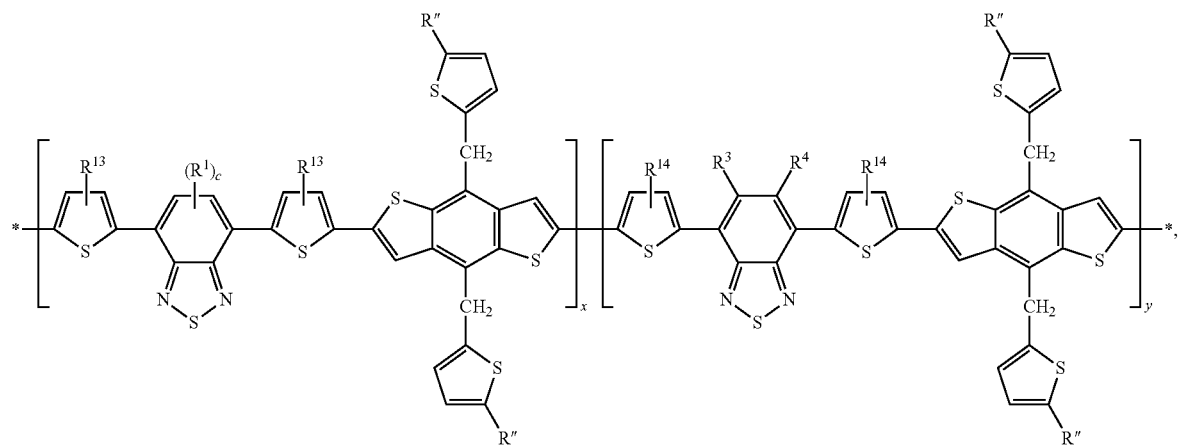
(VIIIi)
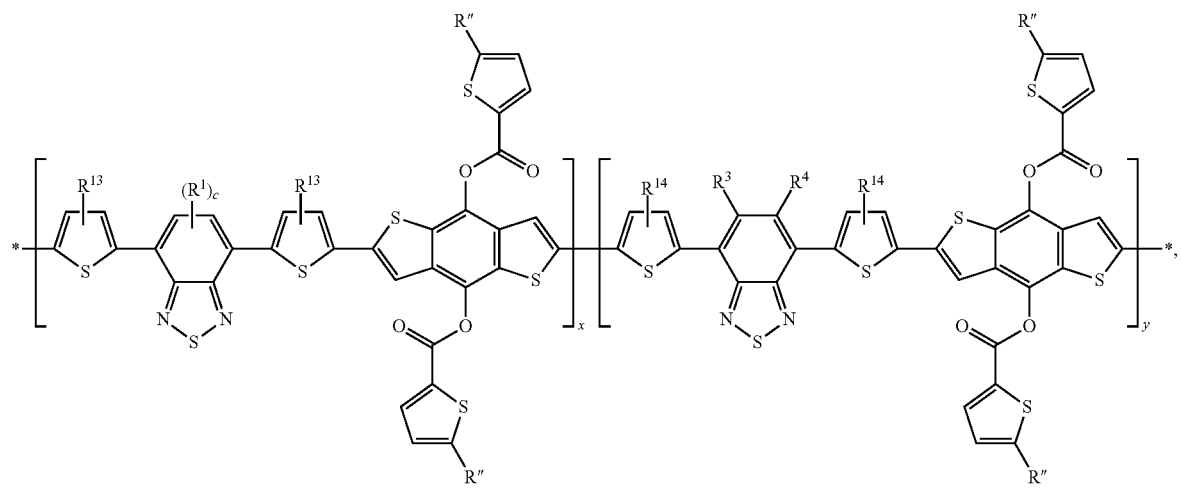
(VIIIj)

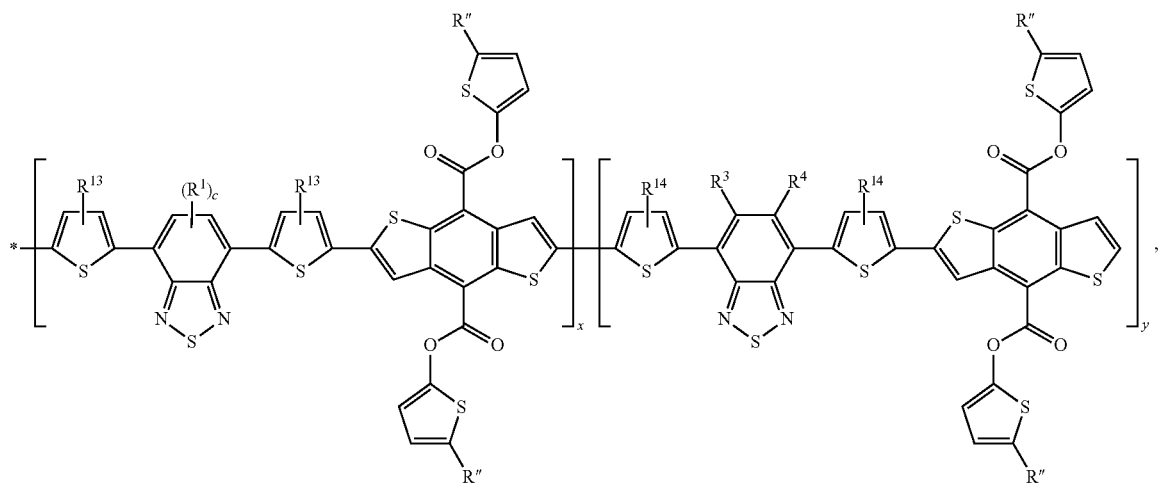

wherein:

each R" can be a $C_{1-40}$ alkyl group or a $C_{1-40}$ haloalkyl group; $R^1$, $R^3$, and $R^4$, independently can be selected from H, F, Cl, —CN, and L'R', wherein L', at each occurrence, can be selected from —O—, —S—, —Se—, —C(O)—, —OC(O)—, —C(O)O—, a divalent $C_{1-20}$ alkyl group, a divalent $C_{1-20}$ haloalkyl group, and a covalent bond; and R', at each occurrence, independently can be selected from H, a $C_{1-40}$ alkyl group, a $C_{2-40}$ alkenyl group, a $C_{2-40}$ alkynyl group, a $C_{1-40}$ haloalkyl group, an optionally substituted $C_{6-14}$ aryl group and an optionally substituted 5-14 membered heteroaryl group;

$R^{13}$ and $R^{14}$ independently can be selected from H, F, Cl, $R^{15}$, $OR^{15}$, and $SR^{15}$; $R^{15}$, at each occurrence, independently can be selected from a $C_{1-20}$ alkyl group, a $C_{1-20}$ alkenyl group, and a $C_{1-20}$ haloalkyl group;

c can be 0, 1 or 2; and x and y are real numbers representing mole fractions, wherein $0.05 \leq x \leq 0.95$, $0.05 \leq y \leq 0.95$, and the sum of x and y is about 1.

With respect to embodiments of the present polymers represented by formula VIIIa, VIIIb, VIIIc, VIIId, VIIIe, VIIIf, VIIIg, VIIIh, VIIIi, VIIIj or VIIIk, both Ar and Ar' can be identically substituted thienyl groups (i.e., $R^{13}$ and $R^{14}$ are the same), while $R^3$ and $R^4$ can be H. In some embodiments, $R^3$ and $R^4$ can be identical to $R^1$ (e.g., F or Cl). In these embodiments, Ar and Ar' can be differently substituted thienyl groups (e.g., $R^{14}$ can be F, Cl, or a $C_{6-20}$ alkyl group, while $R^{13}$ can be H).

In any of the formulae provided herein, the first unit and the second unit can be different, and the two units can be repeated in a random manner. The mole fraction of the two units can be between about 0.05 and about 0.95, for example, between about 0.1 and about 0.9, between about 0.2 and about 0.8, between about 0.3 and about 0.7, or between about 0.4 and about 0.6. In certain embodiments, the present polymers can include the same mole fraction of the first unit as the second unit (i.e., x=y=0.5).

Polymers of the present teachings and monomers leading to the present polymers can be prepared according to procedures analogous to those described in the Examples. In particular, Stille coupling or Suzuki coupling reactions can be used to prepare co-polymeric compounds according to the present teachings with high molecular weights and in high yields and purity, as confirmed by $^1$H NMR spectra, elemental analysis, and/or GPC measurements.

Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), optical absorption/emission spectroscopy (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments disclosed herein can be stable in ambient conditions ("ambient stable") and soluble in common solvents. As used herein, a compound can be considered electrically "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound according to the present teachings can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period. In addition, a compound can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The present compounds can be fabricated into various articles of manufacture using solution processing techniques in addition to other more expensive processes such as vapor deposition. Various solution processing techniques have been used with organic electronics. Common solution processing techniques include, for example, spin coating, slot coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Compounds of the present teachings can be used alone or in combination with other compounds to prepare semiconductor materials (e.g., compositions and composites), which in turn can be used to fabricate various articles of manufacture, structures, and devices. In some embodiments, semiconductor materials incorporating one or more compounds of the present teachings can exhibit p-type semiconductor activity, ambipolar activity, light absorption, and/or light emission.

The present teachings, therefore, further provide methods of preparing a semiconductor material. The methods can include preparing a composition (e.g., a solution or dispersion) that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a photoactive layer) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatibilizing agents, curing agents, initiators, humectants, antifoaming agents, wetting agents, pH modifiers, biocides, and bacteriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatibilizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, slot coating, drop-casting, zone casting, dip coating, blade coating, or spraying.

Various articles of manufacture including optical devices, optoelectronic devices, and electronic devices such as thin film semiconductors, photovoltaic devices, photodetectors, organic light emitting devices such as organic light emitting transistors (OLETs), that make use of the compounds disclosed herein are within the scope of the present teachings as are methods of making the same. The present compounds can offer processing and operation advantages in the fabrication and/or the use of these devices.

For example, articles of manufacture such as the various devices described herein can be an optical or optoelectronic device including a first electrode, a second electrode, and a photoactive component disposed between the first electrode and the second electrode, where the photoactive component includes a compound of the present teachings.

In various embodiments, the optical or optoelectronic device can be configured as a solar cell, in particular, a bulk heterojunction solar cell. Compounds of the present teachings can exhibit broad optical absorption and/or a tuned redox properties and bulk carrier mobilities, making them desirable for such applications. In various embodiments, the bulk heterojunction solar cells according to the present teachings can incorporate a blend material (e.g., a blended film) including a compound of the present teachings as the donor material and an acceptor material as the photoactive layer. While in most state-of-the-art devices, the thickness of the blended film often is limited to about 100 nm or less (to obtain good device performance), the inventors have observed comparable performance with films prepared from the copolymers described herein in a broad thickness range, specifically, with thin films having a thickness of about 100 nm or less, as well as films having a thickness greater than about 200 nm.

Typical acceptor materials include fullerene-based compounds. Fullerenes useful in the present teachings can have a broad range of sizes (number of carbon atoms per molecule). The term fullerene as used herein includes various cage-like molecules of pure carbon, including Buckministerfullerene ($C_{60}$) "bucky ball" and the related "spherical" fullerenes as well as carbon nanotubes. Fullerenes can be selected from those known in the art ranging from, for example, C20-C1000. In certain embodiments, the fullerene can be selected from the range of C60 to C96. In particular embodiments, the fullerene can be C60 or C70, such as C60-[6,6]-phenyl-$C_{61}$-butyric acid methyl ester (C60-PCBM) or C70-PCBM. In some embodiments, chemically modified fullerenes can be used, provided that the modified fullerene retains acceptor-type and electron mobility characteristics. Other acceptor materials can be used in place of fullerenes, provided that they have the required acceptor-type and electron mobility characteristics. For example, the acceptor material can be various organic small molecules, polymers, carbon nanotubes, or inorganic particles (quantum dots, quantum rods, quantum tripods, $TiO_2$, ZnO etc.).

In some embodiments, the acceptor material can be an electron-transporting (n-type) polymer. In some embodiments, the electron-transporting polymer can comprise a bis(imide)arene unit. For example, the arene group in the bis(imide)arene unit can be a fused-ring (hetero)aromatic moiety (referred to as π-1 and π-1' below) selected from:

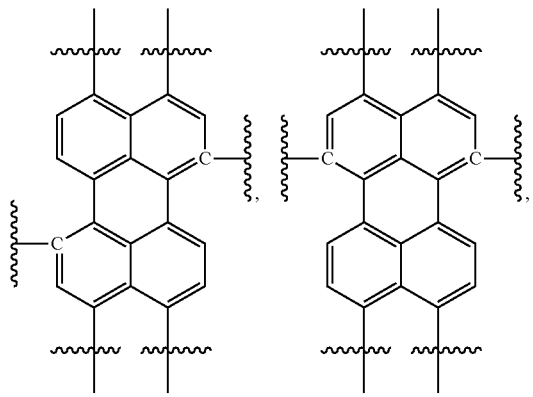

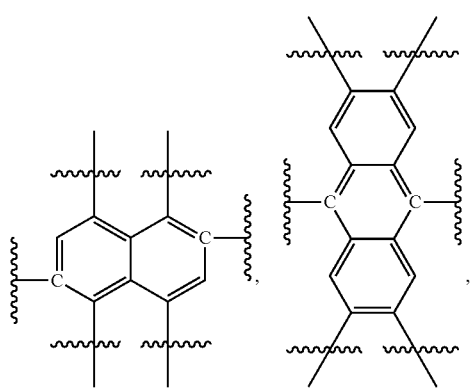

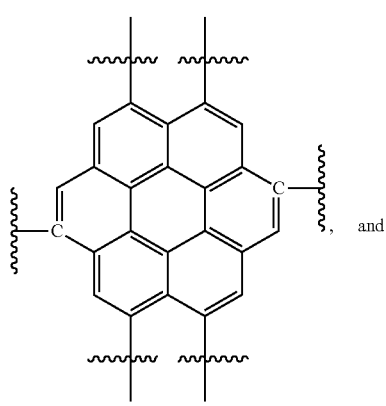, and

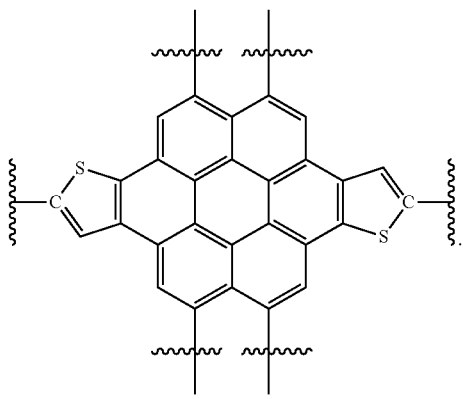

In preferred embodiments, the arene group can be naphthalene.

To illustrate, in certain embodiments, the electron-transporting polymer can be an alternating polymer including a bis(imide)arene unit and an $M^a$ co-unit. The alternating polymer can be represented by Formula 1:

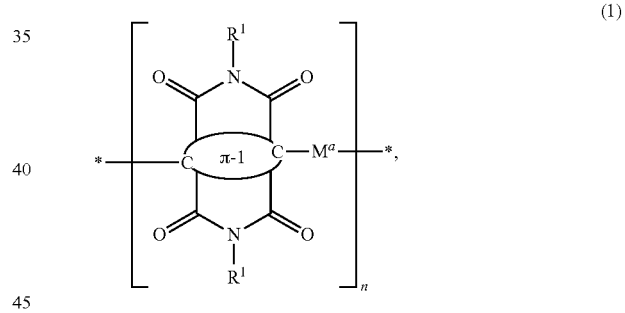

(1)

wherein:

π-1 is an optionally substituted fused ring moiety;

$R^1$ is selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;

$M^a$ is a repeat unit comprising one or more conjugated moieties that does not include a bis(imide)arene unit (arylene diimide); and n is an integer in the range of 2 to 5,000.

In other embodiments, the electron-transporting polymer can be a random polymer including two different building blocks, where each building block includes a bis(imide)arene unit and an $M^a$ co-unit. For example, the random polymer can be represented by Formula 2:

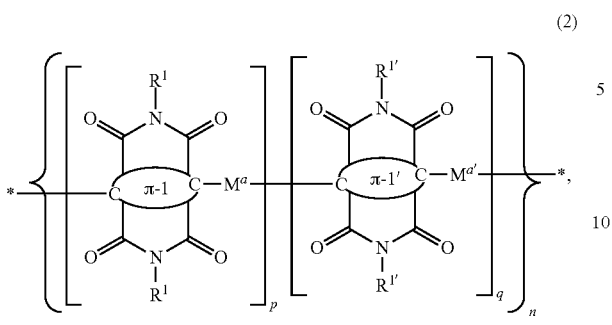

wherein:

π-1 and π-1' can be identical or different and independently are an optionally substituted fused ring moiety;

$R^1$ and $R^{1'}$ can be identical or different and independently are selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;

$M^a$ and $M^{a'}$ can be identical or different and independently are a repeat unit comprising one or more conjugated moieties that does not include arylene diimide;

p and q independently are a real number, wherein $0.1 \le p \le 0.9$, $0.1 \le q \le 0.9$, and the sum of p and q is about 1; and n is an integer in the range of 2 to 5,000;

provided that at least one of the following is true: (a) π-1' is different from π-1, (b) $R^{1'}$ is different from $R^1$, or (c) $M^{a'}$ is different from $M^a$.

The one or more conjugated moieties in the co-repeat unit $M^a$ and $M^{a'}$ can be represented by Ar, π-2, and Z, wherein Ar is an optionally substituted monocyclic aryl or heteroaryl group, π-2 is an optionally substituted 8-24 membered polycyclic conjugated moiety, and Z is a conjugated linear linker. In various embodiments, $M^a$ and $M^{a'}$ can have a formula selected from:

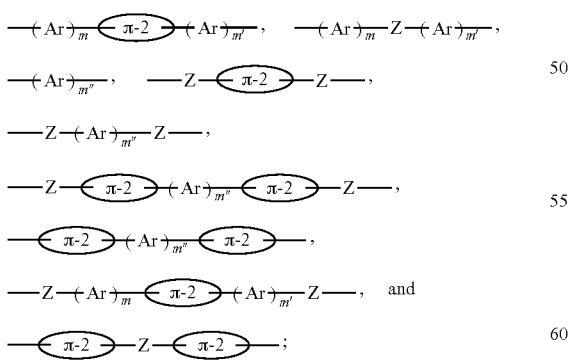

wherein m, m' and m" independently are 0, 1, 2, 3, 4, 5 or 6.

In certain embodiments, π-2 can be a polycyclic moiety including one or more optionally substituted thienyl, thiazolyl, or phenyl groups. For example, π-2 can be selected from:

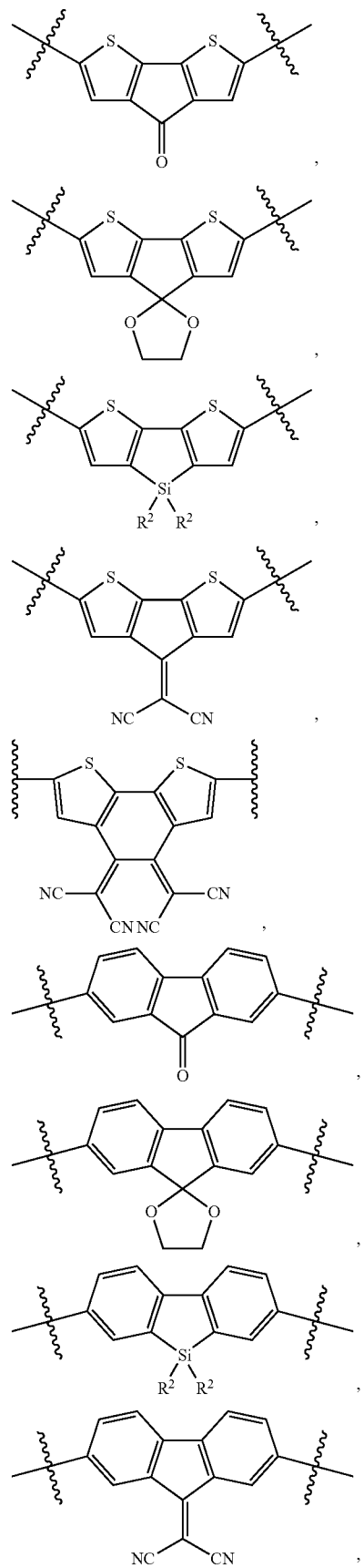

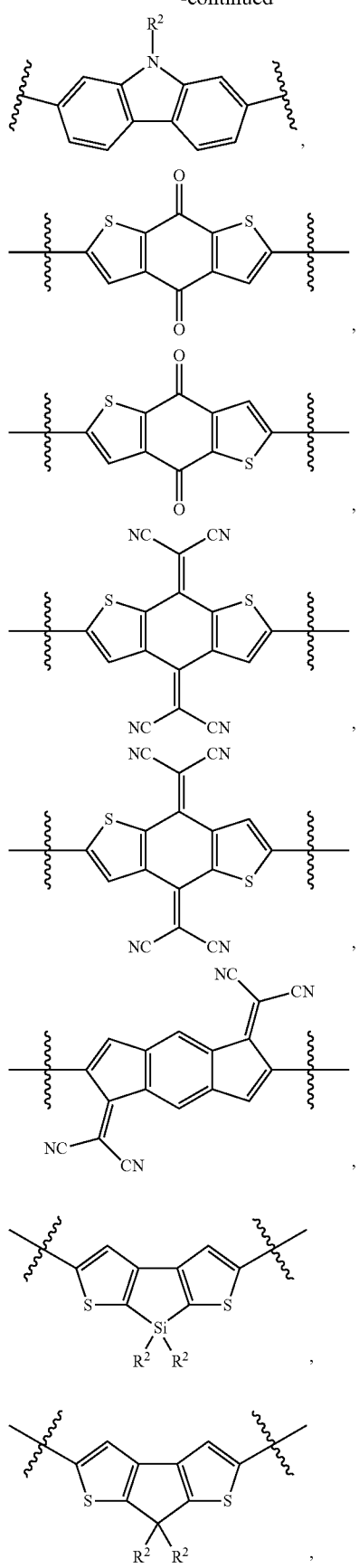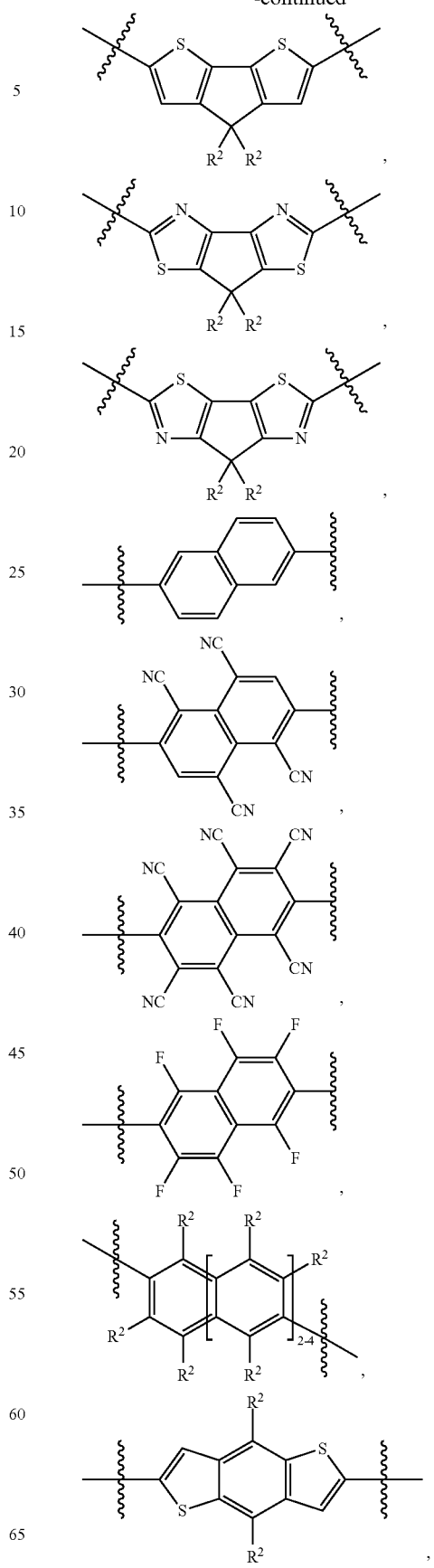

-continued
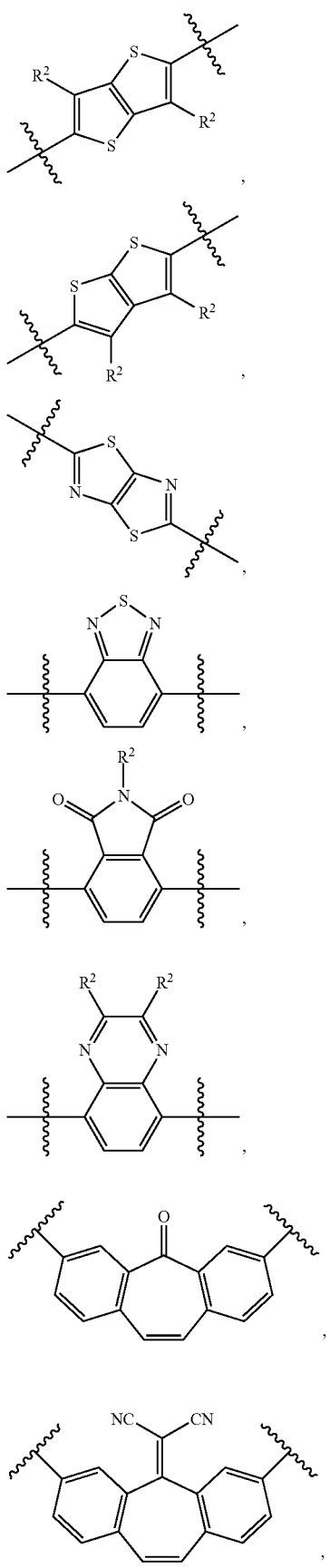
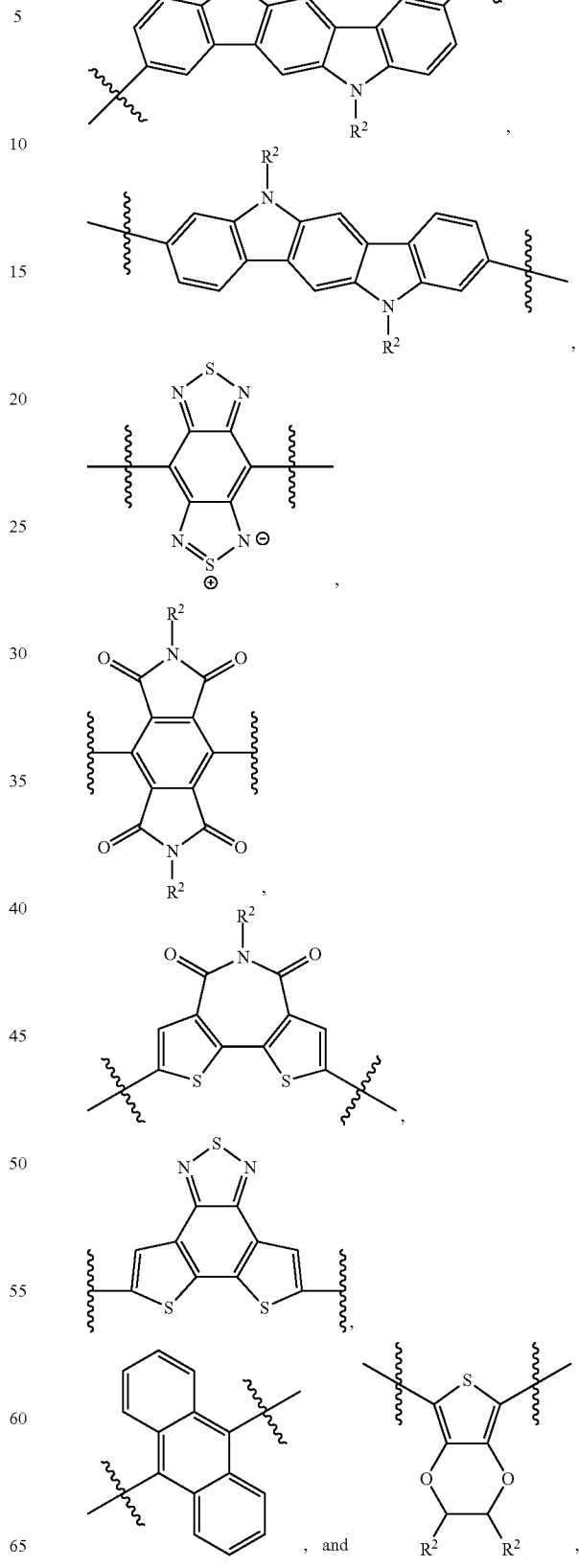
, and wherein $R^2$ can be selected from H, a $C_{1-20}$ alkyl group, a $C_{1-20}$ alkoxy group, and a $C_{1-20}$ haloalkyl group.

In certain embodiments, each Ar can be independently a 5- or 6-membered aryl or heteroaryl group. For example, each Ar can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 substituents independently selected from a halogen, —CN, an oxo group, a $C_{1-6}$ alkyl group, a $C_{1-6}$ alkoxy group, a $C_{1-6}$haloalkyl group, $NH_2$, $NH(C_{1-16}$ alkyl) and $N(C_{1-6}$alkyl$)_2$. In particular embodiments, each Ar can be selected from a thienyl group, an isothiazolyl group, a thiazolyl group, a 1,2,4-thiadiazolyl group, a 1,3,4-thiadiazolyl group, a 1,2,5-thiadiazolyl group, a phenyl group, and a pyrrolyl group, wherein each group optionally can be substituted with 1-2 substituents independently selected from a halogen, —CN, an oxo group, a $C_{1-6}$ alkyl group, a $C_{1-6}$alkoxy group, a $C_{1-6}$haloalkyl group, $NH_2$, $NH(C_{1-6}$alkyl) and $N(C_{1-6}$alkyl$)_2$. In some embodiments, Ar can be unsubstituted. In some embodiments, Ar can be a thienyl group, an isothiazolyl group, a thiazolyl group, a 1,2,4-thiadiazolyl group, a 1,3,4-thiadiazolyl group, and a 1,2,5-thiadiazolyl group, wherein each optionally is substituted with 1-2 $C_{1-6}$alkyl groups.

In various embodiments, the linker Z can be a conjugated system by itself (e.g., including two or more double or triple bonds) or can form a conjugated system with its neighboring components. For example, in embodiments where Z is a linear linker, Z can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

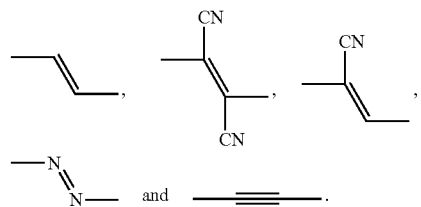

In some embodiments, $M^a$ and $M^{a'}$ can include at least one optionally substituted monocylic aryl or heteroaryl group. For example, $M^a$ and $M^{a'}$ can have the formula:

wherein m" is selected from 1, 2, 3, 4, 5, or 6; and Ar is as defined herein. For example, Ar can be an optionally substituted thienyl group.

In certain embodiments, the acceptor material can be a bis(imide)arene polymer represented by Formula 3 or 4:

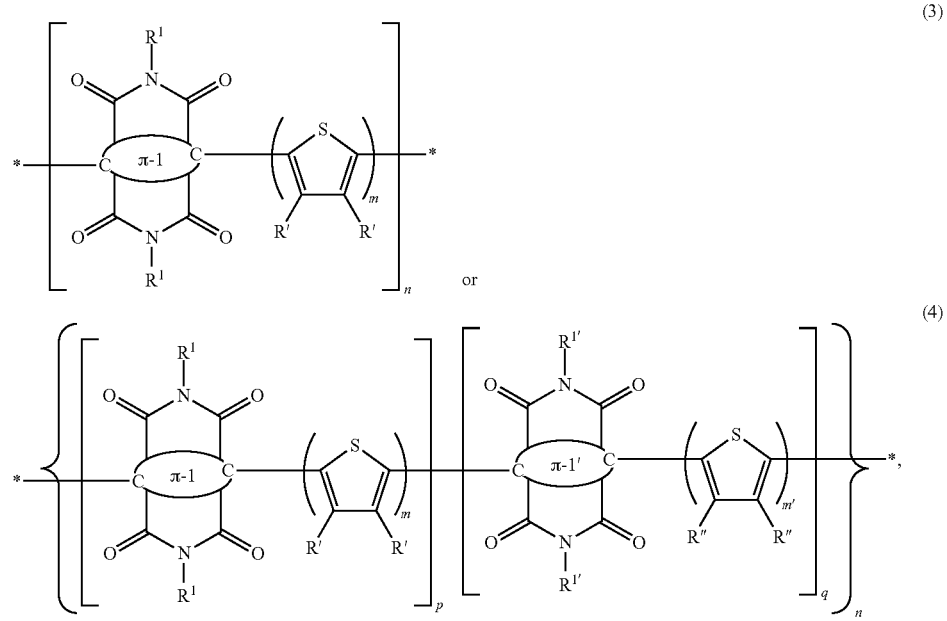

wherein:

$\pi$-1 and $\pi$-1' can be identical or different and independently are an optionally substituted fused ring moiety;

$R^1$ and $R^{1'}$ can be identical or different and independently are selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;

R' and R" can be identical or different and independently are selected from the group consisting of H, F, Cl, —CN, and -L-R, wherein L, at each occurrence, independently is selected from the group consisting of —O—, —S—, —C(O), —C(O)O—, and a covalent bond; and R, at each occurrence, independently can be selected from the group consisting of a $C_{6-20}$ alkyl group, a $C_{6-20}$ alkenyl group, and a $C_{6-20}$ haloalkyl group;

m and m' independently can be 1, 2, 3, 4, 5 or 6; and p and q independently are a real number, wherein $0.1 \leq p \leq 0.9$, $0.1 \leq q \leq 0.9$, and the sum of p and q is about 1; and n is an integer in the range of 2 to 5,000;

provided that at least one of the following is true: (a) π-1' is different from π-1, (b) $R^{1'}$ is different from $R^1$, or (c) R" is different from R'.

In particular embodiments, the acceptor material can be a polymer represented by Formula 5, 6, 7, or 8:

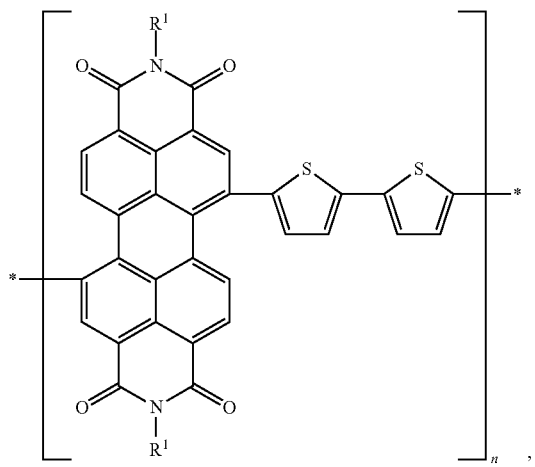

(5)

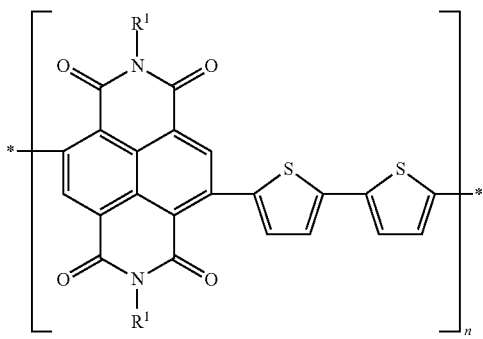

(6)

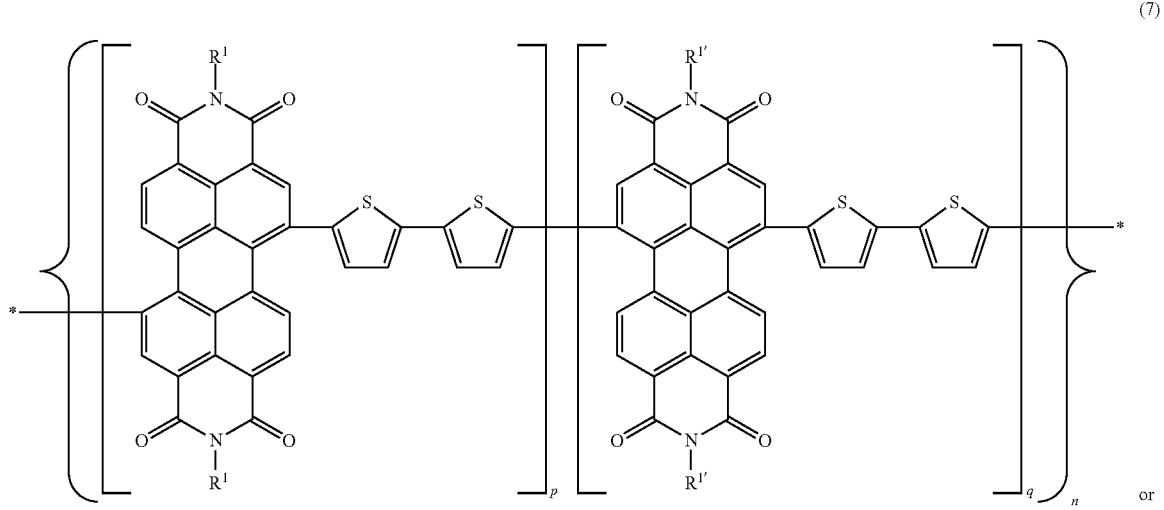

(7)

or

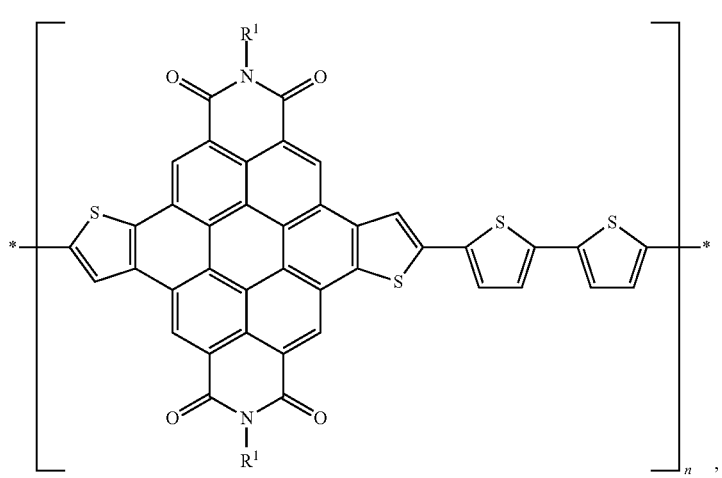

(8)

wherein:

$R^1$ and $R^{1'}$ can be identical or different and independently are selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;

p and q independently are a real number, wherein $0.1 \leq p \leq 0.9$, $0.1 \leq q \leq 0.9$, and the sum of p and q is about 1; and n is an integer in the range of 2 to 5,000.

For example, $R^1$ and $R^{1'}$ can be selected from the group consisting of a branched $C_{3-20}$ alkyl group, a branched $C_{4-20}$ alkenyl group, and a branched $C_{3-20}$ haloalkyl group such as:

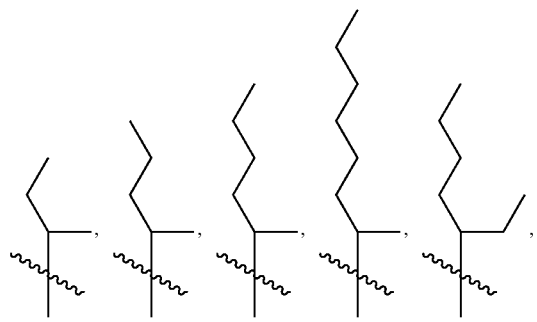

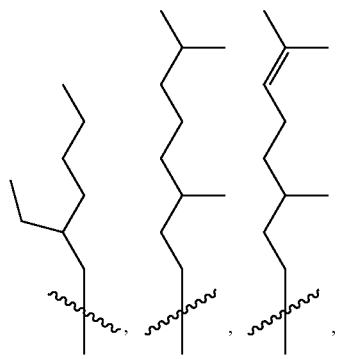

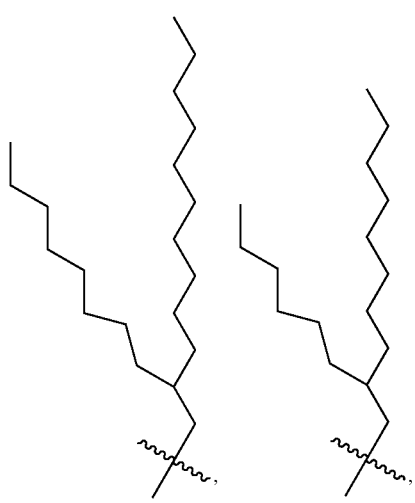

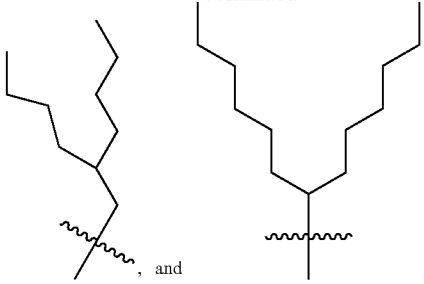
, and

A photoactive component according to the present teachings can be prepared as a blended film deposited from a solution or dispersion containing a mixture of one or more of the present compounds and an acceptor compound such as fullerene (e.g., PCBM) or a polymeric acceptor described herein. The ratio of the present polymer to the acceptor compound can range from about 10:1 to about 1:10 by weight; for example, from about 5:1 to about 1:5 by weight, from about 3:1 to about 1:3 by weight, or from about 2:1 to about 1:2 by weight. The photoactive layer also can contain a polymeric binder, which can be present from about 5 to about 95% by weight. The polymeric binder, for example, can be a semicrystalline polymer selected from polystyrene (PS), high density polyethylene (HDPE), polypropylene (PP) and polymethylmethacrylate (PMMA). In some embodiments, the polymeric blend can be used together with additional components that are optically active, for example, components that can assist in light harvesting by capturing and transferring excitons to one or both of the electron-donor polymers/electron-acceptor polymers in the blend, and/or optically non-active components to modify and/or improve processing and/or device performance. Such optically non-active components can include alkanethiols (e.g., alkanedithiols) and other α,ω-functionalized alkanes (e.g., diiodoalkanes) as known in the art. See e.g., U.S. Pat. No. 8,227,691.

The blend composition can be deposited on a substrate (e.g., an electrode-substrate) preferably via a solution-phase process, followed by removal of the solvent or mixture of solvents to provide the photoactive layer. By having the blend composition provided as an intimate mixture of the present polymer and an acceptor compound, bulk heterojunctions are created upon removal of the solvent (optionally under reduced pressure and/or elevated temperature), during which nanoscale phase separation of the present donor polymers and the acceptor compound takes place. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, slot-die coating, drop-casting, zone casting, dip coating, blade coating, or spraying. When the film is formed by spin coating, the spin speed can range from about 300 rpm to about 6000 rpm, or from about 500 rpm to about 2000 rpm. Subsequent processing steps can include thermal annealing or irradiation of the deposited film. For example, the blended film can be annealed from about 50° C. to about 300° C., preferably from about 70° C. to about 200° C., more preferably from about 90° C. to about 180° C. for about 1 min to about 20 minutes. The annealing step can be carried out under an inert atmosphere (e.g., under nitrogen). Irradiation of the deposited film can be carried out using infrared light or ultraviolet light. As used herein, "annealing"

refers to a post-deposition heat treatment to the semicrystalline polymer film in ambient or under reduced/increased pressure for a time duration of more than 60 seconds, and "annealing temperature" refers to the maximum temperature that the polymer film is exposed to for at least 30 seconds during this process of annealing. The photoactive layer typically can have a thickness ranging from about 30 nm to about 500 nm. In preferred embodiments, the photoactive layer can be a thin film having a thickness of about 80-300 nm.

FIG. 1 illustrates a representative structure of a bulk-heterojunction organic solar cell which can incorporate one or more compounds of the present teachings as the donor material. As shown, a representative solar cell generally includes a substrate 20, an anode 22, a cathode 26, and a photoactive layer 24 between the anode and the cathode that can incorporate one or more compounds of the present teachings as the electron donor (p-channel) material. In some embodiments, an optional smoothing layer can be present between the anode and the photoactive layer.

The substrate can be a solid, rigid or flexible layer designed to provide robustness to the device. In preferred embodiments, the substrate can be transparent or semi-transparent in the spectral region of interest. As used herein, a material is considered "transparent" when it has transmittance over 50%, and a material is considered "semi-transparent" when it has transmittance between about 50% and about 5%. The substrate can comprise any suitable material known in the art such as glass or a flexible plastic (polymer) film.

The first and second electrodes should have different work functions, with the electrode having the higher work function at or above about 4.5 eV (the "high work function electrode") serving as the hole-injecting electrode or anode, and the electrode having the lower work function at or below about 4.3 eV (the "low work function electrode") serving as the electron-injecting electrode. In a traditional OPV device structure, the high work function electrode or anode typically is composed of a transparent conducting metal oxide or metal sulfide such as indium tin oxide (ITO), gallium indium tin oxide (GITO), and zinc indium tin oxide (ZITO), or a thin, transparent layer of gold or silver. The low work function electrode or cathode typically is composed of a low work function metal such as aluminum, indium, calcium, barium, and magnesium. The electrodes can be deposited by thermal vapor deposition, electron beam evaporation, RF or Magnetron sputtering, chemical vapor deposition or the like.

In various embodiments, the solar cell can include one or more optional interface layers ("interlayers") between the anode and the photoactive layer and/or between the cathode and the photoactive layer. For example, in some embodiments, an optional smoothing layer (e.g., a film of 3,4-polyethylenedioxythiophene (PEDOT), or 3,4-polyethylenedioxythiophene:polystyrene-sulfonate (PEDOT:PSS)) can be present between the anode and the photoactive layer. The optional interlayer(s) can perform other functions such as reducing the energy barrier between the photoactive layer and the electrode, forming selective contacts for a single type of carrier (e.g., a hole-blocking layer), modifying the work function of the adjacent electrode, and/or protecting the underlying photoactive layer. In some embodiments, a transition metal oxide layer such as $V_2O_5$, $MoO_3$, $WO_3$ and NiO can be deposited on top of the ITO anode, instead of using PEDOT or PEDOT:PSS as the p-type buffer. To improve device stability via modification of the cathode, an n-type buffer composed of LiF, CsF or similar fluorides can be provided between the cathode and the photoactive layer. Other n-type buffer materials include $TiO_x$, $ZnO_x$ and Cs-doped $TiO_x$. Depending on the composition, the interlayers can be solution-processed (e.g., sol-gel deposition, self-assembled monolayers) or deposited by vacuum processes such as thermal evaporation or sputtering.

In certain embodiments, a solar cell according to the present teachings can include a transparent glass substrate onto which an electrode layer (anode) made of indium tin oxide (ITO) is applied. This electrode layer can have a relatively rough surface, and a smoothing layer made of a polymer, typically PEDOT:PSS made electrically conductive through doping, can be applied on top of the electrode layer to enhance its surface morphology. Other similar interlayers can be optionally present between the anode and the photoactive layer for improving mechanical, chemical, and/or electronic properties of the device. The photoactive layer is composed of an all-polymer blend as described above, and can have a layer thickness of, e.g., about 80 nm to a few μm. Before a counter electrode (cathode) is applied, an electrically insulating transition layer can be applied onto the photoactive layer. This transition layer can be made of an alkali halide, e.g., LiF, and can be vapor-deposited in vacuum. Again, similar to the anode, other similar interlayers can be optionally present between the photoactive layer and the cathode for improving mechanical, chemical, and/or electronic properties of the device.

In certain embodiments, a solar cell according to the present teachings can have an inverted device structure, where a modified ITO film is used as the cathode. For example, the ITO can be modified by n-type metal oxides or metal carbonates such as $TiO_x$, $ZnO_x$, Cs-doped $TiO_x$, and caesium carbonate. In particular embodiments, the inverted OPV can include a solution-processed $ZnO_x$ n-type interface layer as described in Lloyd et al., "Influence of the hole-transport layer on the initial behavior and lifetime of inverted organic photovoltaics," *Solar Energy Materials and Solar Cells*, 95 (5): 1382-1388 (2011). Compared with the traditional device structure, inverted-type devices can demonstrate better long-term ambient stability by avoiding the need for the corrosive and hygroscopic hole-transporting PEDOT:PSS and low work function metal cathode. The anode of an inverted OPV cell can be composed of Ag, Au, and the like, with an optional p-type interface layer composed of transition metal oxides such as $V_2O_5$, $MoO_3$, $WO_3$ and NiO.

Another aspect of the present teachings relates to methods of fabricating an organic light-emitting transistor or an organic light-emitting diode (OLED) that incorporates one or more semiconductor materials of the present teachings. For example, in an OLED, one or more compounds of the present teachings can be used as electron-transporting and/or emissive and/or hole-transporting materials. An OLED generally includes a substrate, a transparent anode (e.g., ITO), a cathode (e.g., metal), and one or more organic layers which can incorporate one or more compounds of the present teachings as hole-transporting (p-channel) and/or emissive and/or electron-transporting (n-channel) materials. In embodiments where the present compounds only have one or two of the properties of hole transport, electron transport, and emission, the present compounds can be blended with one or more further organic compounds having the remaining required property or properties.

In other embodiments, the article of manufacture can be an electronic or optoelectronic device (e.g., an organic light-emitting transistor) including a first electrode, a second electrode, and a semiconducting component in contact with the first electrode and the second electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., *PNAS*, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene)poly(styrenesulfonate) (PEDOT:PSS), polyaniline (PANI), polypyrrole (PPy)). One or more of the composites described herein can be embodied within various organic electronic, optical, and optoelectronic devices such as organic photovoltaics (OPV) and organic light-emitting transistors (OLETs) as described above.

The following examples are provided to illustrate further and to facilitate the understanding of the present teachings and are not in any way intended to limit the invention.

All reagents were purchased from commercial sources and used without further purification unless otherwise noted. Specifically, dioxane, dichlorobenzene (DCB), chloroform ($CHCl_3$), and other chlorinated hydrocarbons (CHCs) used for dielectric and semiconductor formulations were purchased from Sigma Aldrich and distilled before use. Anhydrous tetrahydrofuran (THF) was distilled from Na/benzophenone. Conventional Schlenk techniques were used and reactions were carried out under $N_2$ unless otherwise noted. 4,7-Bis(4-dodecyl-2-thienyl)-2,1,3-benzothiadiazole (Yue et al., *Macromolecules*, 42: 6510-6518 (2009)) and 4,7-bis(5-bromo-2-thienyl)-2,1,3-benzothiadiazole (Moule et al., *Chem. Mater*, 20: 4045-4050 (2008)) were prepared according to literature procedure.

Characterization data are provided in some cases by $^1$H-NMR, $^{13}$C-NMR, and/or elemental analysis. NMR spectra were recorded on an Inova 500 NMR spectrometer ($^1$H, 500 MHz). Elemental analyses were performed by Midwest Microlab, LLC. Polymer molecular weights were determined on a Waters GPC system (Waters Pump 510) in THF at room temperature versus polystyrene standards.

Example 1

Synthesis of Monomers

Example 1A

Preparation of 4,7-dibromo-5,6-difluorobenzo[1,2,5]thiadiazole

Step 1: 5,6-Difluorobenzo[1,2,5]thiadiazole

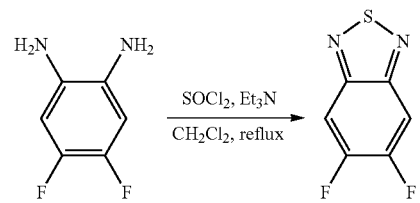 [SMILES: Nc1cc(F)c(F)cc1N ; Fc1cc2nsnc2cc1F]

To a solution of 4,5-difluorobenzene-1,2-diamine (2.0 g, 0.014 mol) and triethylamine (7.8 mL, 0.056 mol) in dichloromethane (80 mL) was added $SOCl_2$ (4.04 mL, 0.055 mol) dropwise at room temperature. The resulting reaction mixture was heated to reflux overnight. The reaction mixture was then allowed to cool to room temperature, and quenched with water carefully. The resulting mixture was extracted with dichloromethane, dried over $Na_2SO_4$ and concentrated on a rotary evaporator to give a white solid as the crude compound. The crude product was purified by flash column chromatography (silica gel, hexanes) to afford 5,6-difluorobenzo[1,2,5]thiadiazole as a white crystalline solid (1.4 g, 58% yield). $^1$H NMR ($CDCl_3$ 500 MHz): δ: 7.76 (t, 2H, J=8.5 Hz). $^{13}$C NMR ($CDCl_3$, 500 MHz): δ 154.94, 154.78, 152.86, 152.70, 150.89, 150.85, 150.81, 106.26, 106.21, 106.14, 106.09. Anal. calcd. for ($C_6H_2F_2N_2S$): C, 41.86; H, 1.17; N, 16.27. Found: C, 41.41; H, 1.22; H, 15.87. m.p: 64-65° C.

Step 2: 4,7-Dibromo-5,6-difluorobenzo[1,2,5]thiadiazole

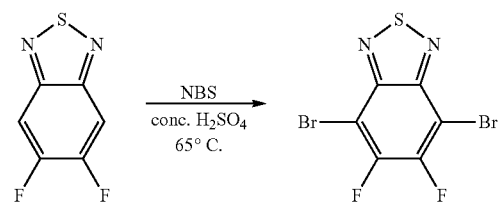 [SMILES: Fc1cc2nsnc2cc1F ; "NBS" ; Fc1c(F)c(Br)c2nsnc2c1Br]

To a solution of 5,6-difluorobenzo[1,2,5]thiadiazole (500 mg, 2.9 mmol) in concentrated $H_2SO_4$ (30 mL) was added NBS (2.07 g, 11.62 mmol) portionwise at room temperature. The resulting solution was heated to 55° C. for 2 h. The reaction mixture was then allowed to cool to room temperature, and then added to an ice-water mixture and filtered to give a white solid as the crude product. The crude product was purified by flash column chromatography (silica gel, chloroform) to afford 4,7-dibromo-5,6-difluorobenzo[1,2,5]thiadiazole as a white solid (0.35 g, 36% yield). $^1$H NMR ($CDCl_3$ 500 MHz): No peaks observed. $^{13}$C NMR (CDCl$_3$, 500 MHz): δ 152.95, 152.78, 150.87, 150.69, 148.88, 148.86, 99.49, 99.43, 99.37, 99.30, 99.20 Anal. calcd. for (C$_6$Br$_2$F$_2$N$_2$S): C, 21.84; H, 0.00; N, 8.49; Br, 48.43. Found: C, 22.01; H, 0.20; N, 8.26; Br, 48.69. m.p: 148-149° C.

Example 1B

Preparation of 4,7-bis-(5-bromo-thiophen-2-yl)-5,6-difluoro-benzo[1,2,5]thiadiazole Step 1: 5,6-Difluoro-4,7-di-thiophen-2-yl-benzo[1,2,5]thiadiazole

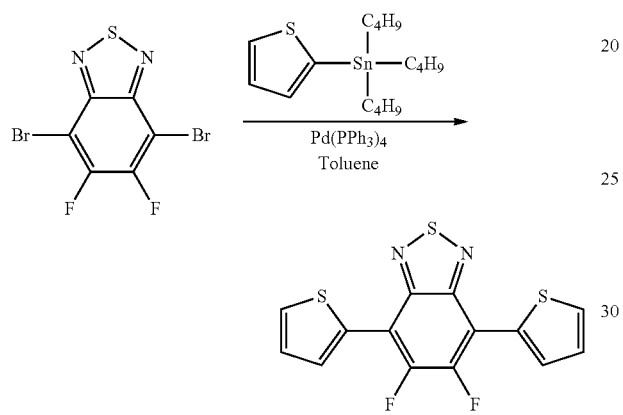

4,7-Dibromo-5,6-difluoro-benzo[1,2,5]thiadiazole (0.29 g, 1 mmol), tributyl-thiophen-2-yl-stannane (0.86 g, 2.3 mmol), and Pd(PPh$_3$)$_4$ (20 mg) were combined into a 50-mL Schlenk flask. The system was vacuumed and backfilled with argon for three cycles before 20 mL anhydrous toluene was added. The mixture was heated at 105° C. for 4 days. After the reaction was cooled down, the solvent was removed by rotary evaporation. The product was further purified by silica gel column with toluene/hexane (v/v, 1/2) as the eluent and recrystallization from a hexane/iso-propanol mixture. The final product (0.276 g, 93.0% yield) was obtained as red needle crystals after being dried in vacuo. $^1$H NMR (CDCl$_3$, 500 MHz): δ 8.33 (dxd, 2H, J=4.0 Hzx1.0 Hz), δ 7.66 (dxd, 2H, J=5.5 Hzx1.0 Hz), δ 7.30 (dxd, 2H, J=5.5 Hzx4.0 Hz)

Step 2: 4,7-Bis-(5-bromo-thiophen-2-yl)-5,6-difluoro-benzo[1,2,5]thiadiazole

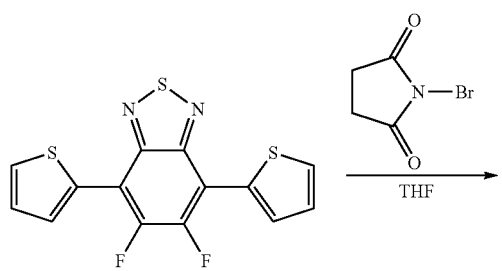

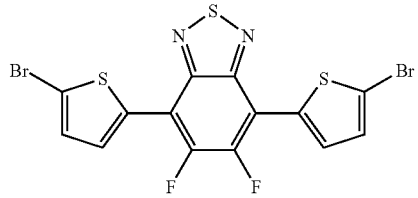

To a 100 mL Schlenk flask, 5,6-difluoro-4,7-di-thiophen-2-yl-benzo[1,2,5]thiadiazole (0.276 g, 0.820 mmol) was added. The system was flushed with argon for 5 minutes before 25 mL of anhydrous THF was added. NBS (0.292 g, 1.641 mmol) was added in portions in the absence of light and the resulting mixture was stirred at room temperature overnight. Dichloromethane (100 mL) was added and the organic layer was washed with brine 3 times before drying with anhydrous Na$_2$SO$_4$. The product (0.15 g, 36.5% yield) was obtained after removal of the solvent and recrystallization from a toluene/iso-propanol mixture. $^1$H NMR (CDCl$_3$, 500 MHz): δ 8.06 (d, 2H, J=4.0 Hz), δ 7.25 (d, 2H, J=4.0 Hz).

Example 1C

Preparation of 4,7-bis-(5-bromo-4-dodecyl-thiophen-2-yl)-5,6-difluoro-benzo[1,2,5]thiadiazole Step 1: 4,7-Bis-(4-dodecyl-thiophen-2-yl)-5,6-difluoro-benzo[1,2,5]thiadiazole

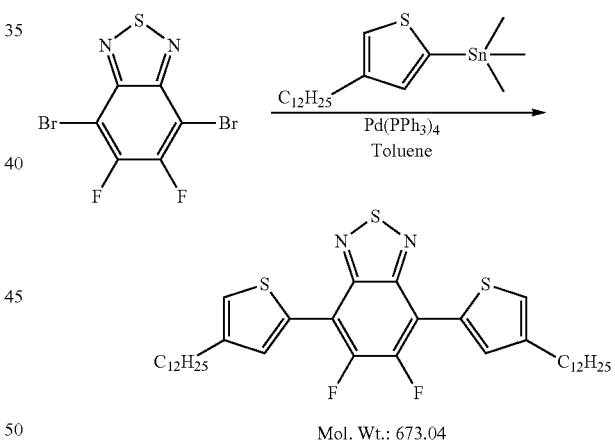

Mol. Wt.: 673.04

4,7-Dibromo-5,6-difluoro-benzo[1,2,5]thiadiazole (0.33 g, 1 mmol), (4-dodecyl-thiophen-2-yl)-trimethyl-stannane (1.04 g, 2.5 mmol), and Pd(PPh$_3$)$_4$ (20 mg) were combined in a 50-mL Schlenk flask. The system was vacuumed and backfilled with argon for three cycles before 20 mL of anhydrous toluene was added. The mixture was heated at 105° C. for 3 days. After the reaction was cooled down, the solvent was removed by rotary evaporation. The product was further purified by silica gel column with toluene/hexane (v/v, 1/4) as the eluent and recrystallization from a hexane/iso-propanol mixture. The final product (0.60 g, 89.5% yield) was obtained as red needle crystals after drying in vacuo. $^1$H NMR (CDCl$_3$, 500 MHz): δ 8.15 (d, 2H, J=1.0 Hz), δ 7.23 (d, 2H, J=1.0 Hz), δ 2.74 (t, 4H, J=7.5 Hz), δ 1.73 (m, 4H), δ 1.29 (m, 18H), δ 0.90 (t, 6H, 7.0 Hz). $^{13}$C NMR (CDCl$_3$, 500 MHz): δ 150.8, 148.9, 143.7, 132.3, 131.2, 124.0, 111.7, 31.97, 30.607 30.52, 29.74, 29.72, 29.70, 29.67, 29.53, 29.42, 29.39, 22.75, 14.19.

Step 2: 4,7-Bis-(5-bromo-4-dodecyl-thiophen-2-yl)-5,6-difluoro-benzo[1,2,5]thiadiazole

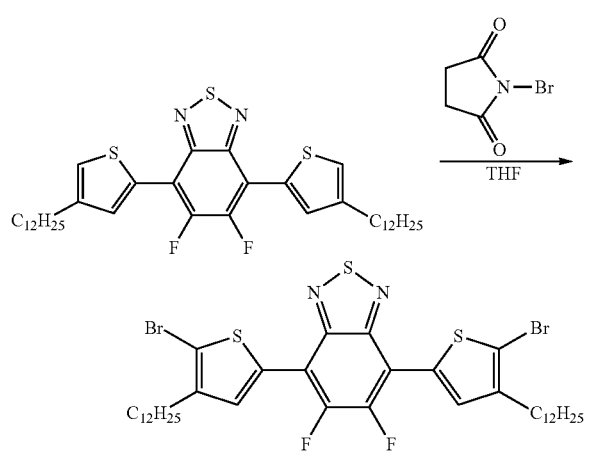

To a 100-mL Schlenk flask, 5,6-difluoro-4,7-di-thiophen-2-yl-benzo[1,2,5]thiadiazole (0.361 g, 0.536 mmol) was added. The system was flushed with argon for 5 minutes before 30 mL of anhydrous THF was added. NBS (0.196 g, 1.18 mmol) was added in portions in the absence of light and the resulting mixture was stirred at room temperature overnight. Dichloromethance (100 mL) was added and the organic layer was washed with brine 3 times before drying with anhydrous $Na_2SO_4$. The product (0.15 g, 36.5% yield) was further purified by silica gel column with hexane as the eluent and the final product (0.30 g, 67.4% yield) was obtained after removal of the solvent and recrystallization from a toluene/iso-propanol mixture. $^1$H NMR ($CDCl_3$, 500 MHz): δ 7.99 (s, 2H), δ 2.69 (t, 4H, J=7.5 Hz), δ 1.69 (m, 4H), δ 1.28 (m, 18H), δ 0.90 (t, 6H, 7.0 Hz).

Example 1D

Preparation of 4,7-dibromo-5-fluoro-benzo[1,2,5]thiadiazole

Step 1: 5-Fluoro-benzo[1,2,5]thiadiazole

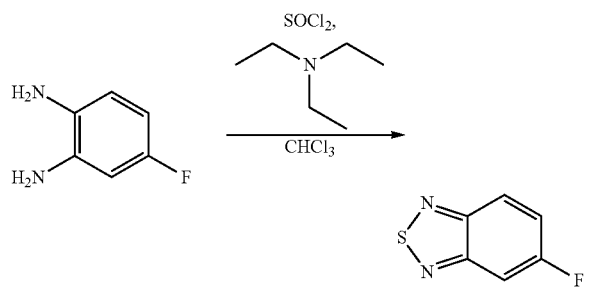

4-Fluoro-benzene-1,2-diamine (2.5 g, 19.8 mmol) was added into a 50-mL Schlenk flask. The system was flushed with argon before 200 mL of chloroform was added and followed by addition of triethylamine (11.05 mL, 79.3 mmol). A clear solution was observed after stirring at room temperature for 10 minutes. Thionyl chloride (5.18 g, 43.6 mmol) was added dropwise. The mixture was heated to reflux for 5 hours before being cooled down to room temperature. The organic layer was washed with brine (100 mL) and further dried over anhydrous $MgSO_4$. After removal of the solvent, the product was purified by silica gel column with hexane/dichloromethane (v/v, 1/2) as the eluent. Removal of the solvent offered a colorless oil (1.35 g, 44.3% yield) after being dried in vacuo. $^1$H NMR ($CDCl_3$, 500 MHz): δ7.93 (d×d, 1H, J=9.0 Hz×5.0 Hz), δ 7.56 (d×d, 1H, J=9 Hz×2.5 Hz), δ 7.38 (m, 1H).

Step 2: 4,7-Dibromo-5-fluoro-benzo[1,2,5]thiadiazole

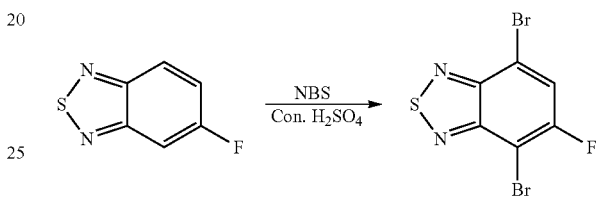

5-Fluoro-benzo[1,2,5]thiadiazole (1.35 g, 8.75 mmol) was added into a 50-mL Schlenk flask. The system was flushed with argon before 60 mL of concentrated $H_2SO_4$ was added and a clear solution was observed. NBS (6.23 g, 35.0 mmol) was added in portions in the absence of light. The mixture was heated to 65° C. for 2 hours. The reaction was terminated by pouring the mixture into crashed ice. The product was extracted by ethyl acetate and washed with saturated $NaHSO_3$ and then purified by silica gel column with hexane/dichlormethane (v/v, 2/3) as the eluent. Recrystallization from a hexane/iso-propanol mixture offered 0.82 g of white needle crystals as the final product (29.7% yield). $^{13}$C NMR ($CDCl_3$, 500 MHz): δ 161.16, 159.13, 152.80, 150.34, 123.80, 114.07, 98.33.

Example 1E

Preparation of 4,7-bis-(5-bromo-4-dodecyl-thiophen-2-yl)-5-fluoro-benzo[1,2,5]thiadiazole Step 1: 4,7-Bis-(4-dodecyl-thiophen-2-yl)-5-fluoro-benzo[1,2,5]thiadiazole

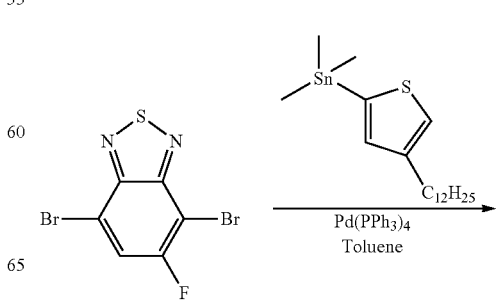

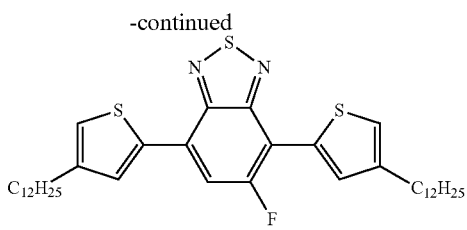

4,7-Dibromo-5-fluoro-benzo[1,2,5]thiadiazole (0.82 g, 2.63 mmol), (4-dodecyl-thiophen-2-yl)-trimethyl-stannane (2.72 g, 6.57 mmol), and Pd(PPh₃)₄ (50 mg) were combined into a 100-mL Schlenk flask. The system was vacuumed and backfilled with argon for three cycles before 50 mL of anhydrous toluene was added. The mixture was heated at 105° C. for 3 days. After the reaction was cooled down, the solvent was removed by rotary evaporation. The product was further purified by silica gel column with dichloromethane/hexane (v/v, 1/4) as the eluent. Removal of the solvent offered the final product (0.81 g, 47.0% yield) as a red powder after being dried in vacuo. ¹H NMR (CDCl₃, 500 MHz): δ 8.03 (d, 1H, J=1.0 Hz), δ 7.92 (d, 1H, J=1.0 Hz), δ 7.67 (d, 1H, J=15.0 Hz), δ 7.08 (d, 1H, J=1.0 Hz), δ 7.02 (d, 1H, J=1.0 Hz), δ 2.63 (m, 4H), δ 1.63 (m, 4H), δ 1.26 (m, 18H), δ 0.81 (t, 6H, 7.0 Hz).

Step 2: 4,7-Bis-(5-bromo-4-dodecyl-thiophen-2-yl)-5-fluoro-benzo[1,2,5]thiadiazole

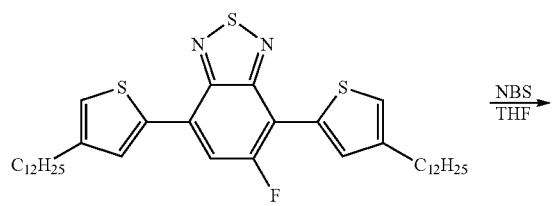

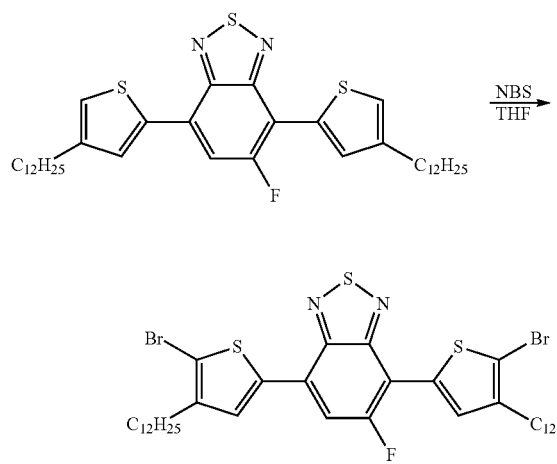

To a 100-mL Schlenk flask, 4,7-bis-(4-dodecyl-thiophen-2-yl)-5-fluoro-benzo[1,2,5]thiadiazole (0.81 g, 0.536 mmol) was added. The system was flushed with argon for 5 minutes before 40 mL of anhydrous THF was added. NBS (0.451 g, 2.53 mmol) was added in portions in the absence of light and the resulting mixture was stirred at room temperature overnight. After removal of the solvent, the product was further purified by silica gel column with hexane as the eluent. The final product (0.87 g, 87.0% yield) was obtained as red needles after removal of the solvent and recrystallization from a dichloromethane/ethanol mixture. ¹H NMR (CDCl₃, 500 MHz): δ 7.99 (s, 1H), δ 7.79 (s, 1H), δ 7.69 (d, 1H, J=12.5 Hz), δ 2.67 (m, 4H), δ 1.69 (m, 4H), δ 1.28 (m, 18H), δ 0.90 (m, 6H).

Example 1F

Preparation of 4,7-dibromo-5-chloro-2,1,3-benzothiadiazole

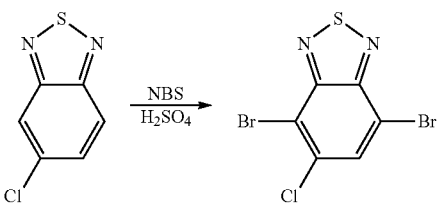

5-Chloro-2,1,3-benzothiadiazole (0.50 g, 2.93 mmol) was dissolved in concentrated sulfuric acid (15 mL). N-bromosuccinimide (1.56 g, 8.79 mmol) was added. The reaction mixture was stirred at room temperature for 18 hours and then heated to 50° C. for 1 hour. The reaction was cooled to room temperature and poured into ice water (100 mL). The mixture was extracted with chloroform, and the organic layer was separated and dried over MgSO₄. The solvent was removed and the residue was purified by chromatography (chloroform) to yield 4,7-dibromo-5-chloro-2,1,3-benzothiadiazole (658 mg, 68%). ¹H NMR (CDCl₃, 500 MHz) δ: 7.95 (s, 1H).

Example 1G

Preparation of 4,7-bis(5-bromo-2-thienyl)-5-chloro-2,1,3-benzothiadiazole

Step 1: 4,7-Bis(2-thienyl)-5-chloro-2,1,3-benzothiadiazole

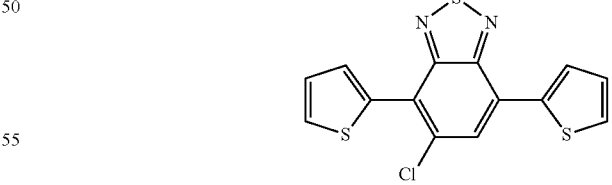

4,7-Dibromo-5-chloro-2,1,3-benzothiadiazole (300 mg, 0.193 mmol), 2-(tributylstannyl)thiophene (852 mg, 2.28 mmol), Pd₂dba₃ (10.5 mg, 0.0114 mmol), and P(o-tol)₃ (27.8 mg, 0.0913 mmol) were placed in a Schlenk flask. The flask was degassed and backfilled with argon three times. Dry toluene (30 mL) was added and the reaction was heated to 130° C. for 18 hr. The reaction was cooled to room temperature and the solvent was removed. The residue was purified by chromatography (1/5, CH₂Cl₂/hexanes) to afford 4,7-bis(2- thienyl)-2,1,3-benzothiadiazole (107 mg, 35%). $^1$H NMR (CDCl$_3$, 500 MHz) δ: 8.14 (dd, J=3.7, 1.1 Hz, 1H), 7.98 (s, 1H), 7.77 (dd, J=3.7, 1.1 Hz, 1H), 7.61 (dd, J=5.1, 1.2 Hz, 1H), 7.52 (dd, J=5.1, 1.1 Hz, 1H), 7.25 (m, 2H).

Step 2: 4,7-Bis(5-bromo-2-thienyl)-5-chloro-2,1,3-benzothiadiazole

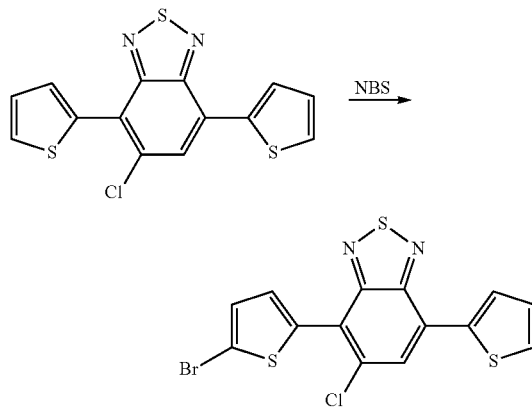

4,7-Bis(2-thienyl)-5-chloro-2,1,3-benzothiadiazole (104 mg, 0.311 mmol) was dissolved in chloroform (50 mL). Acetic acid (20 mL) and N-bromosuccinimide (110.6 mg, 0.621 mmol) were added. The reaction mixture was stirred at room temperature overnight. The solvent was removed and the residue was washed with water, then dried. The crude product was dissolved in chloroform and passed through a short silica gel column. The solvent was removed and the residue was crystallized from chloroform/ethanol to afford 4,7-bis(5-bromo-2-thienyl)-5-chloro-2,1,3-benzothiadiazole (110 mg, 72%). $^1$H NMR (CDCl$_3$, 500 MHz) δ: 7.88 (s, 1H), 7.82 (d, J=4.0 Hz, 1H), 7.64 (d, J=4.0 Hz, 1H), 7.20 (d, J=4.0 Hz, 1H), 7.18 (d, J=4.0 Hz, 1H).

Example 1H

Preparation of 4,7-bis(5-bromo-4-dodecyl-2-thienyl)-5-chloro-2,1,3-benzothiadiazole Step 1: 4,7-Bis(4-dodecyl-2-thienyl)-5-chloro-2,1,3-benzothiadiazole

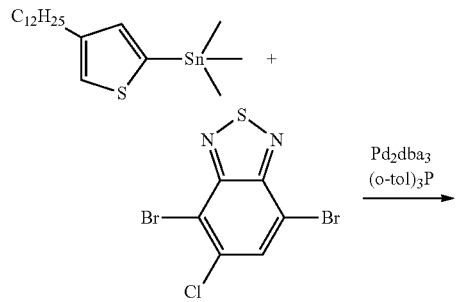

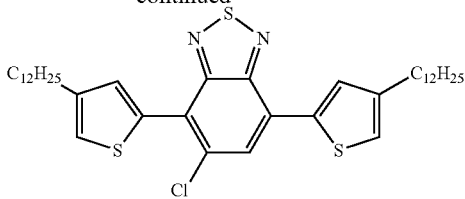

4,7-Dibromo-5-chloro-2,1,3-benzothiadiazole (300 mg, 0.193 mmol), 2-(trimethylstannyl)-4-dodecyl-thiophene (1.14 g, 2.74 mmol), Pd$_2$dba$_3$ (12.5 mg, 0.0137 mmol), and P(o-tol)$_3$ (33.37 mg, 0.110 mmol) were placed in a Schlenk flask. The flask was degassed and backfilled with argon three times. Dry toluene (30 mL) was added and the reaction was heated to 130° C. for 18 hr. The reaction was cooled to room temperature and the solvent was removed. The residue was purified by chromatography (1/10, CH$_2$Cl$_2$/hexanes) to afford 4,7-bis(4-dodecyl-2-thienyl)-2,1,3-benzothiadiazole (107 mg, 17%). $^1$H NMR (CDCl$_3$, 500 MHz) δ: 7.98 (d, J=1.2 Hz, 1H), 7.93 (s, 1H), 7.60 (d, J=1.3 Hz, 1H), 7.18 (s, 1H), 7.10 (s, 1H), 2.70 (q, J=7.9, 4H), 1.70 (m, 4H), 1.34 (m, 36H), 0.88 (t, J=7.9, 6H).

Step 2: 4,7-Bis(5-bromo-4-dodecyl-2-thienyl)-5-chloro-2,1,3-benzothiadiazole

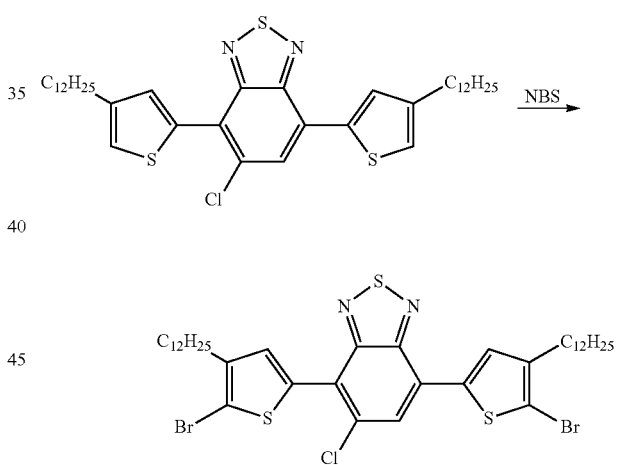

4,7-Bis(4-dodecyl-2-thienyl)-5-chloro-2,1,3-benzothiadiazole (105.5 mg, 0.157 mmol) was dissolved in chloroform (50 mL). Acetic acid (50 mL) and N-bromosuccinimide (55.9 mg, 0.314 mmol) were added. The reaction mixture was stirred at room temperature overnight. Water (100 mL) was added and the mixture was extracted with chloroform. The organic layer was separated, washed with 10% NaOH aqueous solution then water, and dried over MgSO$_4$. The solvent was removed under vacuum, and the residue was purified by chromatography using 1:20 dichloromethane/hexanes as the eluent to afford 4,7-bis(5-bromo-4-dodecyl-2-thienyl)-5-chloro-2,1,3-benzothiadiazole (102 mg, 78%). $^1$H NMR (CDCl$_3$, 500 MHz) δ: 7.85 (s, 1H), 7.76 (s, 1H), 7.26 (s, 1H), 2.65 (q, J=7.9, 4H), 1.66 (m, 4H), 1.34 (m, 36H), 0.87 (t, J=7.9, 6H).

Example 1I

Preparation of 4,7-dibromo-5,6-dichlorobenzo[1,2,5]thiadiazole

Step 1: 5,6-Dichlorobenzo[1,2,5]thiadiazole

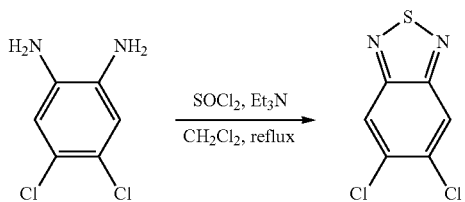 [SMILES: Nc1cc(Cl)c(Cl)cc1N ; Clc1cc2nsnc2cc1Cl]

To a solution of 4,5-dichlorobenzene-1,2-diamine (3.0 g, 0.017 mol) and triethylamine (9.45 mL, 0.068 mol) in dichloromethane (120 mL) was added SOCl$_2$ (4.92 mL, 0.068 mol) dropwise at room temperature. The resulting reaction mixture was heated to reflux for 20 h. The reaction mixture was then allowed to cool to room temperature, and quenched with water carefully. The resulting mixture was extracted with dichloromethane, dried over Na$_2$SO$_4$ and concentrated on a rotary evaporator to give a dark solid as the crude compound. The crude compound was purified by flash column chromatography (silica gel, CHCl$_3$) to afford 5,6-dichlorobenzo[1,2,5]thiadiazole as an off-white crystalline solid (2.35 g, 68% yield). $^1$H NMR (CDCl$_3$ 500 MHz): δ: 8.19 (t, 2H, J=8.5 Hz). $^{13}$C NMR (CDCl$_3$, 500 MHz): δ 153.07, 135.28, 121.51. Anal. calcd. for (C$_6$H$_2$Cl$_2$N$_2$S): C, 35.14; H, 0.98; N, 13.66. Found: C, 35.08; H, 1.01; H, 13.56. m.p: 108-110° C.

Step 2: 4,7-Dibromo-5,6-dichlorobenzo[1,2,5]thiadiazole

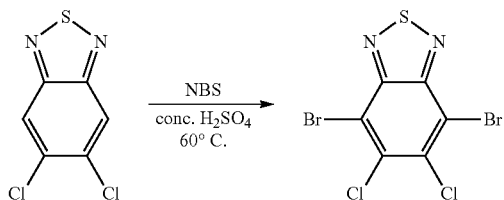 [SMILES: Clc1cc2nsnc2cc1Cl ; "NBS" ; "conc. H2SO460° C." ; Clc1c(Cl)c(Br)c2nsnc2c1Br]

To a solution of 5,6-dichlorobenzo[1,2,5]thiadiazole (1.0 g, 4.88 mmol) in concentrated H$_2$SO$_4$ (60 mL) was added NBS (3.47 g, 19.5 mmol) portionwise at room temperature. The resulting solution was heated to 60° C. for 7 h. The reaction mixture was then allowed to cool to room temperature, and then added to an ice-water mixture and filtered to give a white solid as the crude product. The crude product was purified by flash column chromatography (silica gel, chloroform) to afford 4,7-dibromo-5,6-chlorobenzo[1,2,5]thiadiazole as a white solid (0.95 g, 54% yield). $^1$H NMR (CDCl$_3$ 500 MHz): No peaks observed. $^{13}$C NMR (CDCl$_3$, 500 MHz): δ 151.29, 136.39, 114.94. Anal. calcd. for (C$_6$Br$_2$Cl$_2$N$_2$S): C, 19.86; H, 0.00; N, 7.72. Found: C, 20.33; H, 0.20; N, 7.67. m.p: 190-191° C.

Example 1J

Preparation of 4,7-bis-(5-bromo-4-dodecyl-thiophen-2-yl)-5,6-dichloro-benzo[1,2,5]thiadiazole Step 1: 4-(4-Dodecyl-thiophen-2-yl)-5,6-dichloro-7-bromo-benzo[1,2,5]thiadiazole

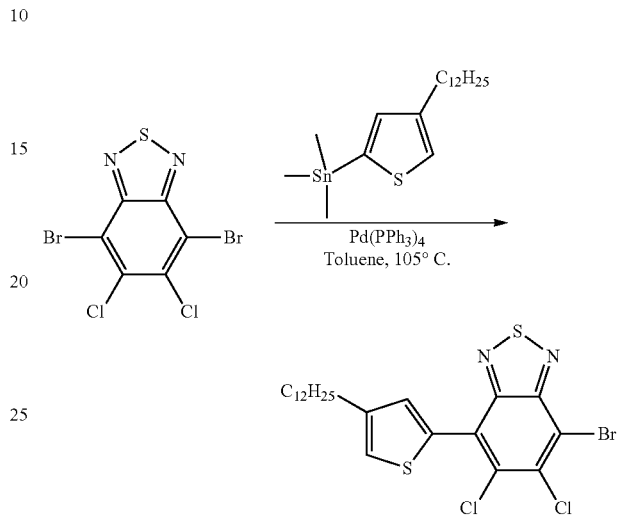

4,7-Dibromo-5,6-dichloro-benzo[1,2,5]thiadiazole (0.86 g, 2.37 mmol), (4-dodecyl-thiophen-2-yl)-trimethyl-stannane (2.26 g, 5.45 mmol), and Pd(PPh$_3$)$_4$ (54.8 mg) were placed in a 100 mL Schlenk flask. The system was subjected to three quick vacuum-nitrogen cycles and 40 mL anhydrous toluene was added. The mixture was heated at 105° C. for 2 days. After 2 days, 1.2 g more of (4-dodecyl-thiophen-2-yl)-trimethyl-stannane and 50 mg more of Pd(PPh$_3$)$_4$ were added, and the reaction mixture was stirred at 105° C. for another 2 days. After the reaction was cooled down, the solvent was removed by rotary evaporation. The product was purified by silica gel column with chloroform/hexane (v/v, 1/1) as the eluent. The final product (530 mg, yield 42%) was obtained as a yellow solid after being dried in vacuo. The compound was used directly in the next step without any further purification and characterization. $^1$H NMR (CDCl$_3$, 500 MHz): δ 7.47 (d, 1H, J=1.0 Hz), 7.22 (d, 1H, J=1.0 Hz), 2.71 (t, 2H, J=8.0 Hz), 1.70 (m, 2H), 1.26 (m, 18H), 0.89 (t, 3H, 7.0 Hz).

Step 2: 4,7-Bis-(4-dodecyl-thiophen-2-yl)-5,6-dichloro-benzo[1,2,5]thiadiazole

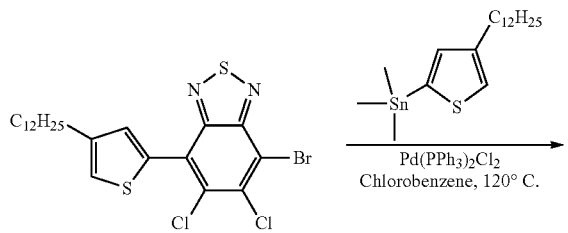

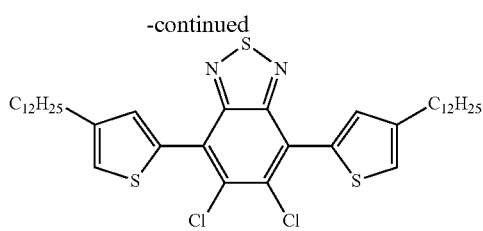

4-(4-Dodecyl-thiophen-2-yl)-5,6-dichloro-7-bromo-benzo[1,2,5]thiadiazole (0.530 g, 0.99 mmol), (4-dodecyl-thiophen-2-yl)-trimethyl-stannane (0.577 g, 1.39 mmol), and Pd(PPh$_3$)$_2$Cl$_2$ (34.8 mg) were placed in a 100-mL Schlenk flask. The system was subjected to three quick vacuum-nitrogen cycles and 40 mL of anhydrous chlorobenzene was added. The mixture was heated at 120° C. for 17 hours. After the reaction was cooled down, the solvent was removed by rotary evaporation. The product was purified by silica gel column with chloroform/hexane (v/v, 1/1) as the eluent. The final product (650 mg, 92.8% yield) was obtained as an orange solid after being dried in vacuo. $^1$H NMR (CDCl$_3$, 500 MHz): δ 7.49 (d, 2H, J=1.0 Hz), 7.22 (d, 2H, J=1.0 Hz), 2.72 (t, 4H, J=8.0 Hz), 1.71 (m, 4H), 1.27 (m, 36H), 0.89 (t, 6H, 7.0 Hz). $^{13}$C NMR (CDCl$_3$, 500 MHz): δ 152.71, 143.12, 134.32, 134.23, 132.64, 126.42, 123.09, 31.97, 30.53, 30.46, 29.74, 29.72, 29.70, 29.67, 29.54, 29.42, 22.75, 14.19. Anal. calcd. for (C$_{38}$H$_{54}$Cl$_2$N$_2$S$_3$): C, 64.65; H, 7.71; N, 3.97. Found: C, 64.72; H, 7.65; N, 3.98. m.p: 79-80° C.

Step 3: 4,7-Bis-(5-bromo-4-dodecyl-thiophen-2-yl)-5,6-dichloro-benzo[1,2,5]thiadiazole

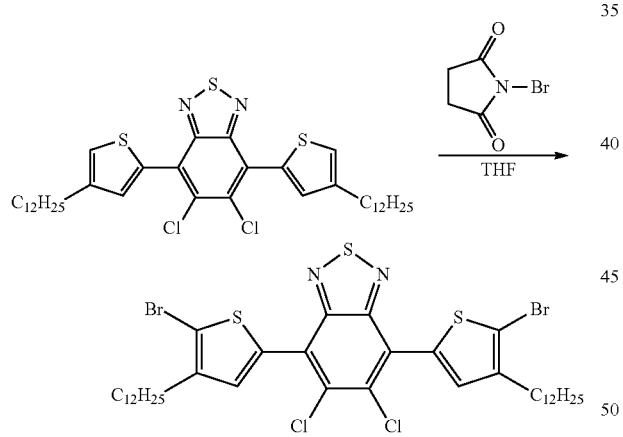

To a solution of 4,7-bis-(4-dodecyl-thiophen-2-yl)-5,6-dichloro-benzo[1,2,5]thiadiazole (200 mg, 0.283 mmol) in anhydrous THF (20 mL) was added NBS (111 mg, 0.623 mmol) in one portion under nitrogen, and the resulting mixture was stirred at room temperature overnight. Then, 100 mL of dichloromethane was added and the organic layer was washed with brine 3 times, dried with anhydrous Na$_2$SO$_4$, and concentrated on a rotary evaporator to give a red oil as the crude product. The crude product was purified by silica gel column with dichloromethane/hexane (v/v, 1/100) as the eluent to afford 4,7-bis-(5-bromo-4-dodecyl-thiophen-2-yl)-5,6-dichloro-benzo[1,2,5]thiadiazole as an orange solid (70 mg, 28.6% yield). $^1$H NMR (CDCl$_3$, 500 MHz): δ 7.47 (s, 2H), 2.67 (t, 4H, J=7.5 Hz), 1.67 (m, 4H), 1.27 (m, 36H), 0.89 (t, 6H, 7.0 Hz). $^{13}$C NMR (CDCl$_3$, 500 MHz): δ 152.26, 141.99, 134.10, 134.02, 132.75, 125.50, 113.17, 31.97, 31.64, 29.73, 29.70, 29.64, 29.61, 29.47, 29.41, 29.28, 29.10, 22.71, 14.18. m.p.: 60-61° C.

Example 1K

Preparation of 5-cyano-2,1,3-benzothiadiazole

Step 1: 5-Bromo-2,1,3-benzothiadiazole

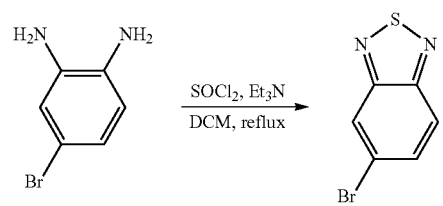 [SMILES: Nc1ccc(Br)cc1N ; Brc1ccc2nsnc2c1]

To a solution of 4-bromobenzene-1,2-diamine (5.236 g, 28.0 mmol) and Hunig's base (19.5 mL, 112 mmol) in dichloromethane (160 mL) was added SOCl$_2$ (4.08 mL, 56 mmol) dropwise at room temperature. The resulting reaction mixture was heated to reflux overnight. The reaction mixture was then allowed to cool to room temperature, and quenched with 10% HCl until pH=2. The resulting mixture was extracted with dichloromethane (200 mL×4), dried over Na$_2$SO$_4$ and concentrated. The crude compound was purified by flash column chromatography (silica gel, chloroform) to afford 5-bromobenzo[1,2,5]thiadiazole as a brown solid which was used directly in the next step. $^1$H NMR (CDCl$_3$ 500 MHz): δ: 8.21 (d, 1H, J=1.5 Hz), 7.87 (d, 1H, J=8.5 Hz), 7.69 (dd, 1H, J=8.5, 1.5 Hz).

Step 2: 5-Cyano-2,1,3-benzothiadiazole

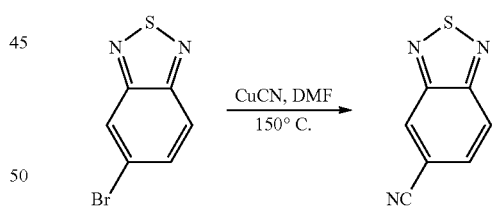

5-Bromobenzo[1,2,5]thiadiazole from Step 1 was dissolved in anhydrous DMF (160 mL) under nitrogen. Then, CuCN (7.27 g, 81 mmol) was added and the mixture was heated to 150° C. overnight. After cooling down, a solution of FeCl$_3$ (19.7 g) in concentrated HCl (7 mL) and water (40 mL) was added dropwise and the mixture was stirred at 70° C. for 30 minutes. After extraction with DCM (200 ml×2), the combined organic phases were extracted with HCl (6M, 100 mL×3), water (100 mL), and brine (100 mL), and dried over MgSO$_4$. Concentration gave a brown solid which was purified by column chromatography with DCM as the eluent. Finally, a white solid was obtained (2.95 g, 65% yield for two steps). $^1$H NMR (CDCl$_3$ 500 MHz): δ: 8.48 (d, 1H, J=1.5 Hz), 8.16 (d, 1H, J=9.0 Hz), 7.75 (dd, 1H, J=9.0, 1.5 Hz).

Example 1L
Preparation of 2,6-bis(trimethylstannyl)-benzo[1,2-b:4,5-b']dithiophene-4,8-(5-(2-hexyldecyl)-2-thiophenecarboxylic acid)ester
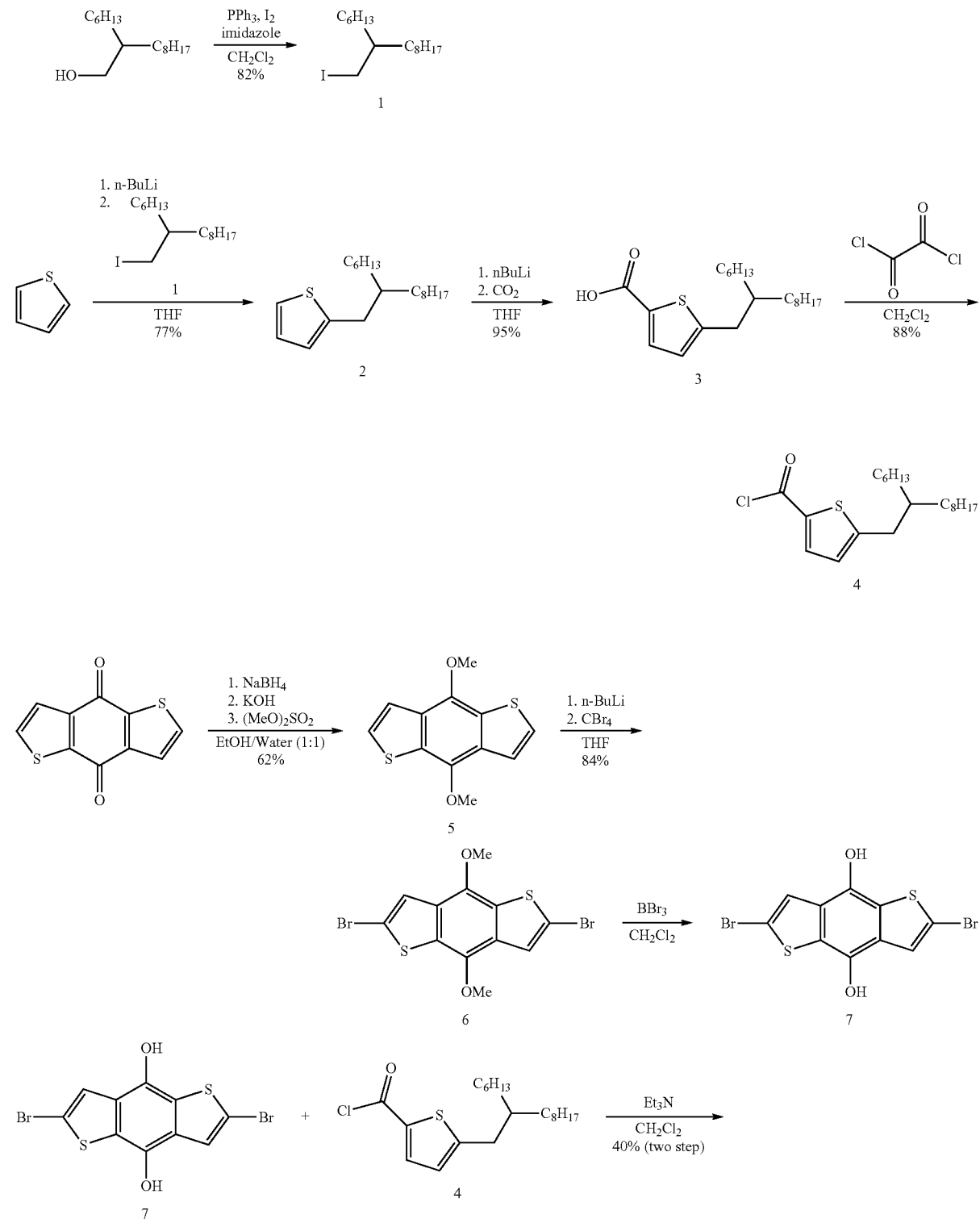

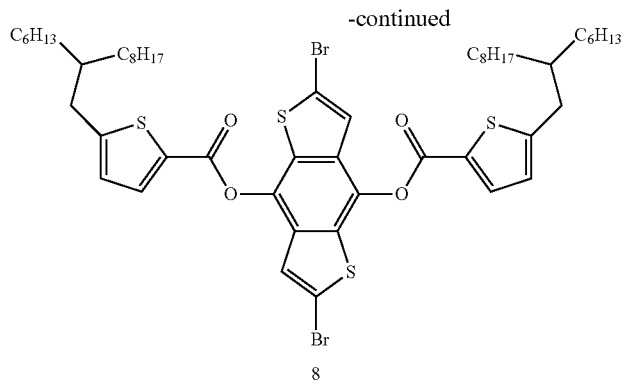

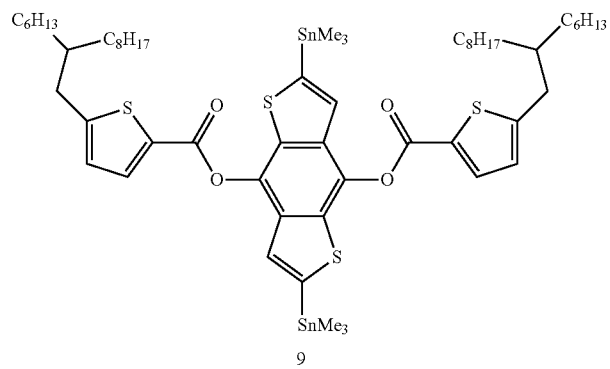

1-Iodo-2-hexyldecane (1)

Under air, triphenylphosphine (107.44 g, 410 mmol, 1.19 equiv.) and imidazole (28.9 g, 424 mmol, 1.23 equiv.) were dissolved in dichloromethane (800 mL). 2-Hexyl-1-decanol (100 mL, 345 mmol., 1.00 equiv.) was added to the solution, and the reaction mixture was cooled to 0° C. Iodine (103.6 g, 408 mmol., 1.18 equiv.) was added portion-wise over 1 hour, after which the suspension was stirred at 0° C. for an additional hour, and then at ambient temperature for 18 hours. The mixture was quenched with saturated aqueous $Na_2SO_3$ (150 mL), and DCM was removed in vacuo. Hexane (200 mL) was added to the residue, and the mixture was filtered to remove salts that had precipitated. The organic material was extracted with hexanes (3×300 mL), dried over $Na_2SO_4$, filtered through a pad of silica gel, and then concentrated in vacuo to give a clear, colorless oil (97.8 g, 82% yield). $^1$H NMR (500 MHz, $CDCl_3$) δ 3.28 (d, J=4.6 Hz, 2H), 1.34-1.19 (m, 24H), 1.12 (b, 1H), 0.91-0.87 (m, 6H).

2-(2-Hexyldecyl)thiophene (2)

A solution of thiophene (46.4 g, 551 mmol., 2.50 equiv.) and THF (300 mL) was cooled to −78° C. n-Butyllithium (2.5 M in hexanes, 212 mL, 528 mmol., 2.40 equiv.) was added over 1 hour. The mixture was stirred for an additional 30 minutes at −78° C. before a solution of 1-iodo-2-hexyldecane (90.0 g, 220 mmol., 1.00 equiv) in THF (200 mL) was added slowly over 1 hour. After stirring for 1 hour at −78° C., the reaction mixture was warmed to ambient temperature and stirred for 18 hours. Water (200 mL) was added and the organic material was extracted with $Et_2O$ (3×250 mL), washed with additional water, dried over $Na_2SO_4$, filtered, and concentrated in vacuo. The resulting brown residue was purified by silica gel column chromatography (hexanes) to give a pale yellow oil (52.03 g, 77% yield). $^1$H NMR (500 MHz, $CDCl_3$) δ 7.12 (dd, J=5.2, 1.2 Hz, 1H), 6.92 (m, 1H), 6.76 (dd, J=3.4, 0.9 Hz, 1H), 2.76 (d, J=6.7, 2H), 1.62 (b, 1H), 1.33-1.21 (m, 24H), 0.91-0.87 (m, 6H).

5-(2-Hexyldecyl)-2-thiophenecarboxylic acid (3)

2-(2-Hexyldecyl)thiophene (1.00 g, 3.24 mmol., 1.00 equiv.) and THF (24 mL) were added to a 50 mL schlenk flask. The solution was cooled to 0° C. n-Butyllithium (2.5 M in hexanes, 1.36 mL, 1.05 equiv.) was then added over 2 minutes. The solution was stirred for 1 hour at 0° C., then the ice/water bath was removed and the solution was stirred for 20 minutes at ambient. The solution was cooled back to 0° C. and carbon dioxide (obtained by subliming dry ice submerged in THF in a separate flask placed in a 25° C. heat bath) was bubbled through the solution for 30 minutes. The solution was diluted with 1 N hydrochloric acid (50 mL) and EtOAc (50 mL). The organic layer was washed with brine, dried with $MgSO_4$, and concentrated. Purification by silica gel column chromatography (4:1 hexanes—EtOAc, 2% AcOH) gave a colorless liquid (1.086 g, 95% yield). $^1$H NMR (500 MHz, $CDCl_3$) δ 7.74 (d, J=3.8 Hz, 1H), 6.80 (d, J=3.8 Hz, 1H), 2.79 (d, J=6.8, 2H), 1.67 (b, 1H), 1.34-1.21 (m, 24H), 0.91-0.87 (m, 6H).

5-(2-Hexyldecyl)-2-thiophenecarbonyl chloride (4)

5-(2-Hexyldecyl)-2-thiophenecarboxylic acid (1.00 g, 2.84 mmol., 1.00 equiv.) and $CH_2Cl_2$ (5 mL) were added to a 10 mL schlenk flask. The solution was cooled to 0° C. Oxalyl chloride (0.60 mL, 6.5 mmol, 2.3 equiv.) was then added. The ice/water bath was left in place and the solution was stirred for 64 hours while warming to room temperature. The reaction mixture was concentrated to a clear brown liquid (931 mg, 88% yield). $^1$H NMR (400 MHz, $CDCl_3$) δ 7.84 (d, J=3.9 Hz, 1H), 6.87 (d, J=3.8 Hz, 1H), 2.81 (d, J=6.7, 2H), 1.68 (b, 1H), 1.34-1.19 (m, 24H), 0.93-0.85 (m, 6H).

4,8-Dimethoxy-benzo[1,2-b:4,5-b']dithiophene (5)

Benzo[1,2-b:4,5-b']dithiophene-4,8-dione (7.50 g, 34.0 mmol., 1.00 equiv.), ethanol (45 mL) and water (45 mL) were added to a 250 mL 2-neck round-bottom flask fitted with a reflux condenser. NaBH$_4$ (3.89 g, 102 mmol., 3.00 equiv.) was then added portion-wise cautiously. The reaction mixture was heated to reflux for 1 hour. The flask was removed from the heat bath and potassium hydroxide (4.39 g, 78.2 mmol., 2.30 equiv.) was added slowly to the reaction mixture with vigorous stirring. The suspension was stirred at reflux for 30 minutes before adding dimethyl sulfate (16 mL, 170 mmol., 5.0 equiv.), and the suspension was refluxed for 64 hours. The reaction mixture was cooled to room temperature and diluted with water (75 mL) and diethyl ether (500 mL) and more water (300 mL). The organic layer was washed with brine (200 mL), dried with MgSO$_4$ and concentrated. The crude material was purified by silica gel column chromatography (solid loading, gradient of 1:1 to 1:2 hexanes-dichloromethane) to give a white solid (5.314 g, 62% yield). $^1$H NMR (400 MHz, CDCl$_3$) δ 7.52 (d, J=5.5 Hz, 2H), 7.41 (d, J=5.5 Hz, 2H), 2.81 (d, J=6.7, 2H), 4.15 (s, 6H).

2,6-Dibromo-4,8-dimethoxy-benzo[1,2-b:4,5-b']dithiophene (6)

4,8-Dimethoxy-benzo[1,2-b:4,5-b']dithiophene (1.00 g, 3.99 mmol., 1.00 equiv.) and THF (44 mL) were added to a 100 mL schlenk flask and the mixture was cooled to −78° C. n-Butyllithium (2.5 M in hexanes, 3.5 mL, 8.8 mmol., 2.2 equiv.) was then added and the mixture was stirred at −78° C. for 15 minutes before removing the dry ice/acetone bath and stirring at ambient for 30 minutes. The suspension was cooled to −78° C. and carbon tetrabromide (3.18 g, 9.59 mmol., 2.40 equiv.) was added. The dry ice/acetone bath was removed and the mixture was stirred at ambient for 1 hour. Water and dichloromethane were added (brine was also added to break emulsion) and the aqueous layer was extracted with dichloromethane. The organic layer was washed with brine, dried with MgSO$_4$ and concentrated. The crude material was purified by silica gel column chromatography (solid loading, 1:1 dichloromethane-hexane) and trituration in hexanes to give a beige crystalline solid (1.368 g, 84% yield). $^1$H NMR (400 MHz, CDCl$_3$) δ 7.48 (s, 2H), 4.07 (s, 6H).

2,6-Dibromo-benzo[1,2-b:4,5-b']dithiophene-4,8-diol (7)
2,6-Dibromo-4,8-dimethoxy-benzo[1,2-b:4,5-b']dithiophene (500 mg, 1.22 mmol., 1.00 equiv.) and dichloromethane (12 mL) were added to a 50 mL schlenk flask. The mixture was cooled to −78° C. and boron tribromide was added (1.0 M solution in dichloromethane, 2.5 mL, 2.5 mmol., 2.1 equiv.) slowly. The mixture was stirred for 15 minutes at −78° C. before replacing the dry/ice acetone bath with an ice/water bath. The reaction mixture was left to warm to room temperature while stirring for 16 hours before cooling to 0° C. Water (dropwise at first, 150 mL total) and additional dichloromethane (50 mL) were added. The dichloromethane was removed on the rotary evaporator and the solid was collected by filtration. The solid was washed with water (25 mL) and dichloromethane (25 ml) to give a pale blue/green crude solid to be dried under vacuum and used in the next step without additional purification (287 mg). $^1$H NMR (400 MHz, CDCl$_3$) δ 10.13 (s, 2H), 7.71 (s, 2H).

2,6-Dibromo-benzo[1,2-b:4,5-b']dithiophene-4,8-(5-(2-hexyldecyl)-2-thiophenecarboxylic acid) ester (8)

2,6-Dibromo-benzo[1,2-b:4,5-b']dithiophene-4,8-diol (150 mg, 0.395 mmol., 1.00 equiv.), dichloromethane (6 mL) and triethylamine (0.22 mL, 1.6 mmol, 4.0 equiv.) were added to a 25 mL 2-neck round-bottom flask fitted with a reflux condenser. A solution of 5-(2-hexyldecyl)-2-thiophenecarbonyl chloride in dichloromethane (2 mL) was then added. The flask was placed in a 45° C. heat bath and the reaction mixture was stirred at reflux for 16 hours before cooling to room temperature, diluting with dichloromethane (60 mL) and washing with water (60 mL). The organic layer was dried with MgSO$_4$ and concentrated. The crude material was purified by silica gel column chromatography (solid loading, 1:1 dichloromethane-hexanes) to give a white solid (266 mg, 40% yield over two steps). m.p. 76° C. $^1$H NMR (400 MHz, CDCl$_3$) δ 7.95 (d, J=3.7 Hz, 2H), 7.32 (s, 2H), 6.93 (d, J=3.6 Hz, 2H), 2.87 (d, J=6.6, 4H), 1.74 (b, 2H), 1.40-1.21 (m, 48H), 0.94-0.85 (m, 12H). Anal. calcd. for (C$_{52}$H$_{72}$O$_4$S$_4$): C, 59.53; H, 6.92. Found: C, 59.46; H, 6.80.

2,6-Bis(trimethylstannyl)-benzo[1,2-b:4,5-b']dithiophene-4,8-(5-(2-hexyldecyl)-2 thiophenecarboxylic acid) ester (9)

2,6-Dibromo-benzo[1,2-b:4,5-b']dithiophene-4,8-(5-(2-hexyldecyl)-2-thiophenecarboxylic acid) ester (150 mg, 0.143 mmol., 1.00 equiv.) and THF (7 mL) were added to a 50 mL schlenk tube. The solution was cooled to −78° C. and n-butyllithium (2.5 M in hexanes, 126 µL, 0.315 mmol., 2.2 equiv.) was added over 2 minutes. The mixture was stirred at −78° C. for 1 hour before adding trimethyltin chloride (68 mg, 0.343 mmol., 2.40 equiv.). The dry ice/acetone bath was removed and the reaction was stirred at ambient for 2 hours before diluting with water (30 mL) and diethyl ether (50 mL). The organic layer was washed with water (30 mL) and brine (30 mL), dried with MgSO$_4$ and concentrated to a yellow crude oil (101 mg), which was used in the polymerization step without further purification. $^1$H NMR (400 MHz, CDCl$_3$) δ 7.99 (d, J=3.7 Hz, 2H), 7.34 (s, 2H), 6.93 (d, J=3.6 Hz, 2H), 2.88 (d, J=6.4, 4H), 1.75 (b, 2H), 1.40-1.20 (m, 48H), 0.93-0.85 (m, 12H), 0.48-0.32 (m, 18H).

Example 1M

Preparation of Chlorinated Repeating Units

Chlorinated repeating units can be prepared according to the schemes below.

a) Repeating units comprising 3- or 4-chlorinated thienyl groups:

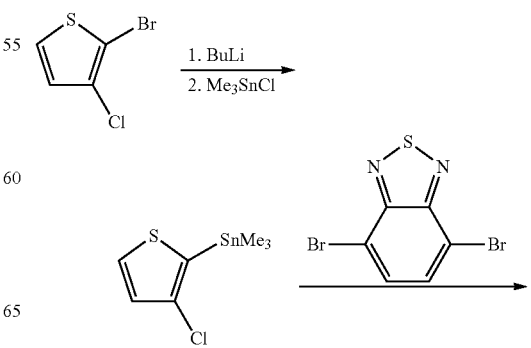

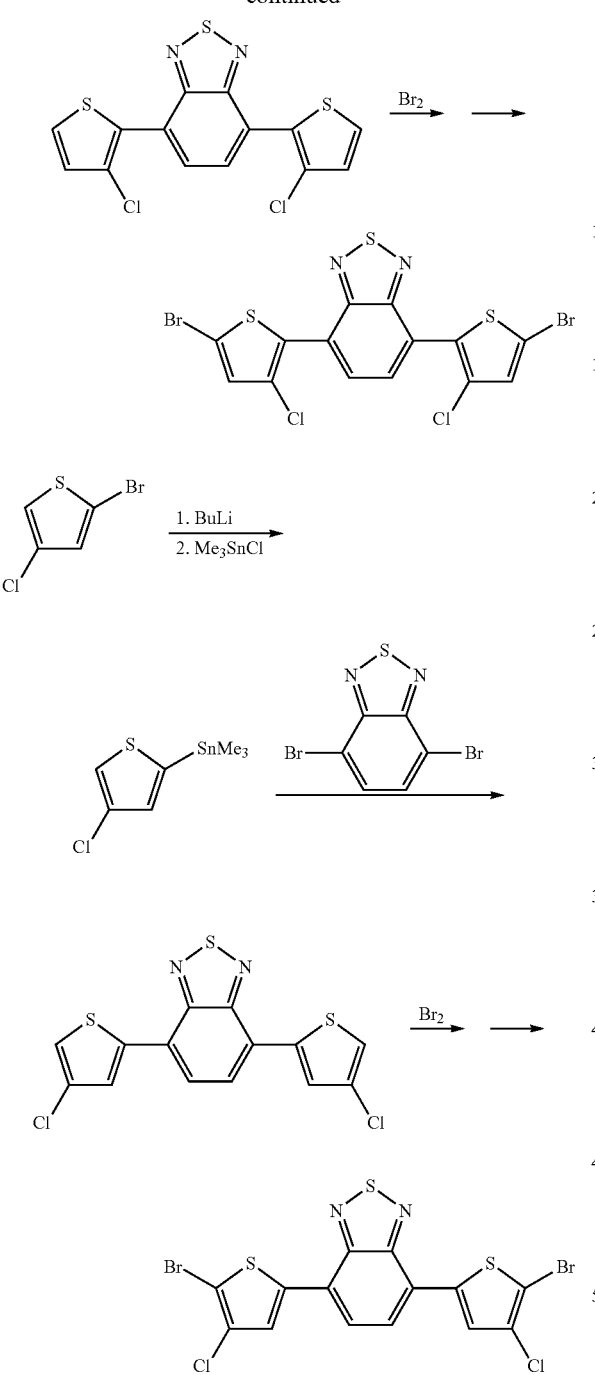
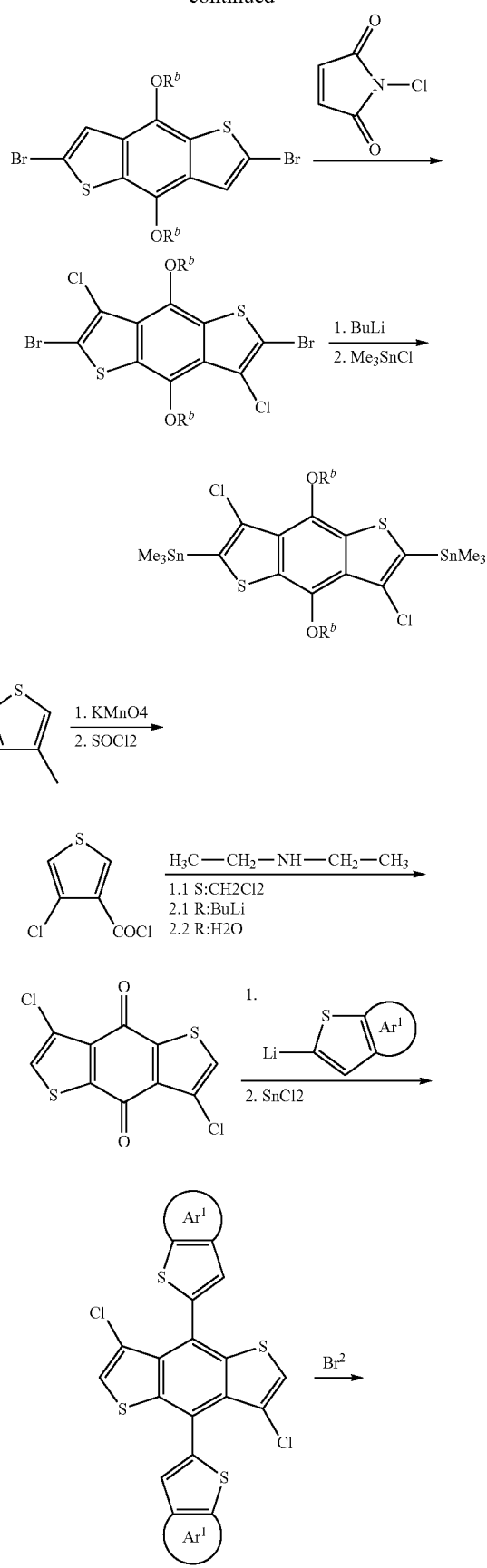
b) Repeating units comprising 3,7-dichlorinated benzo[1,2-b:4,5-b']dithienyl groups:
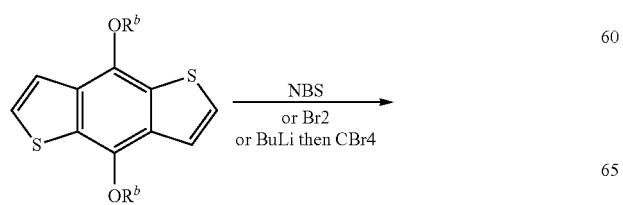

95
-continued
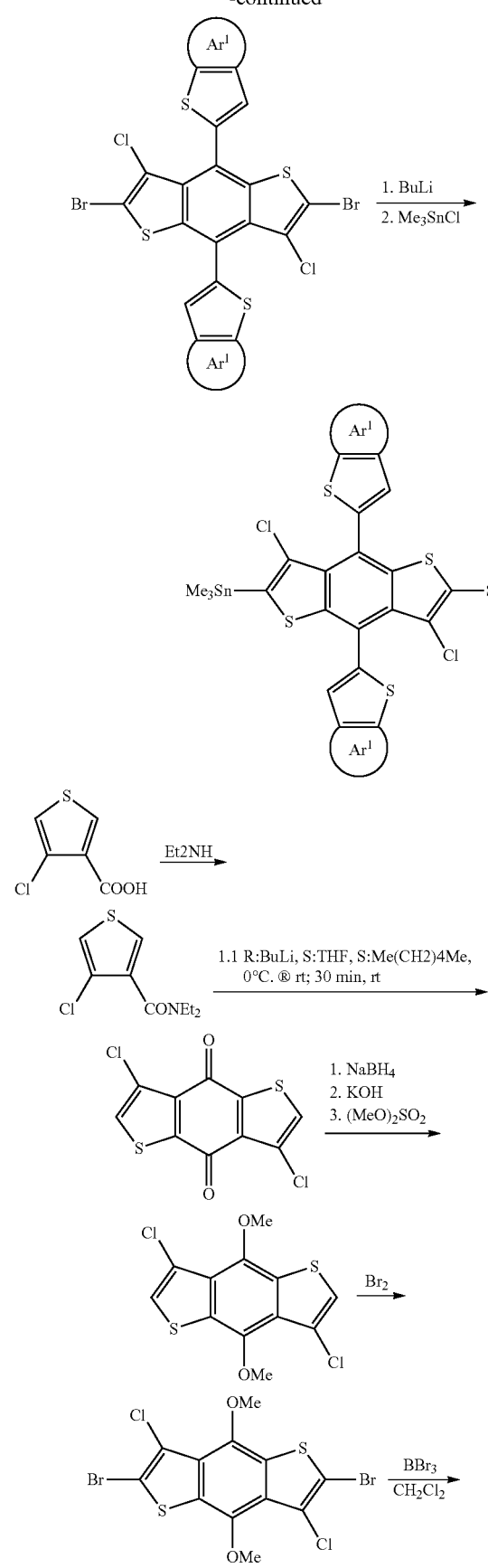
96
-continued
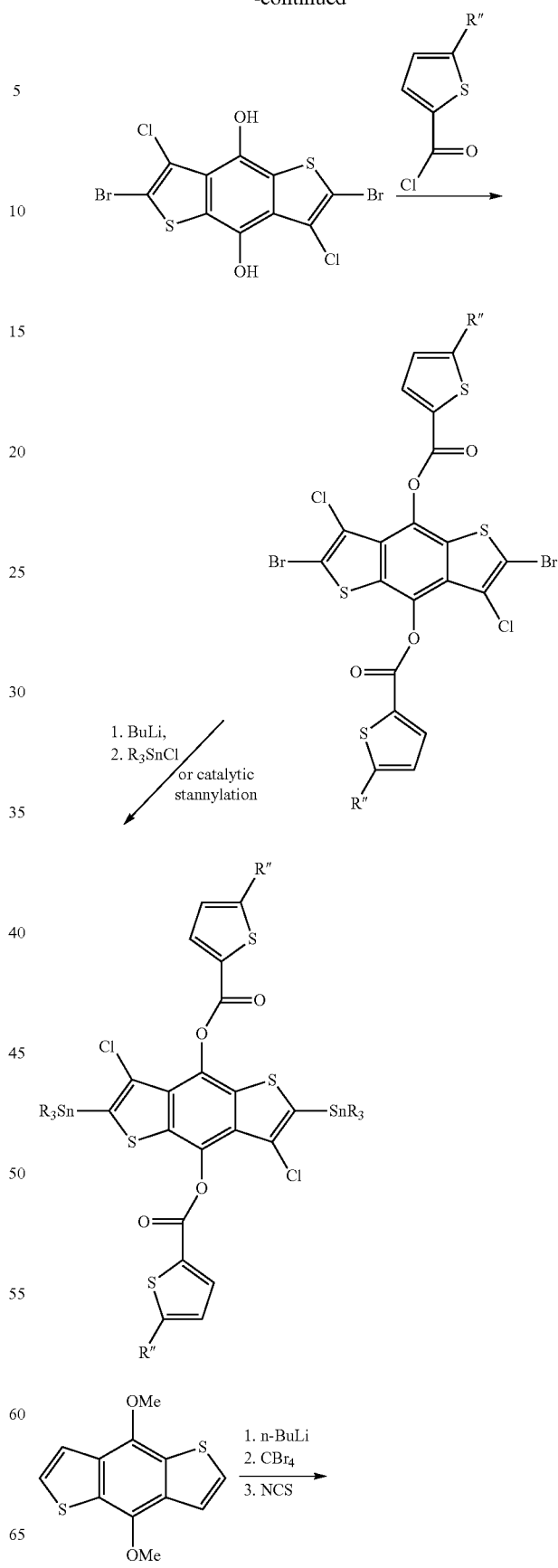

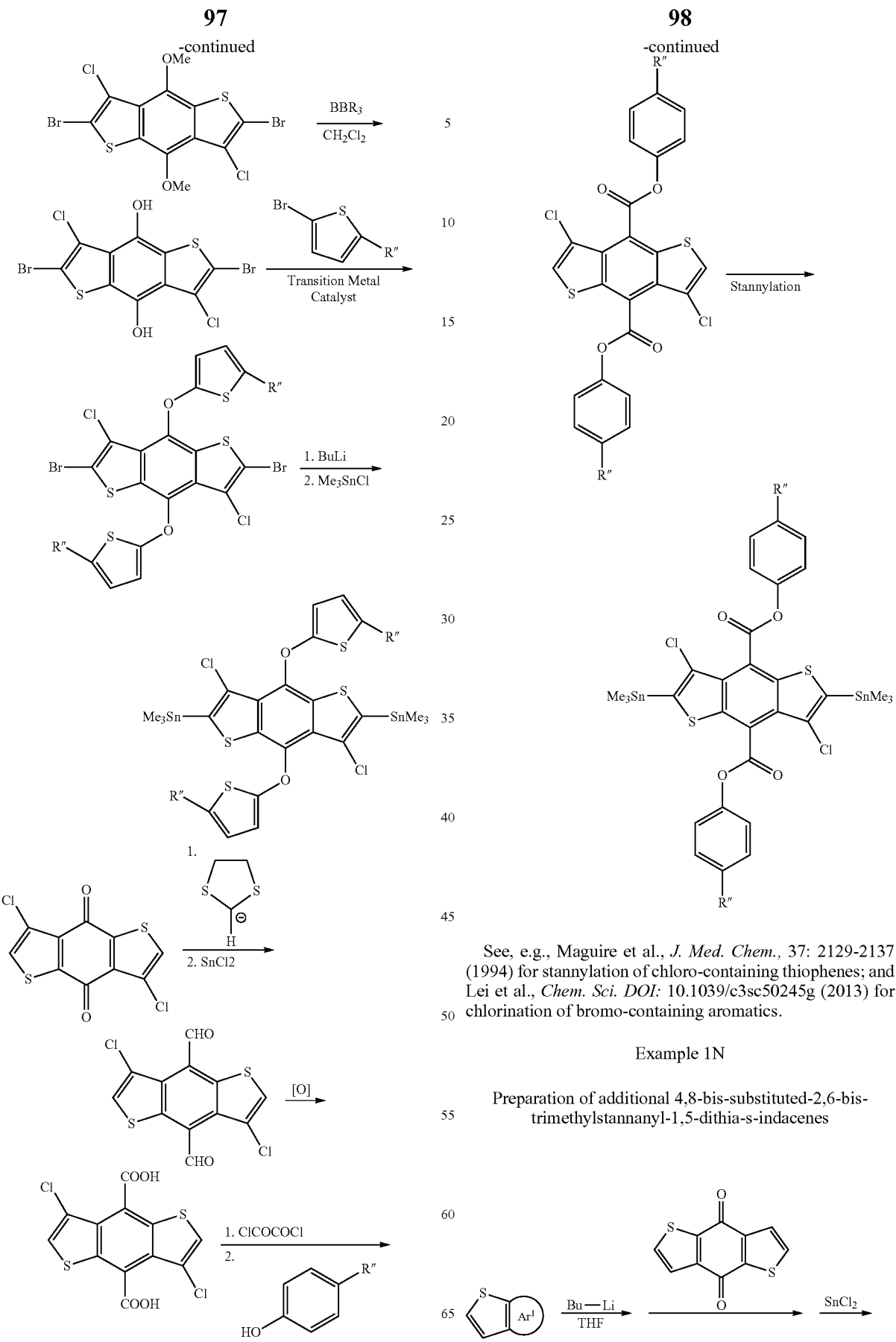
See, e.g., Maguire et al., *J. Med. Chem.*, 37: 2129-2137 (1994) for stannylation of chloro-containing thiophenes; and Lei et al., *Chem. Sci. DOI:* 10.1039/c3sc50245g (2013) for chlorination of bromo-containing aromatics.
Example 1N
Preparation of additional 4,8-bis-substituted-2,6-bis-trimethylstannanyl-1,5-dithia-s-indacenes

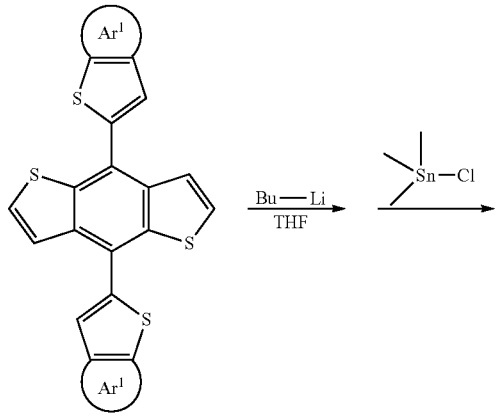

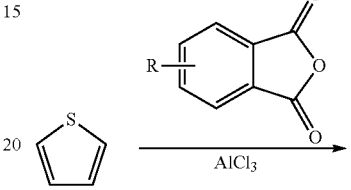

Various embodiments of repeating units ($M^{1a}$) can be prepared as follows. Briefly, an appropriate thieno-fused starting compound can be reacted with n-butyl lithium in THF at room temperature for about 1-1.5 hours before 1,5-dithia-s-indacene-4,8-dione is added. The mixture then can be heated at about 50-60° C. for 1-2 hours before cooling to room temperature. This is followed by the addition of a solution of $SnCl_2$ in $HCl/H_2O$, which is heated at about 50-60° C. for about 1-3 hours before cooling to room temperature. To functionalize the repeating unit ($M^{1a}$) with trimethylstannanyl groups, n-butyl lithium again is added (room temperature, about 2 hours), before trimethyltin chloride is added in portions (room temperature).

Example 2

Synthesis of Various Thieno-Fused Starting Compounds

Example 2A

Preparation of Naphthothiophene

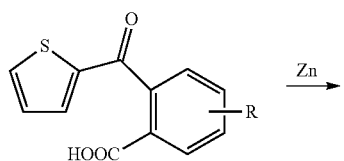

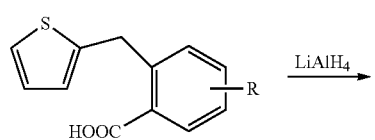

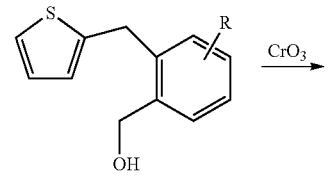

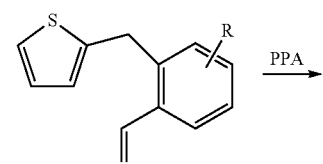

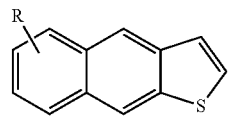

Both substituted and unsubstituted naphthothiophenes can be prepared from an appropriate phthalic anhydride using the synthetic route described in JP2010053094 (reproduced above), the entire disclosure of which is incorporated by reference herein.

Example 2B
Preparation of Benzodithiophene
1)
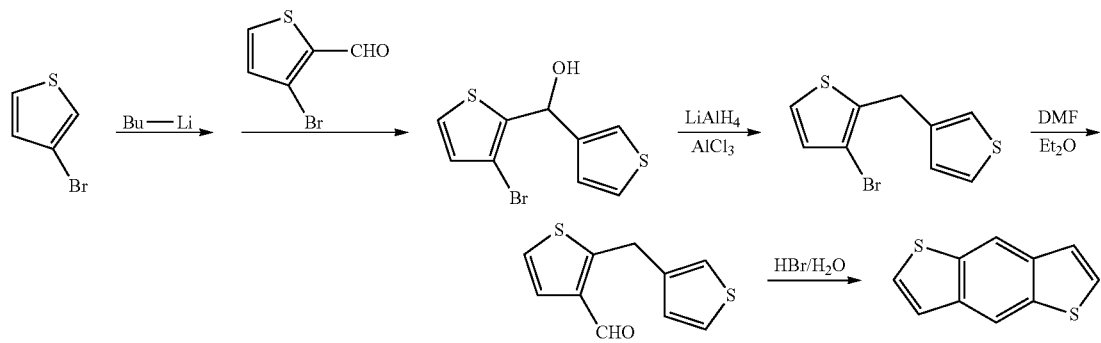
2)
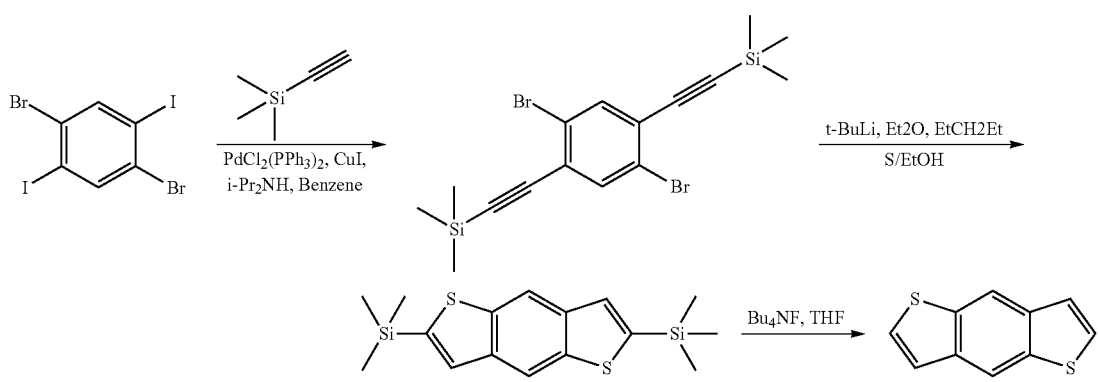
3)
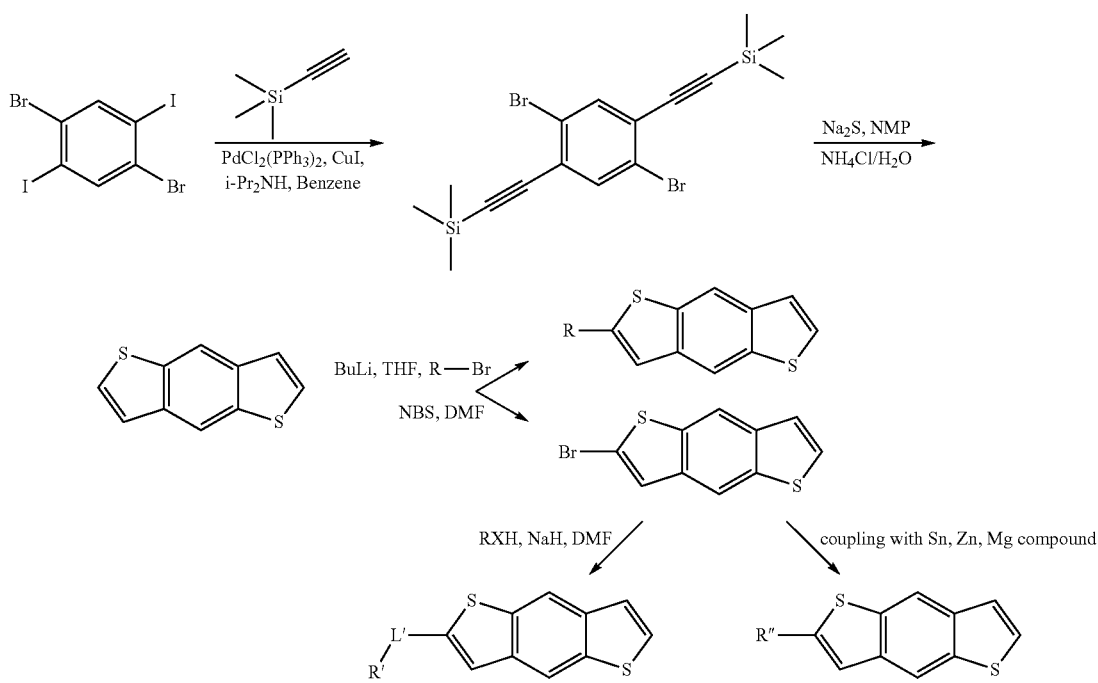

Substituted and unsubstituted benzodithiophenes can be prepared via the synthetic routes provided above.

Example 2C

Preparation of Benzothienothiophene

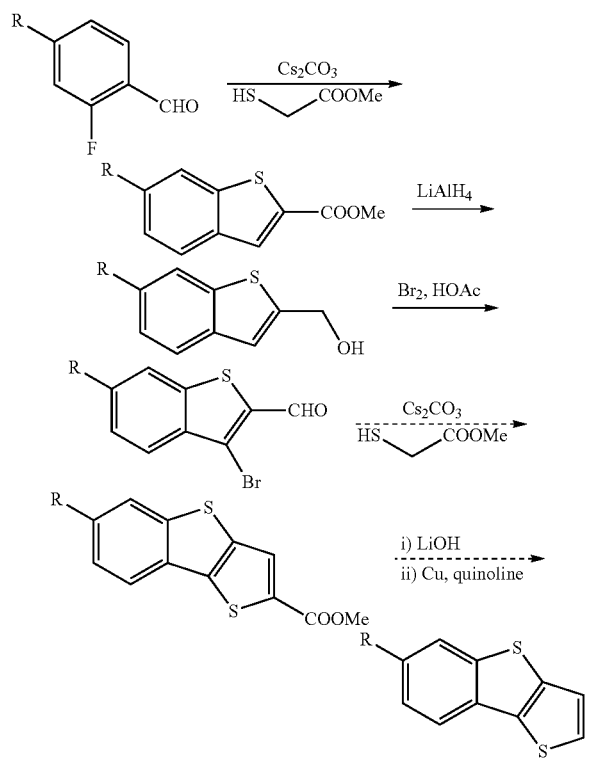

Various benzothienothiophenes can be prepared using the synthetic route described above.

Example 2D

Preparation of Dithienothiophene (a)

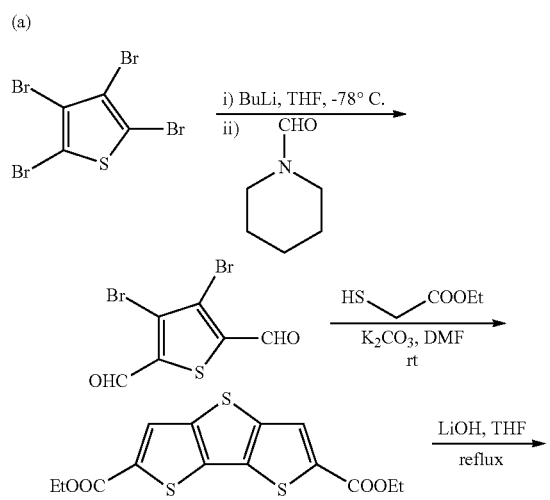

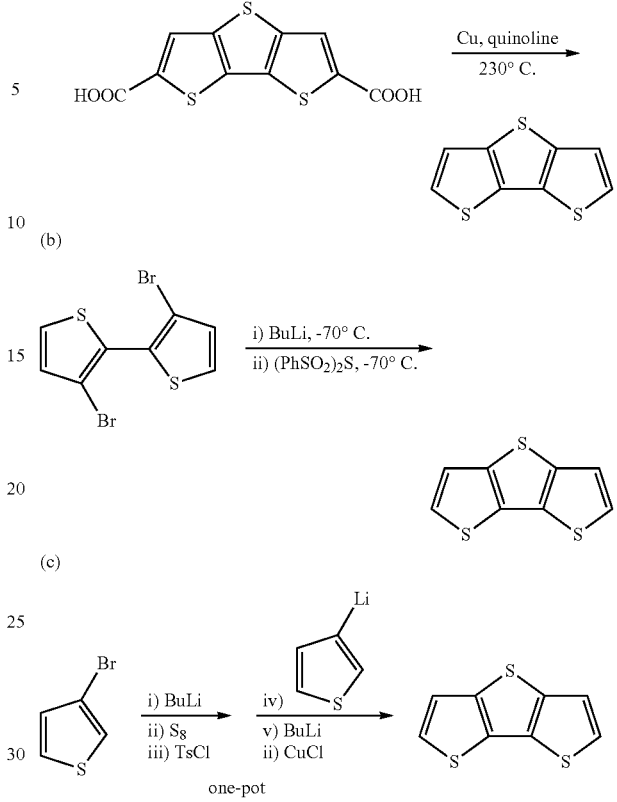

Unsubstituted dithienothiophenes can be prepared via synthetic route (a), (b) or (c) as described, respectively, in *Chem. Commun.* 2002, 2424; *J. Mater. Chem.* 2003, 13, 1324; and *Chem. Commun.* 2009, 1846, the entire disclosure of each of which is incorporated by reference herein.

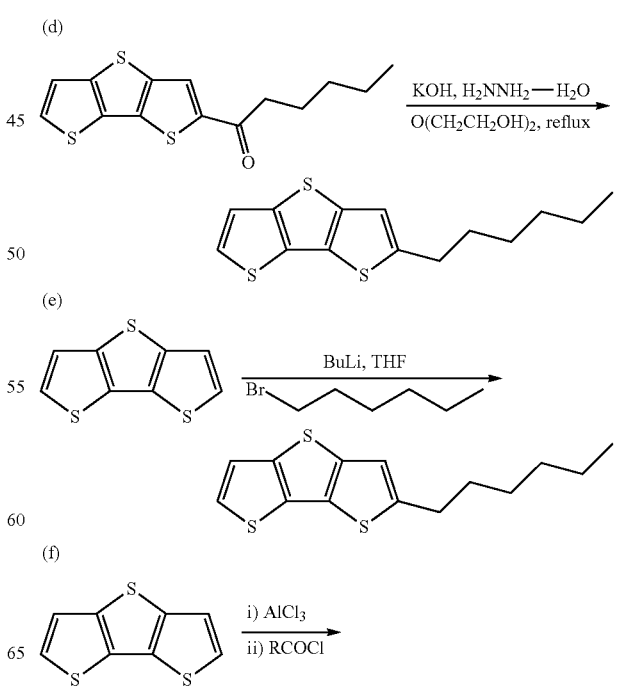

-continued

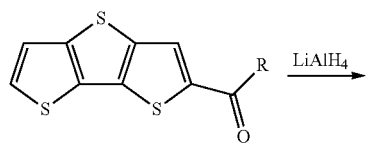

Substituted dithienothiophenes can be prepared via synthetic route (d), (e) or (f) as described, respectively, in *J. Mater. Chem.* 2007, 17, 4972; *Chem. Mater.* 2007, 19, 4925; and *Syn. Met.* 1999, 987, the entire disclosure of each of which is incorporated by reference herein.

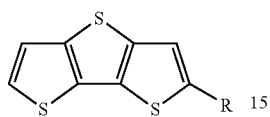

Example 2E

Preparation of Thienothiophene

Substituted thienothiophenes can be prepared using the synthetic route described above.

Example 2F

Preparation of Benzothiophene

Substituted benzothiophenes can be prepared using the synthetic routes described below.

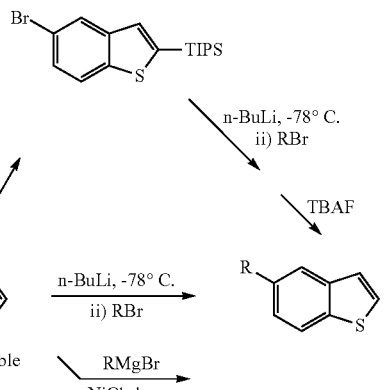

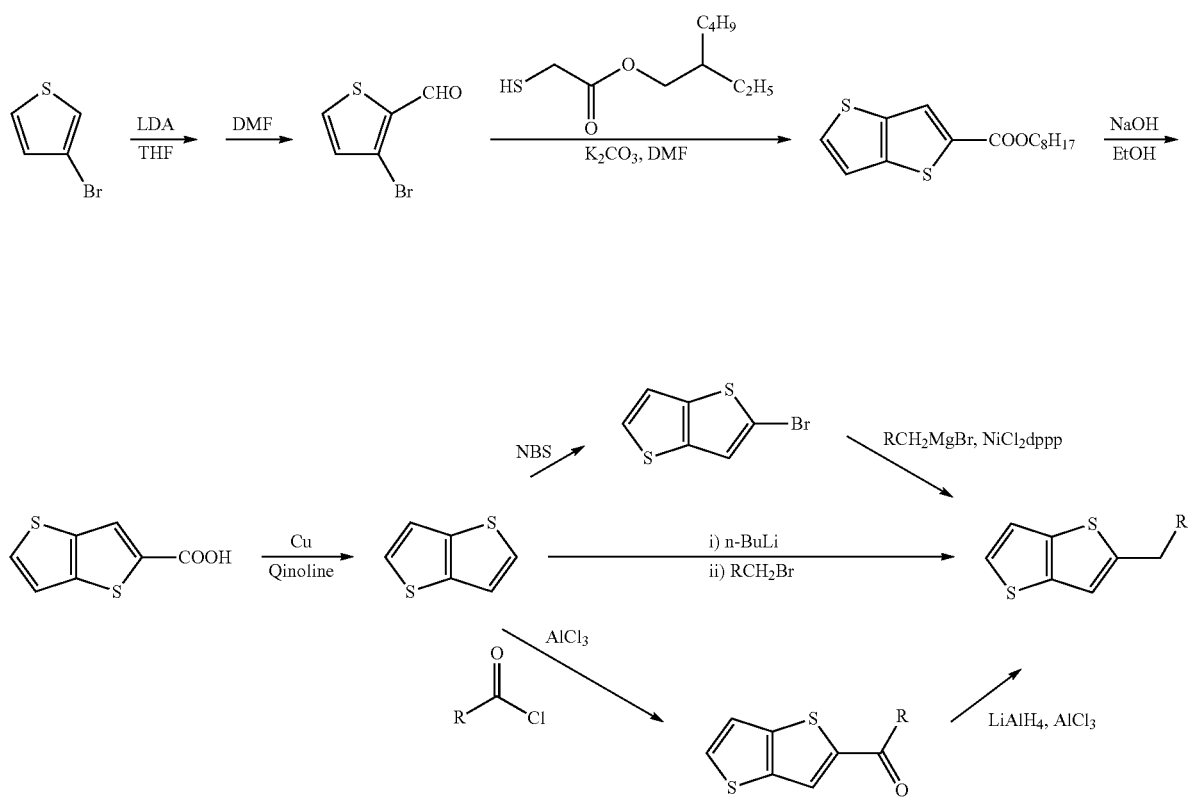

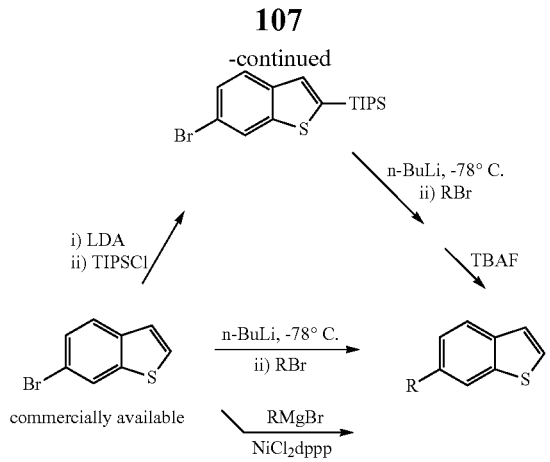

Example 3

Polymer Synthesis

Polymers of formula (I) can be prepared by reacting a trimethylstannanyl derivative of repeating unit ($M^{1a}$) or ($M^{1b}$) with a brominated repeating unit such as the building blocks described in Examples 1A-1J in the presence of $Pd_2(dba)_3$ and $P(o\text{-Tol})_3$.

Example 3A

Figure 2:
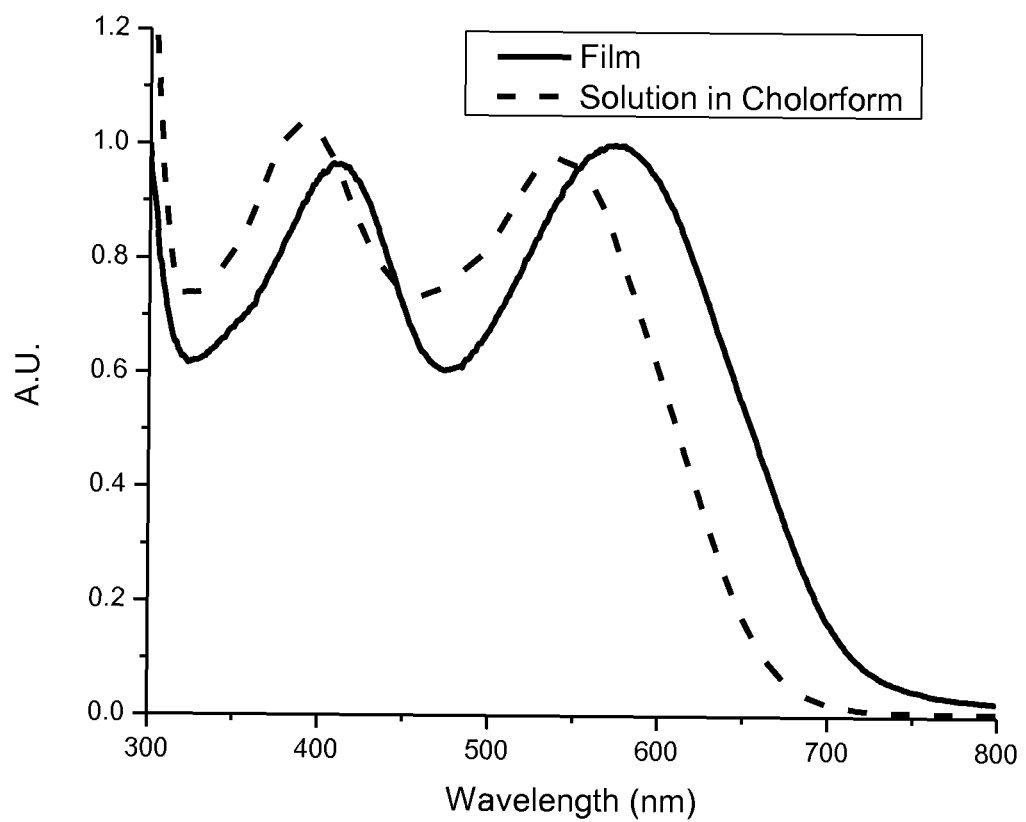
FIG. 2 shows the UV-vis spectra of a polymer according to the present teachings in thin film form and as a solution in chloroform.

Preparation of Benzothiophene 2,6-bis(Trimethylstannyl)-benzo[1,2-b:4,5-b']dithiophene-4,8-(5-(2-hexyldecyl)-2-thiophenecarboxylic acid) ester (101.0 mg (81.0%), 0.672 mmol), 4,7-bis(5-bromo-2-thienyl)-5-chloro-2,1,3-benzothiadiazole (16.56 mg, 0.0336 mmol), 4,7-bis(5-bromo-4-dodecyl-2-thienyl)-5-chloro-2,1,3-benzothiadiazole (27.87 mg, 0.0336 mmol), $Pa_2dba_3$ (2.46 mg, 0.0027 mmol), P(o-tol)$_3$ (3.27 mg, 0.0108 mmol) were placed in a 100 mL schlenk flask. The flask was degassed and backfilled with argon three times. Dry chlorobenzene (11 mL) was injected and the reaction was heated in a 135° C. heat bath for 18 hr. The reaction was cooled to room temperature and the contents of the flask were poured into methanol (100 mL). The precipitates were collected by filtration. The solid was subjected to Soxhlet extraction and washed with methanol (4 h), then ethyl acetate (16 h). The final product was extracted out with dichloromethane and weighed 35.0 mg after drying under vacuum (37.0%). Elemental Analysis: Calcd. C, 67.51; H, 7.46; N, 1.99. Found: C, 67.73, H, 7.23, N, 1.67. FIG. 2 shows the UV-vis spectra of the polymer in thin film form and as a solution in chloroform.

Example 4

Device Fabrication and Characterization

Example 4A

Fabrication and Characterization of Conventional OPV Cells with $C_{70}$PCBM as Acceptor Material Photovoltaic devices having the architecture ITO/MoO$_3$ (8 nm)/photoactive layer/LiF (0.6 nm)/Al (100 nm) were fabricated with the polymer from Example 3A as the donor material and $C_{70}$PCBM as the acceptor material. The photoactive layer was spin-coated from a solution of the polymer and $C_{70}$PCBM (5:10 mg) in a CHCl$_3$:DCB (9:1) solvent mixture.

The current density-voltage (J-V) curves were obtained using a Keithley 2400 source-measure unit. The photocurrent was measured under simulated AM 1.5G irradiation (100 mW cm$^{-2}$) using a xenon-lamp-based solar simulator (Newport 91160A 300W Class-A Solar Simulator, 2 inch by 2 inch uniform beam) with air mass 1.5 global filter. The light intensity was set using an NREL calibrated silicon photodiode with a color filter.

Figure 3:
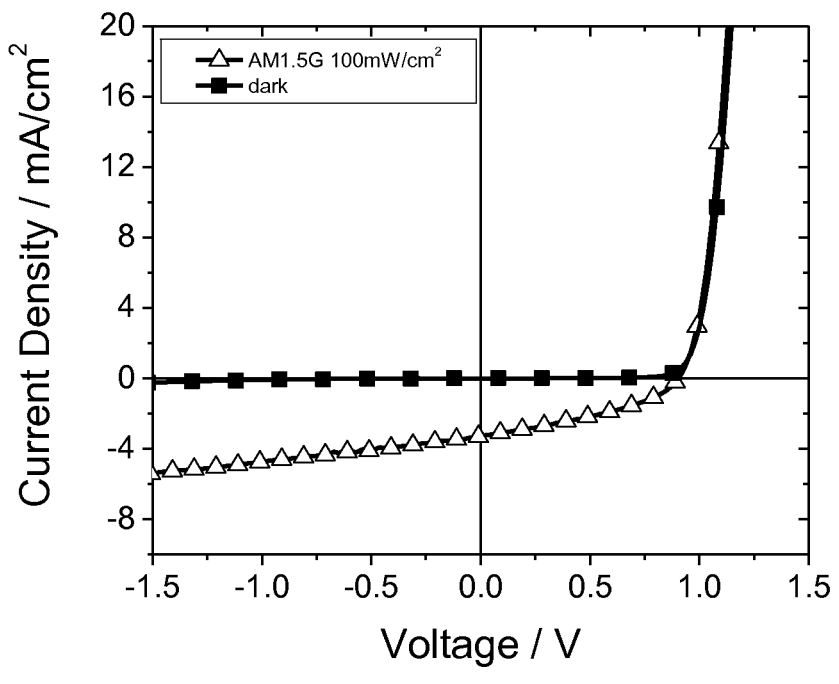
FIGS. 3A and 3B show the JV curves and the EQE spectrum of representative photovoltaic devices based upon a bulk heterojunction photoactive layer including a polymer according to the present teachings as the donor material and $C_{70}$PCBM as the acceptor material.
Figure 3:
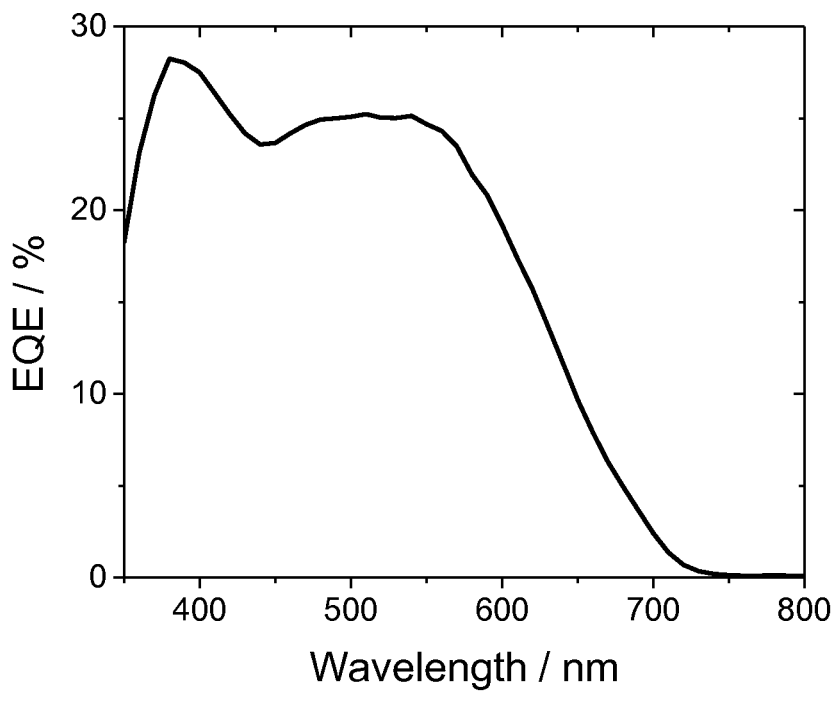

FIGS. 3A and 3B show the JV curves and the EQE spectrum of representative devices. The following device characteristics were obtained: $V_{OC}$=0.90 V, $J_{SC}$=3.8 mA/cm$^2$, FF=38%, PCE=1.3%.

Example 4B

Fabrication and Characterization of inverted OPV cells with poly{[N,N'-bis(2-hexyldecyl)-1,4,5,8-naphthalene diimide-2,6-diyl]-alt-5,5'-(2,2'-bithiophene)} [P(NDI2HD-T2)] as acceptor material Photovoltaic devices having the inverted architecture ITO/ZnO/photoactive layer/MoO$_3$ (8 nm)/Ag (120 nm) were fabricated with the polymer from Example 3A as the donor material and poly{[N,N'-bis(2-hexyldecyl)-1,4,5,8-naphthalene diimide-2,6-diyl]-alt-5,5'-(2,2'-bithiophene)}[P(NDI2HD-T2)] as the acceptor material. The photoactive layer was spin-coated from a solution of the polymer and P(NDI2HD-T2)] (6:6 mg/ml) in CHCl$_3$.

The current density-voltage (J-V) curves were obtained using a Keithley 2400 source-measure unit. The photocurrent was measured under simulated AM1.5G irradiation (100 mW cm$^{-2}$) using a xenon-lamp-based solar simulator (Newport 91160A 300W Class-A Solar Simulator, 2 inch by 2 inch uniform beam) with air mass 1.5 global filter. The light intensity was set using an NREL calibrated silicon photodiode with a color filter.

Figure 4:
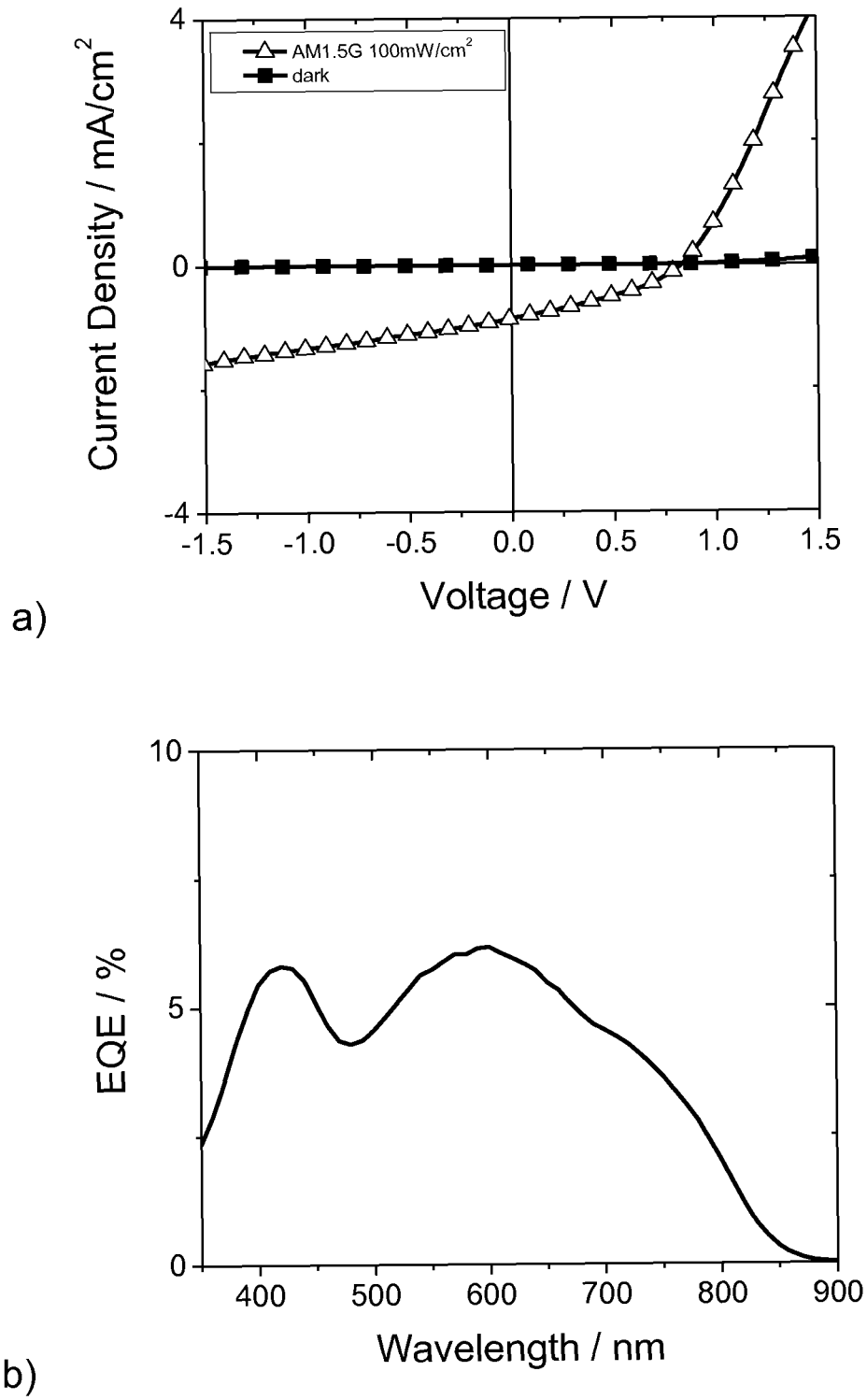
FIGS. 4A and 4B show the JV curves and the EQE spectrum of representative photovoltaic devices based upon a bulk heterojunction photoactive layer including a polymer according to the present teachings as the donor material and poly{[N,N'-bis(2-hexyldecyl)-1,4,5,8-naphthalene diimide-2,6-diyl]-alt-5,5'-(2,2'-bithiophene)}[P(NDI2HD-T2)] as the acceptor material.

FIGS. 4A and 4B show the JV curves and the EQE spectrum of representative devices. The following device characteristics were obtained: $V_{OC}$=0.83 V, $J_{SC}$=1.3 mA/cm$^2$, FF=35%, PCE=0.4%.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. A polymer comprising a repeating unit ($M^{1a}$) having a formula selected from:

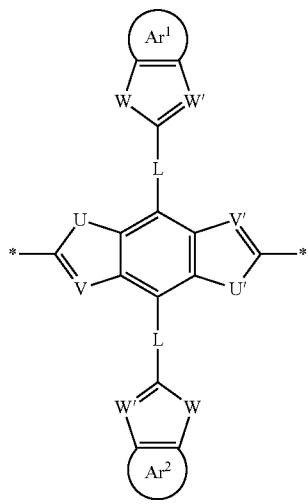

and

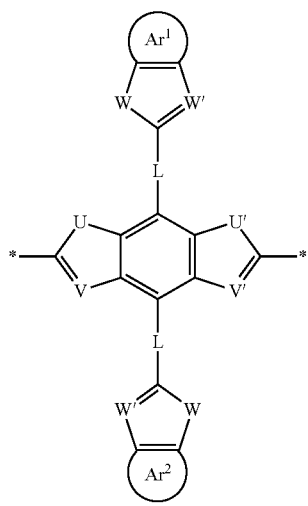

or a repeating unit ($M^{1b}$) having a formula selected from:

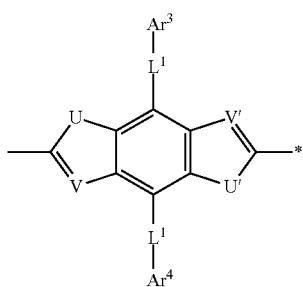

and

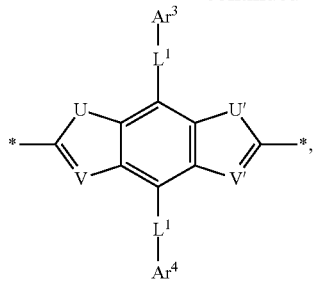

wherein:
$Ar^1$ and $Ar^2$ independently are an optionally substituted $C_{6-14}$ aryl group or an optionally substituted 5-14 membered heteroaryl group;
$Ar^3$ and $Ar^4$ independently are an optionally substituted 5- or 6-membered heteroaryl group;
L, at each occurrence, independently is selected from —O—, —S—, —Se—, —OC(O)—, —C(O)O—, a divalent $C_{1-20}$ alkyl group, a divalent $C_{1-20}$ haloalkyl group, and a covalent bond;
$L^1$, at each occurrence, independently is selected from —O—, —S—, —Se—, —OC(O)—, —C(O)O—, a divalent $C_{1-20}$ alkyl group, and a divalent $C_{1-20}$ haloalkyl group;
U and U' independently are selected from O, S, and Se;
V and V' independently are CR or N;
W, at each occurrence, independently is selected from O, S, and Se;
W', at each occurrence, independently is CR or N;
R, at each occurrence, independently is selected from H, F, Cl, —CN, and L'R', wherein
L', at each occurrence, is selected from —O—, —S—, —Se—, —C(O)—, —OC(O)—, —C(O)O—, and a covalent bond; and R', at each occurrence, independently is selected from a $C_{1-40}$ alkyl group, a $C_{2-40}$ alkenyl group, a $C_{2-40}$ alkynyl group, and a $C_{1-40}$ haloalkyl group; and
the polymer has a degree of polymerization in the range of 3 to 10,000.

2. The polymer of claim 1 comprising the repeating unit ($M^{1a}$) having a formula selected from:

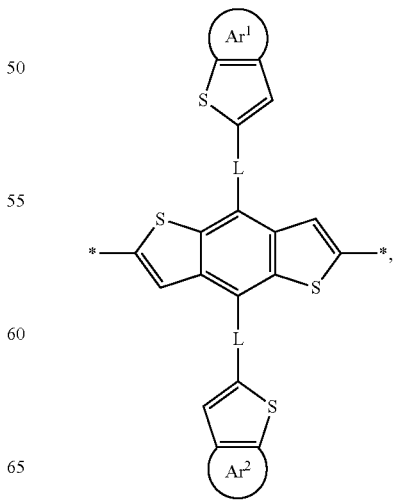

-continued

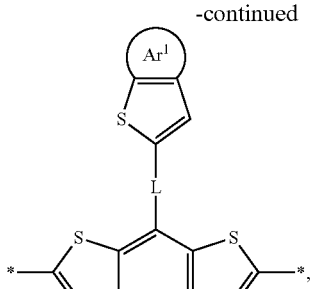

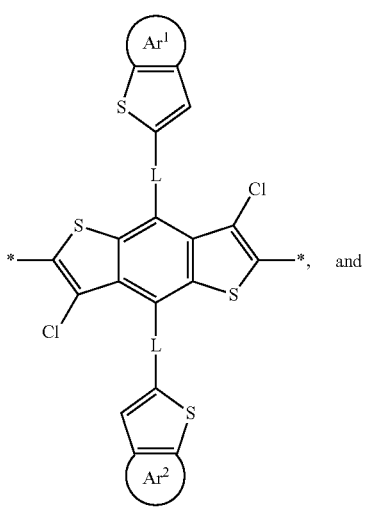
and

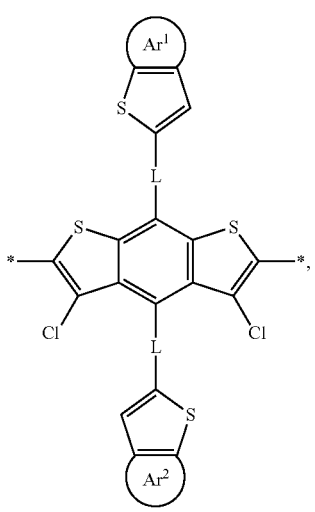

wherein L is selected from —O—, —S—, —OC(O)—, a divalent $C_{1-20}$ alkyl group, and a covalent bond; and $Ar^1$ and $Ar^2$ are as defined in claim 1.

3. The polymer of claim 2, wherein the moieties

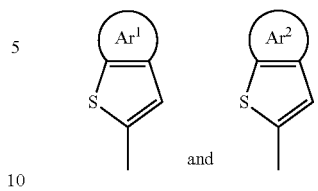

independently are selected from:

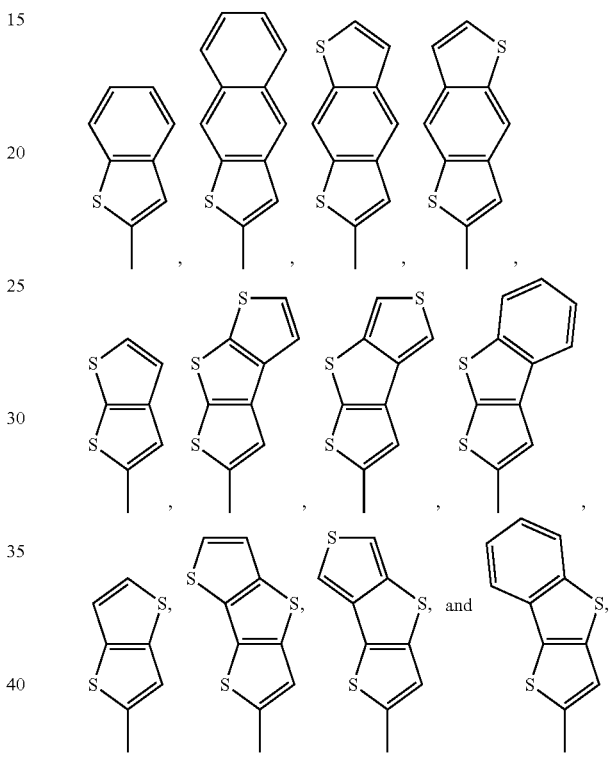

wherein any of the carbon atoms optionally is substituted with F, Cl, —CN, or L'R', wherein L', at each occurrence, is selected from —O—, —S—, —Se—, —C(O)—, —OC(O)—, —C(O)O—, and a covalent bond; and R', at each occurrence, independently is selected from a $C_{1-40}$ alkyl group, a $C_{2-40}$ alkenyl group, a $C_{2-40}$ alkynyl group, and a $C_{1-40}$ haloalkyl group.

4. The polymer of claim 1 comprising the repeating unit ($M^{1b}$) having a formula selected from:

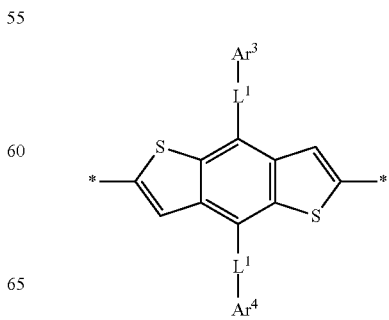

-continued
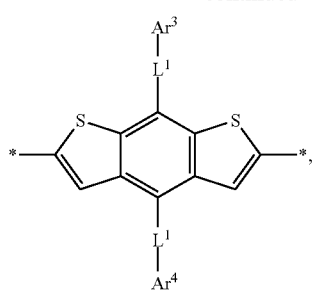
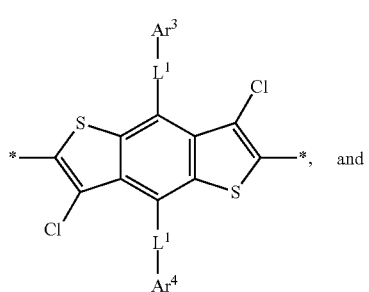, and
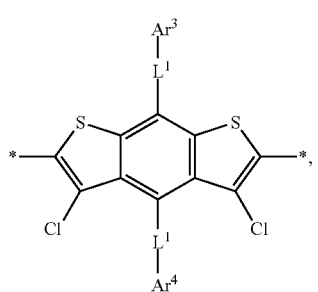
wherein $L^1$ is selected from —O—, —S—, —OC(O)—, and a divalent $C_{1-20}$ alkyl group; and $Ar^3$ and $Ar^4$ are as defined in claim 1.
5. The polymer of claim 4, wherein the repeating unit ($M^{1b}$) has a formula selected from:
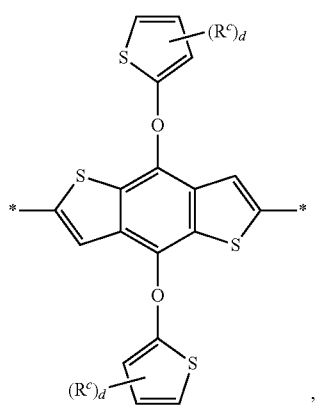
-continued
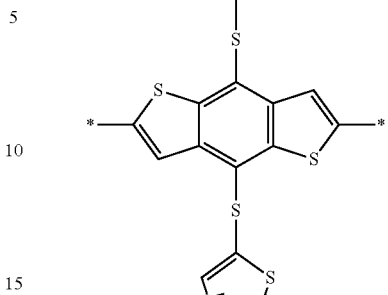,
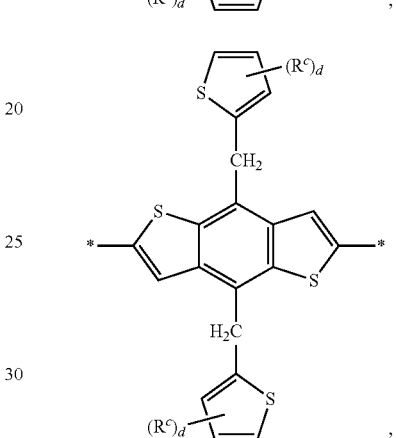,
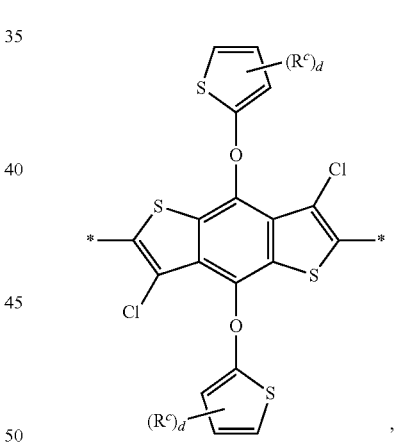,
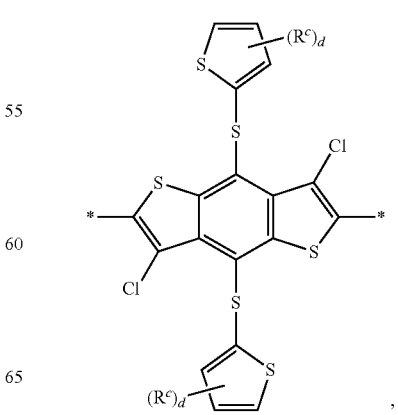,

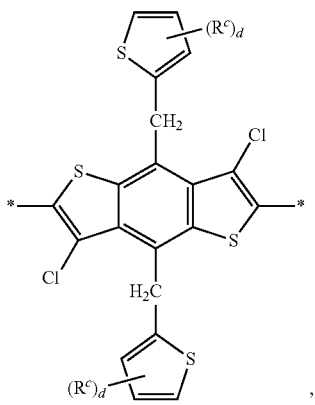

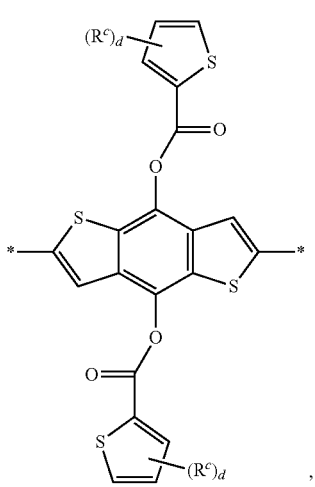

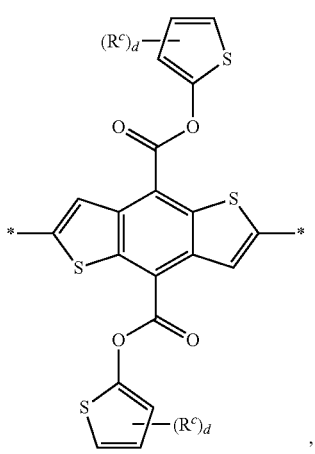

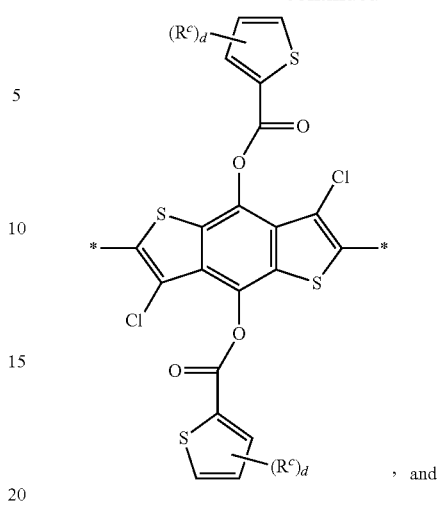

, and

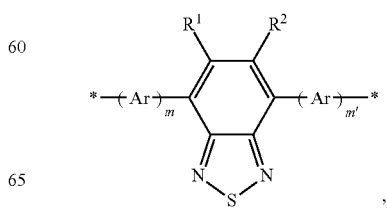

wherein $R^c$, at each occurrence, independently is selected from F, Cl, —CN, and L"R", wherein L", at each occurrence, is selected from —O—, —S—, —Se—, —C(O)—, —OC(O)—, —C(O)O—, and a covalent bond; and R", at each occurrence, independently is selected from a $C_{1-40}$ alkyl group, a $C_{2-40}$ alkenyl group, a $C_{2-40}$ alkynyl group, and a $C_{1-40}$ haloalkyl group; and d, at each occurrence, independently is 1, 2 or 3.

6. The polymer of claim 1 further comprising a repeating unit ($M^2$) that is different from the repeating unit ($M^{1a}$) and the repeating unit ($M^{1b}$).

7. The polymer of claim 6, wherein the repeating unit ($M^2$) comprises an electron-poor polycyclic heteroaryl group.

8. The polymer of claim 7, wherein the repeating unit ($M^2$) has a formula selected from:

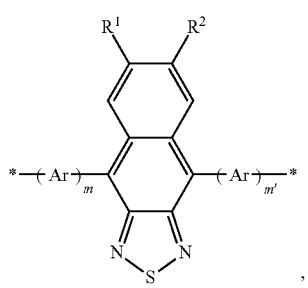

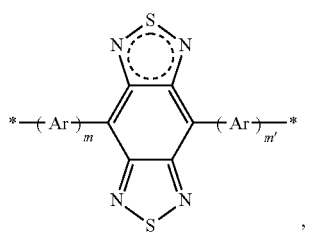

wherein:
Ar, at each occurrence, independently is an optionally substituted 5-8 membered heteroaryl group;
$R^1$ and $R^2$ independently are selected from H, a halogen, —CN, and L'R', wherein L', at each occurrence, is selected from —O—, —S—, —Se—, —C(O)—, —OC(O)—, —C(O)O—, a divalent $C_{1-20}$ alkyl group, a divalent $C_{1-20}$ haloalkyl group, and a covalent bond; and R', at each occurrence, independently is selected from H, a $C_{1-40}$ alkyl group, a $C_{2-40}$ alkenyl group, a $C_{2-40}$ alkynyl group, a $C_{1-40}$ haloalkyl group, an optionally substituted $C_{6-14}$ aryl group and an optionally substituted 5-14 membered heteroaryl group; and
m; and m' are 0, 1, or 2.

9. The polymer of claim 1 having a formula selected from:

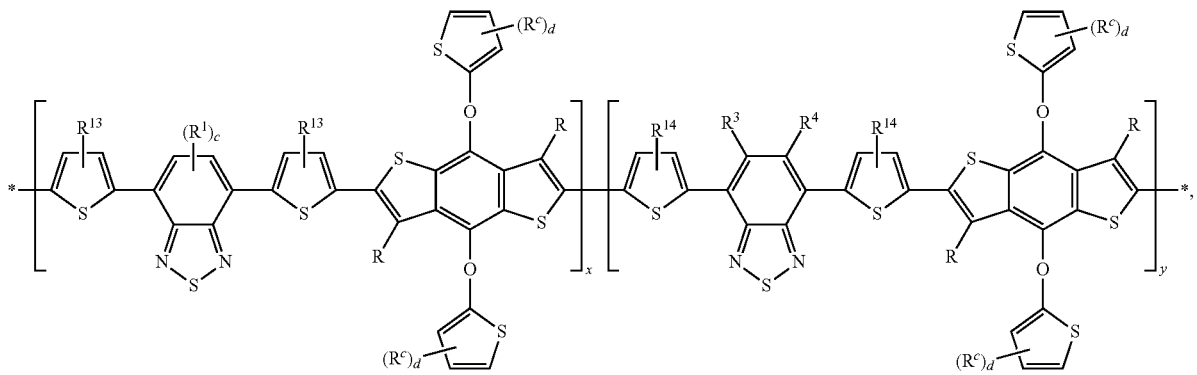

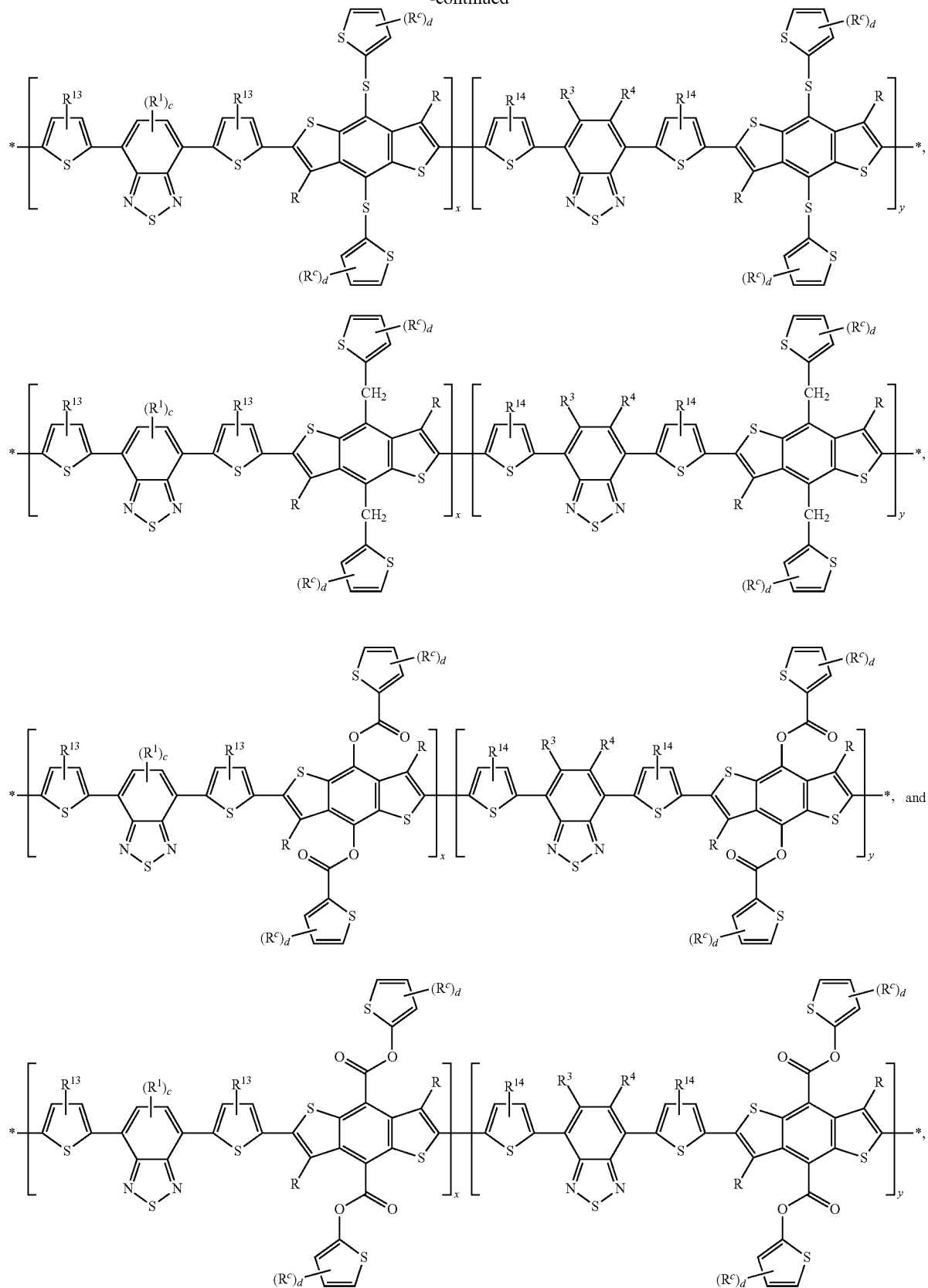

wherein:

each R independently can be H or Cl;

$R^c$, at each occurrence, independently is selected from F, Cl, —CN, and L"R", wherein L", at each occurrence, is selected from —O—, —S—, —Se—, —C(O)—, —OC(O)—, —C(O)O—, and a covalent bond; and R", at each occurrence, independently is selected from a $C_{1-40}$ alkyl group, a $C_{2-40}$ alkenyl group, a $C_{2-40}$ alkynyl group, and a $C_{1-40}$ haloalkyl group;

$R^1$, $R^3$ and $R^4$ independently can be selected from H, F, Cl, and CN;

$R^{13}$ and $R^{14}$ independently can be selected from H, F, Cl, $R^{15}$, $OR^{15}$, and $SR^{15}$; wherein $R^{15}$, at each occurrence, independently can be selected from a $C_{1-20}$ alkyl group, a $C_{1-20}$ alkenyl group, and a $C_{1-20}$ haloalkyl group;

c can be 0, 1 or 2;

d can be 1, 2 or 3; and x and y are real numbers representing mole fractions, wherein 0.05≤x≤0.95, 0.05≤y≤0.95, and the sum of x and y is about 1;

wherein the polymer has a molecular weight in the range of about 3,000 to about 300,000.

10. The polymer of claim 9, wherein $R^1$ is selected from F, Cl, and CN.

11. The polymer of claim 9, wherein the repeating unit comprising x mole fraction of the polymer and the repeating unit comprising y mole fraction of the polymer are repeated in a random manner.

12. An electronic, optical or optoelectronic device comprising a polymeric semiconductor component, the polymeric semiconductor component comprising the polymer of claim 1.

13. The device of claim 12 configured as an organic photovoltaic device comprising an anode, a cathode, optionally one or more anode interlayers, optionally one or more cathode interlayers, and in between the anode and the cathode the polymeric semiconductor component.

14. The device of claim 13, wherein the organic photovoltaic device is a bulk heterojunction photovoltaic device.

15. The device of claim 13, wherein the polymeric semiconductor component is photoactive and the polymer of claim 1 is present in a blend material, wherein the polymer of claim 1 functions as an electron-donor compound and the blend material further comprises an electron-acceptor compound.

16. The device of claim 15, wherein the electron-acceptor compound is a fullerene compound.

17. The device of claim 13, wherein the electron-acceptor compound is an electron-transporting polymer.

18. The device of claim 17, wherein the electron-transporting polymer comprises a bis(imide)arene unit.

19. The device of claim 18, wherein the arene group in the bis(imide)arene unit is naphthalene.

20. The polymer of claim 1 comprising the repeating unit ($M^{1\alpha}$) having a formula selected from:

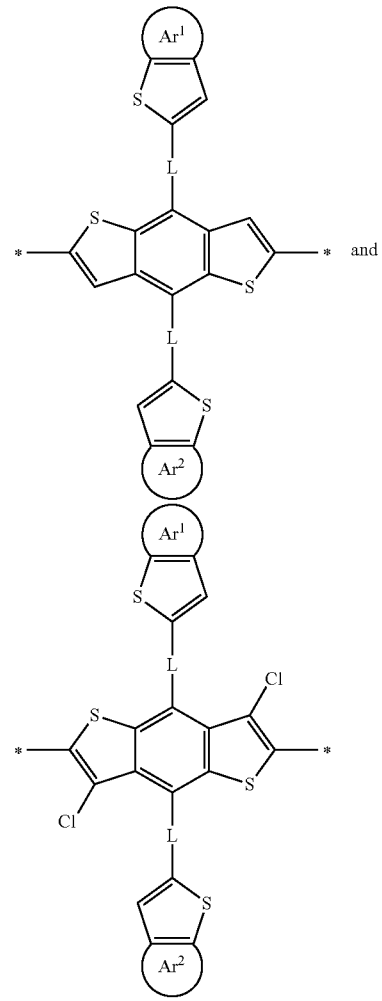 and

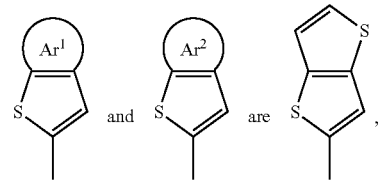

wherein the moieties wherein any of the carbon atoms optionally is substituted with F, Cl, —CN, or L'R', wherein L', at each occurrence, is selected from —O—, —S—, —Se—, —C(O)—, —OC(O)—, —C(O)O—, and a covalent bond; and R', at each occurrence, independently is selected from a $C_{1-40}$ alkyl group, a $C_{2-40}$ alkenyl group, a $C_{2-40}$ alkynyl group, and a $C_{1-40}$ haloalkyl group; and L is selected from O, S, OC(O), a divalent $C_{1-20}$ alkyl group, and a covalent bond.

* * * * *